(12) United States Patent
Yamazaki et al.

(10) Patent No.: US 7,948,040 B2
(45) Date of Patent: May 24, 2011

(54) SEMICONDUCTOR DEVICE

(75) Inventors: Shunpei Yamazaki, Tokyo (JP); Kengo Akimoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 119 days.

(21) Appl. No.: 12/031,893

(22) Filed: Feb. 15, 2008

(65) Prior Publication Data

US 2008/0203501 A1  Aug. 28, 2008

(30) Foreign Application Priority Data

Feb. 22, 2007  (JP) ................................. 2007-041602

(51) Int. Cl.
*H01L 29/78* (2006.01)
*H01L 29/786* (2006.01)

(52) U.S. Cl. ................. 257/413; 257/492; 257/E21.133; 257/E27.111; 257/E29.197; 257/E29.278

(58) Field of Classification Search .................. 257/492, 257/413, 412, 347, 66, 72, 351–352, 344, 257/382, 384, E27.111, E29.197, E29.278, 257/E21.133; 438/152, 585, 587, 588, 592
See application file for complete search history.

(56) References Cited

U.S. PATENT DOCUMENTS

| | | |
|---|---|---|
| 4,890,141 A | 12/1989 | Tang et al. |
| 5,001,082 A | 3/1991 | Goodwin-Johansson |
| 5,121,186 A | 6/1992 | Wong et al. |
| 5,338,702 A | 8/1994 | Kobeda et al. |
| 5,341,028 A | 8/1994 | Yamaguchi et al. |
| 5,583,366 A | 12/1996 | Nakazawa |
| 5,656,825 A | 8/1997 | Kusumoto et al. |
| 5,940,690 A | 8/1999 | Kusumoto et al. |
| 6,160,272 A | 12/2000 | Arai et al. |
| 6,337,232 B1 | 1/2002 | Kusumoto et al. |
| 6,455,875 B2 | 9/2002 | Takemura et al. |
| 6,541,795 B2 | 4/2003 | Kusumoto et al. |
| 6,759,678 B2 | 7/2004 | Yamazaki et al. |
| 6,882,018 B2 | 4/2005 | Ohtani et al. |
| 7,223,666 B2 | 5/2007 | Ohtani et al. |
| 7,622,740 B2 | 11/2009 | Ohtani et al. |
| 2006/0068536 A1* | 3/2006 | Yamazaki ..................... 438/197 |
| 2006/0091398 A1 | 5/2006 | Yamaguchi et al. |
| 2006/0197088 A1 | 9/2006 | Isobe et al. |
| 2006/0203533 A1* | 9/2006 | Kato et al. ....................... 365/74 |
| 2007/0126058 A1* | 6/2007 | Godo et al. .................... 257/344 |
| 2007/0210451 A1 | 9/2007 | Ohtani et al. |
| 2008/0093464 A1* | 4/2008 | Dairiki et al. ................ 235/492 |
| 2008/0179675 A1* | 7/2008 | Yamazaki et al. ............. 257/347 |

FOREIGN PATENT DOCUMENTS

JP  07-335906  12/1995

* cited by examiner

*Primary Examiner* — Victor Mandala
*Assistant Examiner* — Whitney Moore
(74) *Attorney, Agent, or Firm* — Nixon Peabody LLP; Jeffrey L. Costellia

(57) ABSTRACT

A semiconductor device includes a semiconductor layer overlapping with a gate electrode and having an impurity region outside a region which overlaps with the gate electrode; a first conductive layer which is provided on a side provided with the gate electrode of the semiconductor layer and partially in contact with the impurity region; an insulating layer provided over the gate electrode and the first conductive layer; and a second conductive layer which is formed in the insulating layer and in contact with the first conductive layer through an opening at least part of which overlaps with the first conductive layer.

27 Claims, 23 Drawing Sheets

2180

2180

2180

2180

2180

2180

2180

2180

SEMICONDUCTOR DEVICE

BACKGROUND OF THE INVENTION

1. Field of the Invention

The present invention relates to a semiconductor device and a manufacturing method thereof. In this specification, the semiconductor device refers to any device which can function with the use of semiconductor characteristics.

2. Description of the Related Art

In recent years, the information society has been increasingly developed, and the demand for higher speed, larger capacitance, smaller size, lighter weight, or the like of information communication equipment such as a personal computer or a mobile phone has been increased. With such a trend of the times, LSI (large scale integration) has been needed to be provided with higher integration, higher speed, and lower power consumption, and as a result, higher performance and miniaturization of each transistor for forming LSI are essential.

In view of higher performance and miniaturization of a transistor, various structures have been considered for a thin film transistor. For example, in order to realize higher performance and miniaturization of a thin film transistor, reduction in thickness of a semiconductor layer has been progressed.

For example, the present applicant has proposed to use a thin crystalline semiconductor film with a thickness of less than or equal to 30 nm as an active layer of a TFT. Specifically, a technique has been disclosed in which, after an amorphous semiconductor film with a thickness of greater than or equal to 40 nm is crystallized, the crystallized semiconductor film is entirely or selectively etched to form a region with a thickness of less than or equal to 30 nm, and the region thinned to less than or equal to 30 nm is used as a channel formation region (Reference 1: Japanese Published Patent Application No. H7-335906).

SUMMARY OF THE INVENTION

It is an object of the present invention to provide a semiconductor device with higher reliability and a manufacturing method thereof in order to enhance the performance of the semiconductor devices. In addition, it is another object to provide a semiconductor device which does not lower the yield and a manufacturing method thereof.

The present invention provides a semiconductor device having a so-called SOI (silicon on insulator) structure in which a semiconductor layer over an insulating surface is used for forming an element, and is characterized in that the semiconductor layer and a conductive layer serving as a source or drain electrode are electrically connected to each other with a conductive layer serving as a connecting wiring interposed therebetween.

The semiconductor layer includes at least a channel formation region provided between a pair of impurity regions. The conductive layer serving as a connecting wiring is provided to be in contact with the impurity region of the semiconductor layer. The conductive layer may be provided over the semiconductor layer (on the side provided with a gate electrode of the semiconductor layer) or below the semiconductor layer (on the side not provided with the gate electrode of the semiconductor layer). The conductive layer serving as a connecting wiring is in contact with the conductive layer serving as a source or drain electrode, whereby the conductive layer serving as a source or drain electrode and the semiconductor layer are electrically connected to each other. Preferably, the conductive layer serving as a connecting wiring and the conductive layer serving as a source or drain electrode are in contact with each other in a region which does not overlap with the semiconductor layer.

According to one aspect of the present invention, a semiconductor device includes a semiconductor layer overlapping with a gate electrode and having an impurity region outside a region which overlaps with the gate electrode; a first conductive layer which is provided on a side provided with the gate electrode of the semiconductor layer and partially in contact with the impurity region; an insulating layer provided over the gate electrode and the first conductive layer; and a second conductive layer which is formed in the insulating layer and in contact with the first conductive layer through an opening at least part of which overlaps with the first conductive layer.

According to another aspect of the present invention, a semiconductor device includes a semiconductor layer overlapping with a gate electrode and having an impurity region outside a region which overlaps with the gate electrode; a first conductive layer which is provided on a side not provided with the gate electrode of the semiconductor layer and partially in contact with the impurity region; an insulating layer provided over the gate electrode and the semiconductor layer; and a second conductive layer which is formed in the insulating layer and in contact with the first conductive layer through an opening at least part of which overlaps with the first conductive layer.

In any of the above aspects, preferably, silicide is formed in the impurity region and the silicide region in the impurity region and the first conductive layer are in contact with each other. In addition, the silicide region preferably includes any one of nickel silicide, titanium silicide, cobalt silicide, and platinum silicide.

In any of the above aspects, the semiconductor layer preferably has a thickness of 11 to 25 nm.

In the above aspects, the semiconductor layer may include a channel formation region formed in a region overlapping with the gate electrode and a low-concentration impurity region doped with an impurity element having the same conductivity type as that of the impurity region at a lower concentration than in the impurity region between the channel formation region and the impurity region.

In the above aspects, an end portion of the first conductive layer is preferably tapered.

By applying the present invention, electrical connection between a conductive layer and a semiconductor layer can be favorable. Therefore, it is possible to provide a highly reliable semiconductor device and a manufacturing method thereof.

DETAILED DESCRIPTION OF THE INVENTION

Figure 1A:
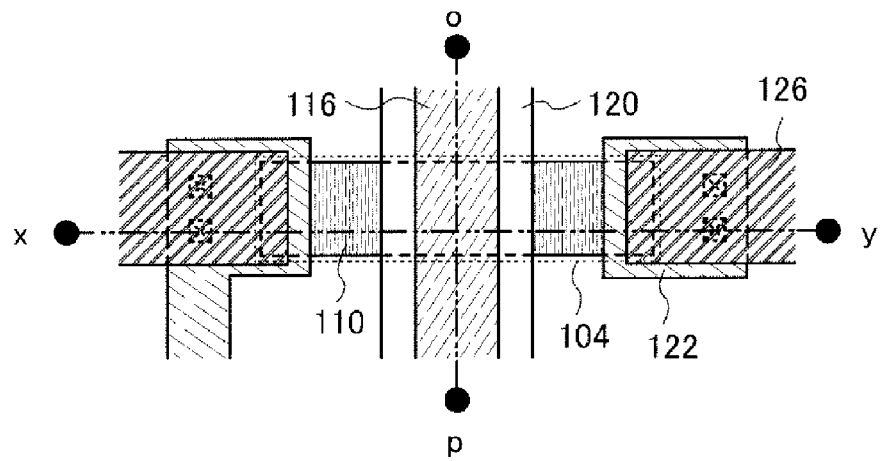
FIGS. 1A to 1C are views showing an example of a main structure of a semiconductor device of the present invention.

Hereinafter, embodiment modes of the present invention will be described with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. In a structure of the present invention to be given below, the same portions or portions having similar functions may be denoted by the same reference numerals in different drawings.

Embodiment Mode 1

Figure 1B:
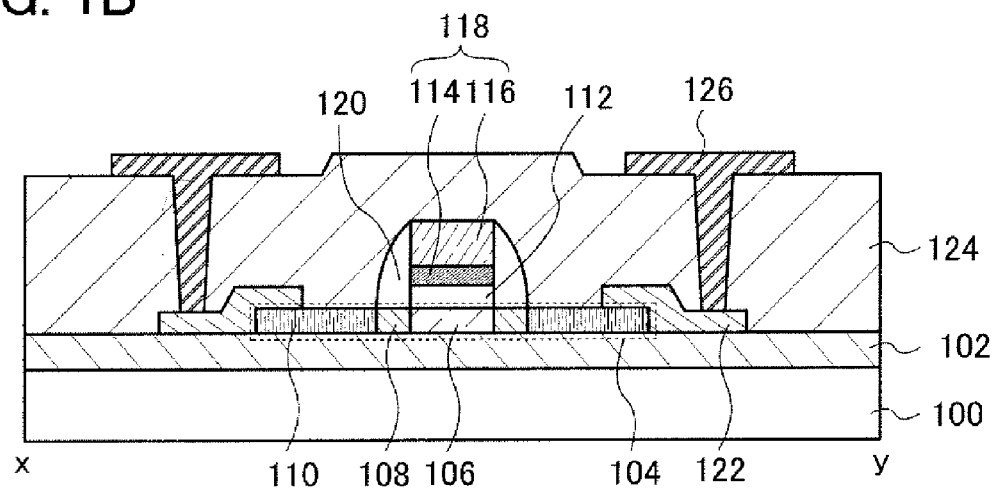
Figure 1C:
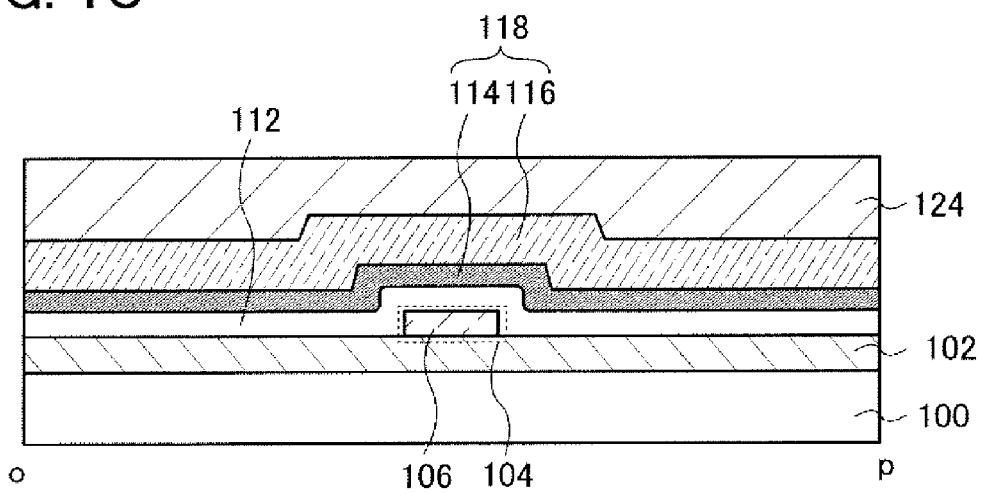

FIG. 1A is a top view and FIGS. 1B and 1C are cross-sectional views for explaining a main structure of a semiconductor device according to the present invention. FIGS. 1A to 1C particularly show a structure of a thin film transistor. FIG. 1A is a top view, FIG. 1B is a cross-sectional view taken along a dashed line x-y in FIG. 1A, and FIG. 1C is a cross-sectional view taken along a dashed line o-p in FIG. 1A. In FIG. 1A, illustration of part of a thin film and the like is omitted. Note that these drawings show only an example and the structure can be changed as appropriate depending on a desired layout.

A semiconductor device shown in FIGS. 1A to 1C includes a thin film transistor provided over a substrate 100 with an insulating layer 102 interposed therebetween. The thin film transistor includes an island-shaped semiconductor layer 104, an insulating layer 112 provided over the semiconductor layer 104, a gate electrode 118 including conductive layers 114 and 116 provided over the semiconductor layer 104 with the insulating layer 112 interposed therebetween, and insulating layers 120 provided to be in contact with the side surfaces of the conductive layers 114 and 116. In addition, conductive layers 122 are provided to be in contact with end portions of the semiconductor layer 104, and conductive layers 126 are provided over the conductive layers 122 with an insulating layer 124 interposed therebetween. The conductive layer 122 and the conductive layer 126 are connected to each other through an opening formed in the insulating layer 124. The conductive layer 126 and the semiconductor layer 104 are electrically connected to each other with the conductive layer 122 interposed therebetween.

The island-shaped semiconductor layer 104 includes a channel formation region 106, a pair of impurity regions 108 serving as LDD regions, and a pair of impurity regions 110 serving as source and drain regions Hereinafter, an impurity region serving as an LDD region is referred to as a low-concentration impurity region, and an impurity region serving as a source or drain region is referred to as a high-concentration impurity region in this specification. In this embodiment mode, low-concentration impurity regions 108 and high-concentration impurity regions 110 are provided.

The conductive layer 122 is formed to be in contact with the high-concentration impurity region 110 formed in the semiconductor layer 104. Preferably, the conductive layer 122 is formed to be in contact with the end portion of the semiconductor layer 104. In addition, the conductive layer 122 is provided on the side provided with the gate electrode 118 of the semiconductor layer 104.

The conductive layer 122 is connected to the conductive layer 126 through the opening formed in the insulating layer 124. At least part of the opening formed in the insulating layer 124 overlaps with the conductive layer 122. The conductive layer 126 serves as a source or drain electrode. Therefore, the conductive layer 122 serves as a connecting wiring for electrically connecting the conductive layer 126 serving as a source or drain electrode and the high-concentration impurity region 110 serving as a source or drain region. One feature of the present invention is that a conductive layer serving as a source or drain electrode is not in contact with a semiconductor layer directly to be connected thereto but is connected thereto with a conductive layer serving as a connecting wiring interposed therebetween. With such a structure, when an opening is formed in an insulating layer so that the conductive layer serving as a source or drain electrode is formed therein, the semiconductor layer (high-concentration impurity region) around the opening can be prevented from being etched. In particular, when a semiconductor layer is thinned for miniaturization of elements, the structure of the present invention is very effective. Further, electrical connection (hereinafter also referred to as contact) between the source or drain electrode and the semiconductor layer can be surely obtained. Therefore, a semiconductor device completed can be highly reliable. In addition, the semiconductor device can be manufactured with high yield.

The gate electrode 118 is formed of a stacked-layer structure of the conductive layers 114 and 116. The gate electrode 118 is provided so as to get across the island-shaped semiconductor layer 104. Although the example in which the gate electrode is formed of the two-layer-stacked structure of the conductive layers 114 and 116 is described with reference to FIGS. 1A to 1C, the present invention is not limited thereto. For example, the gate electrode may employ a single layer structure or a stacked-layer structure including three or more layers. Further, the side surface of the conductive layer included in the gate electrode may be tapered. Furthermore, the gate electrode may employ a stacked-layer structure including two or more conductive layers in which the taper angles may be different among the layers. When the gate electrode is formed of a stacked-layer structure of conductive layers, the widths (the length in the direction parallel to a direction for carrier flow in a channel formation region (a direction which connects a source region and a drain region)) of the layers may be almost equal to each other, or the width of the lower conductive layer may be larger than that of the upper conductive layer. Further, in this embodiment mode, although the insulating layers 120 called sidewalls (hereinafter also referred to as the sidewall insulating layers 120) are formed to be in contact with the side surfaces of the conductive layers 114 and 116 included in the gate electrode 118, the present invention is not limited thereto and the sidewall insulating layers 120 may be formed as needed.

In the island-shaped semiconductor layer 104, the channel formation region 106 is positioned between the pair of high-concentration impurity regions 110, and each of the low-concentration impurity regions 108 is positioned between the channel formation region 106 and each of the high-concentration impurity regions 110. That is, the channel formation region 106 is positioned between the pair of high-concentration impurity regions 110 and between the pair of low-concentration impurity regions 108, and is in contact with the pair of low-concentration impurity regions 108. The concentration of an impurity element which imparts one conductivity type added to the high-concentration impurity regions 110 is higher than that of the low-concentration impurity regions 108. By provision of each of the low-concentration impurity regions 108 between the channel formation region 106 and each of the high-concentration impurity regions 110 in the semiconductor layer 104, an electric field in the periphery of the drain region can be eased, and therefore, occurrence of a hot carrier can be suppressed. Occurrence of a hot carrier causes fluctuation of the threshold voltage, which may drastically reduce operating characteristics or reliability. In particular, if an element is miniaturized, i.e., the channel length (the length in the direction parallel to a direction for carrier flow in a channel formation region (a direction which connects a source region and a drain region)) is decreased, the problem of generating a high electric field in the periphery of the drain region becomes prominent, and therefore, formation of the low-concentration impurity regions which serve as LDD regions is very effective.

The thickness of the semiconductor layer 104 is 5 to 150 nm, preferably, 10 to 25 nm. In this embodiment mode, the thickness of the semiconductor layer 104 is 20 nm.

Further, the end portion of the semiconductor layer 104 may be tapered. For example, the end portion may be tapered at a taper angle of greater than or equal to 45° and less than 95°, preferably, at a taper angle of greater than or equal to 60° and less than 95°, or may be gently tapered at a taper angle of less than 45°. Note that the taper angle refers to an inclination angle formed by the side surface of a layer which is tapered and the bottom surface thereof. In this embodiment mode, the end portion is tapered at a taper angle of nearly 90°.

The channel formation region 106 is formed in a region of the semiconductor layer 104 which overlaps with the conductive layers 114 and 116 included in the gate electrode 118. The gate electrode 118 is provided over the channel formation region 106 with the insulating layer 112 interposed therebetween. Note that an impurity element which imparts one conductivity type may be added to the channel formation region 106 to control the threshold voltage of the transistor. The high-concentration impurity region 110 is formed in a region of the semiconductor layer 104 which does not overlap with the conductive layers 114 and 116 included in the gate electrode 118 and the sidewall insulating layer 120. The low-concentration impurity region 108 is formed in a region of the semiconductor layer 104 which overlaps with the sidewall insulating layer 120. In other words, in the semiconductor layer 104, the channel formation region 106 is formed in a region which overlaps with the gate electrode 118, and the impurity regions (the low-concentration impurity region 108 and the high-concentration impurity region 110) are formed outside the region which overlaps with the gate electrode 118.

In addition, here, silicide is formed in the entire high-concentration impurity region 110. When silicide is formed in an impurity region serving as a source or drain region, contact resistance between a semiconductor layer and a conductive layer can be reduced. In accordance with miniaturization of elements, a problem of increase in contact resistance becomes prominent. Therefore, achieving reduction in contact resistance by forming silicide in the impurity region is very effective to prevent signal delay and achieve low power consumption of a semiconductor device completed. In addition, when silicide is formed in the impurity region serving as a source or drain region, the impurity region can be made to have low resistance. As a result, reduction in on current can be suppressed, and deterioration in operating characteristics can be prevented.

Figure 13A:
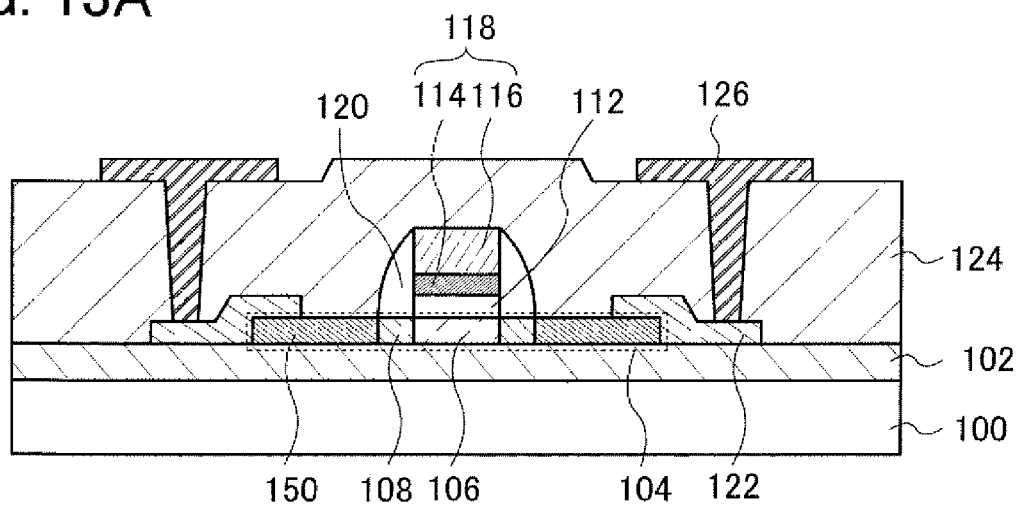
FIGS. 13A and 13B are cross-sectional views showing examples of a main structure of a semiconductor device of the present invention.
Figure 13B:
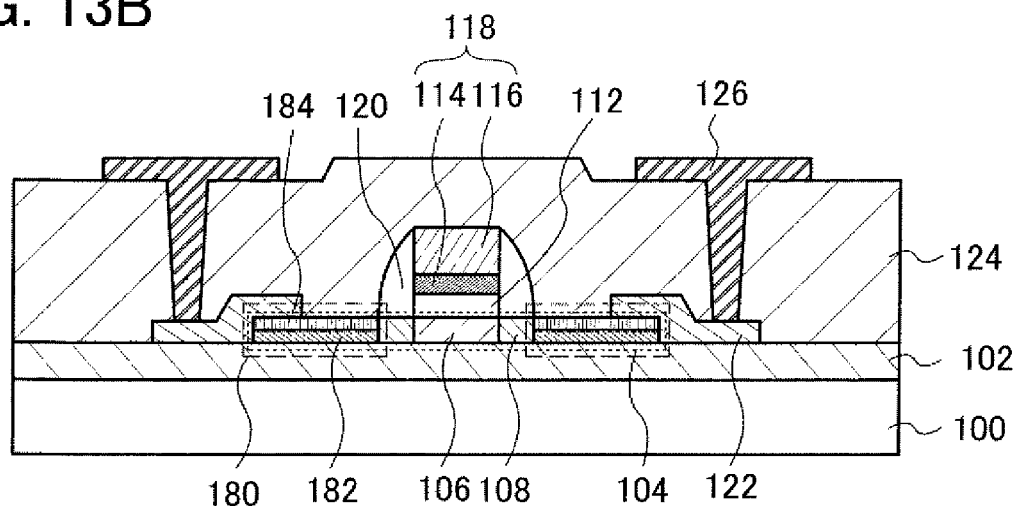

Although FIGS. 1A to 1C show the example in which silicide is formed in the entire impurity region serving as a source or drain region, the present invention is not limited thereto. For example, as shown in FIG. 13A, a high-concentration impurity region 150 in which silicide is not formed may be formed. Alternatively, as shown in FIG. 13B, silicide may be formed in part of a high-concentration impurity region 180.

Further, although the example in which the low-concentration impurity regions which serve as LDD regions are formed in the semiconductor layer 104 is shown here, the present invention is not limited thereto, and the LDD regions are not necessarily formed. In the case where the LDD regions are not formed, it is preferable to employ a structure in which a channel formation region is formed to be in contact with and between a pair of impurity regions which serve as source and drain regions. In this case, when a gate electrode is formed of a single layer structure or a stacked-layer structure in which the widths of the layers are almost equal to each other as shown in FIGS. 1A to 1C, the channel formation region is preferably formed in a region which roughly overlaps with the gate electrode and the impurity regions which serve as source and drain regions are preferably formed in the regions which do not overlap with the gate electrode. Further, when a gate electrode is formed of a stacked-layer structure in which the lower conductive layer has a width which is larger than that of the upper conductive layer, the channel formation region is preferably formed in the region which roughly overlaps with the upper conductive layer having a smaller width and the impurity regions which serve as source and drain regions are preferably formed in the regions which do not overlap with the upper conductive layer. Further, LDD regions may be formed in the semiconductor layer either in regions which overlap with the conductive layer included in the gate electrode or in regions which partially overlap with the conductive layer included in the gate electrode.

Between the semiconductor layer 104 and the gate electrode 118 (the conductive layer 114), the insulating layer 112 is formed. The insulating layer 112 serves as a gate insulating layer, and its thickness is 1 to 110 nm, preferably 2 to 20 nm. When the gate insulating layer is thinned, the transistor can be operated at low voltage with high speed, which is preferable. In this embodiment mode, the insulating layer 112 is formed to have a thickness of 20 nm.

Next, an example of a method for manufacturing the semiconductor device shown in FIGS. 1A to 1C will be described with reference to the drawings.

Figure 2A:
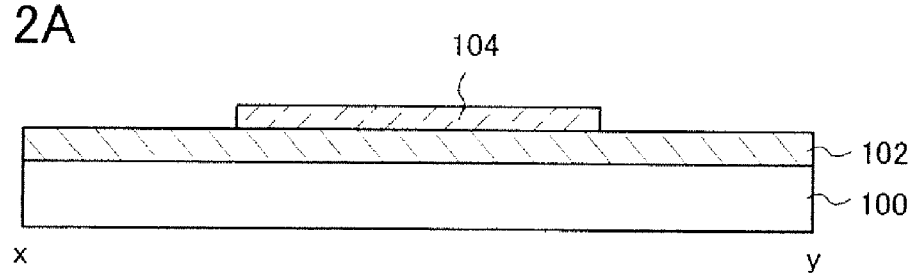
FIGS. 2A to 2E are views showing an example of a manufacturing method of a semiconductor device of the present invention.
Figure 4A:
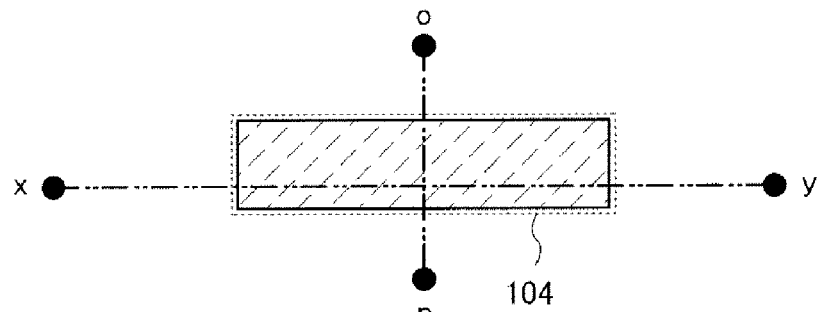
FIGS. 4A to 4D are top views showing an example of a manufacturing method of a semiconductor device of the present invention.
Figure 4B:
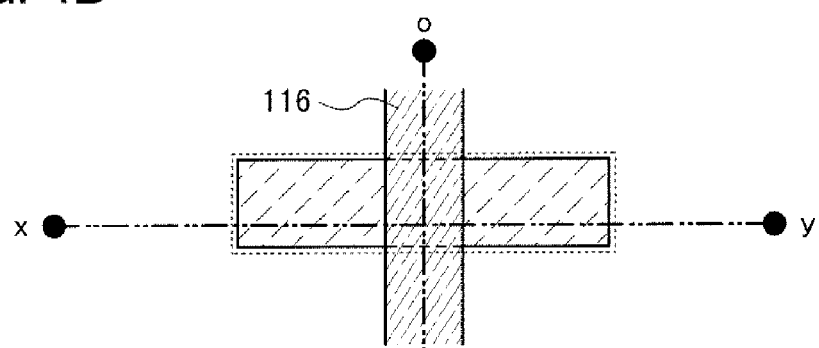

The island-shaped semiconductor layer 104 is formed over the substrate 100 with the insulating layer 102 interposed therebetween (FIGS. 2A and 4A).

For the substrate 100, a glass substrate, a quartz substrate, a sapphire substrate, a ceramic substrate, a metal substrate with an insulating layer formed over the surface, a semiconductor substrate such as a silicon substrate, or the like can be used.

The insulating layer 102 is formed using silicon oxide, silicon nitride, silicon oxynitride, silicon nitride oxide, or the like by a CVD method, a sputtering method, an ALD method, or the like. The insulating layer 102 serves as a base insulating layer, specifically, a blocking layer that prevents contamination of the semiconductor layer due to diffusion of an alkali metal or the like from the substrate 100 to the semiconductor layer. In addition, when the surface of the substrate 100 is uneven, the insulating layer 102 can serve as a layer for planarization. Note that the insulating layer 102 is not necessary to be formed if impurity diffusion from the substrate 100 or unevenness of the surface of the substrate 100 is not a problem. Further, although the base insulating layer has a single layer structure, it may have a stacked-layer structure. For example, when the base insulating layer is to have a stacked-layer structure including two layers, a silicon nitride oxide layer can be formed for the first layer and a silicon oxynitride layer can be formed for the second layer. Alternatively, a silicon nitride layer may be formed for the first layer and a silicon oxide layer may be formed for the second layer.

For the semiconductor layer 104, a single crystalline semiconductor or a crystalline semiconductor is preferably used. The semiconductor layer 104 is formed to have a thickness of 5 to 150 nm, preferably, 10 to 25 nm.

The island-shaped semiconductor layer 104 can be formed as follows: a semiconductor layer formed over the entire surface of the substrate 100 by a CVD method or a sputtering method is crystallized and then selectively etched. As a semiconductor material for forming the semiconductor layer 104, a material mainly containing silicon, specifically, silicon, silicon germanium, or the like can be used. In addition, germanium may be used. As a crystallization method of the semiconductor layer, a laser crystallization method, a thermal crystallization method using rapid thermal annealing (RTA) or an annealing furnace, a crystallization method using a metal element that promotes crystallization, a method combining these methods, or the like can be used.

In the case of using a laser crystallization method, a laser beam emitted from a continuous wave laser (hereinafter also referred to as a CW laser) or a pulsed wave laser (hereinafter also referred to as a pulsed laser) can be used. As a laser which can be used here, a gas laser such as an Ar laser, a Kr laser, an excimer laser, a copper vapor laser, or a gold vapor laser; a solid-state laser such as a laser whose medium is single-crystal YAG, YVO$_4$, or forsterite (Mg$_2$SiO$_4$, YAlO$_3$, or GdVO$_4$), to which one or more of Nd, Yb, Cr, Ti, Ho, Er, Tm, and Ta has been added as a dopant, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta has been added as a dopant; a glass laser; an alexandrite laser; a ruby laser; or a Ti:sapphire laser; or the like can be given. In the case of using the solid-state laser, any of the fundamental wave to fourth harmonic thereof can be selected as appropriate for irradiation. For example, the second harmonic (532 nm) or the third harmonic (355 nm) of an Nd:YVO$_4$ laser (the fundamental wave: 1064 nm) can be used. When an Nd:YVO$_4$ laser is used as a CW laser, a laser power density of about 0.01 to 100 MW/cm$^2$ (preferably, 0.1 to 10 MW/cm$^2$) is required, and irradiation is conducted with a scanning rate of about 10 to 2000 cm/sec. Note that the second harmonic (532 nm) is preferably used here; this is because the second harmonic is superior in energy efficiency to the harmonics higher than this.

When laser crystallization is performed using a CW laser, the semiconductor layer continuously receives energy; therefore, once the semiconductor layer is melted, the melted state can be continuous. Therefore, it is possible to move a solid-liquid interface of the semiconductor layer by scanning with a CW laser beam and to form a crystal grain which is elongated in one direction along this scanning direction. A solid-state laser is preferably used because its output is so stable that a stable process can be expected compared to a gas laser or the like. By using not only a CW laser but also a pulsed laser with a repetition rate of greater than or equal to 10 MHz, the similar effect can be obtained. In the case of a pulsed laser with a high repetition rate, when the pulse interval of the laser is shorter than the period after the semiconductor layer is melted and before the melted semiconductor layer is solidified, the semiconductor layer can be maintained in a melted state at all times. Also, by movement of the solid-liquid interface, a semiconductor layer including a crystal grain which is elongated in one direction can be formed. Moreover, oscillation of a laser beam with TEM$_{00}$ (single transverse mode) in a laser oscillator is preferable because the energy homogeneity of a linear beam spot on an irradiation surface can be improved.

The semiconductor layer 104 can be formed into an island-shape by the steps of selectively covering the semiconductor layer formed over the entire surface of the substrate with a resist mask and etching the semiconductor layer not covered with the resist mask. The semiconductor layer can be etched by a dry etching method or a wet etching method. In the case of dry etching, an etching gas with high etching selectivity of the semiconductor layer with respect to the base insulating layer is used. That is, an etching gas with a low etching rate with respect to the insulating layer 102 and a high etching rate with respect to the semiconductor layer 104 may be used. As an etching gas, for example, a chlorine-based gas such as Cl$_2$, BCl$_3$, or SiCl$_4$, a fluorine-based gas such as CF$_4$, NF$_3$, or SF$_6$, or an HBr gas can be used. Further, an inert gas such as He, Ar, or Xe may be added as appropriate. Furthermore, an O$_2$ gas may be added to a fluorine-based gas as appropriate. After the semiconductor layer is processed into a desired shape, the resist mask is removed.

The semiconductor layer 104 may be formed such that the end portion is near-perpendicularly tapered or gently tapered. For example, the end portion may be tapered at a taper angle of greater than or equal to 45° and less than 95°, preferably, greater than or equal to 60° and less than 95°, or may be gently tapered at a taper angle of less than 45°. The shape of the end portion of the semiconductor layer 104 can be selected as appropriate by changing the etching condition or the like.

When the thickness of the semiconductor layer 104 is made to be less than or equal to 50 nm, the semiconductor layer may be thinned by etching after being formed to be greater than or equal to 50 nm thick. For example, when the semiconductor layer is thinned by a dry etching method, a chlorine-based gas such as $Cl_2$, $BCl_3$, or $SiCl_4$, a fluorine-based gas such as $CF_4$, $NF_3$, or $SF_6$, or an HBr gas can be used. Further, an inert gas such as He, Ar, or Xe may be added as appropriate. Furthermore, an $O_2$ gas may be added to a fluorine-based gas. Alternatively, the semiconductor layer is partially modified, and the modified region may be selectively etched. To modify the semiconductor layer, for example, oxidation treatment, nitridation treatment, or the like is performed to the semiconductor layer, and a region that is desired to be etched may be modified by such treatment.

In this embodiment mode, a crystalline silicon layer having a thickness of 20 nm is formed for the semiconductor layer 104.

Note that an SOI substrate provided with a single crystalline semiconductor layer on its insulating surface may be used for the semiconductor layer without performing various thin film fabrication processes using a crystallization method. In this case, the semiconductor layer 104 can be formed using a single crystalline semiconductor layer provided on the insulating surface.

Figure 2B:
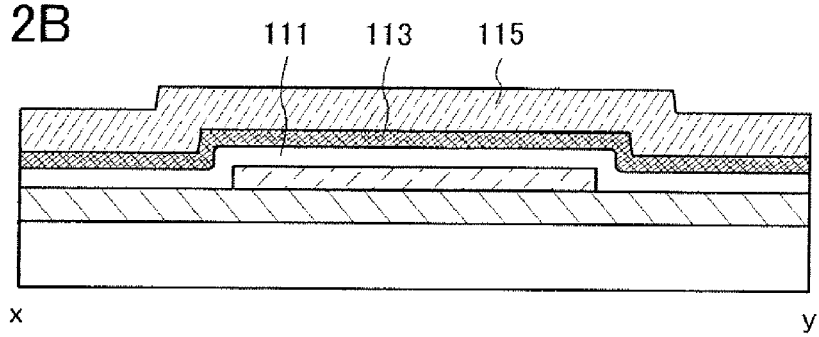

Next, after an insulating layer 111 is formed over the semiconductor layer 104, a conductive layer is formed over the insulating layer 111. In this embodiment mode, a stacked-layer structure of conductive layers 113 and 115 is formed as the conductive layer (FIG. 2B).

The insulating layer 111 is formed of a single layer structure or a stacked-layer structure using silicon oxide, silicon nitride, silicon oxynitride, silicon nitride oxide, aluminum nitride, and/or the like by a CVD method, a sputtering method, an ALD method, or the like. The thickness of the insulating layer 111 is 1 to 110 nm, preferably, 2 to 20 nm. Note that the insulating layer 111 serves as a gate insulating layer in a thin film transistor completed later. In this embodiment mode, a silicon oxynitride layer is formed to have a thickness of 20 nm for the insulating layer 111.

Alternatively, the insulating layer 111 can be formed by solid phase oxidation or solid phase nitridation by plasma treatment. For example, the semiconductor layer 104 can be oxidized or nitrided by plasma treatment to form the insulating layer 111. When the semiconductor layer 104 is oxidized or nitrided by plasma treatment, the insulating layer 111 which is dense and excellent in reliability and has high withstand voltage can be formed.

In the solid phase oxidation treatment or solid phase nitridation treatment by plasma treatment, plasma which is excited by high-frequency waves such as microwaves (typically, 2.45 GHz) and has an electron density of $1 \times 10^{11}$ to $1 \times 10^{13}$ $cm^{-3}$, inclusive, and electron temperatures of 0.5 to 1.5 eV, inclusive, is preferably used. This is because in the solid phase oxidation treatment or solid phase nitridation treatment at temperatures of less than or equal to 500° C., a dense insulating layer is to be formed and a practical reaction speed is to be obtained.

When the surface of the semiconductor layer 104 is oxidized by plasma treatment, the plasma treatment is performed in an atmosphere containing oxygen (e.g., an atmosphere containing oxygen, ozone, nitrous oxide, nitrogen monoxide, or nitrogen dioxide, and a rare gas (at least one of helium (He), neon (Ne), argon (Ar), krypton (Kr), and xenon (Xe)), or an atmosphere containing oxygen, ozone, nitrous oxide, nitrogen monoxide, or nitrogen dioxide, hydrogen, and a rare gas). Further, when the surface of the semiconductor layer 104 is nitrided by plasma treatment, the plasma treatment is performed in an atmosphere containing nitrogen (e.g., an atmosphere containing nitrogen and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar is preferably used, for example. Further, a gas in which Ar and Kr are mixed may also be used.

Figure 12:
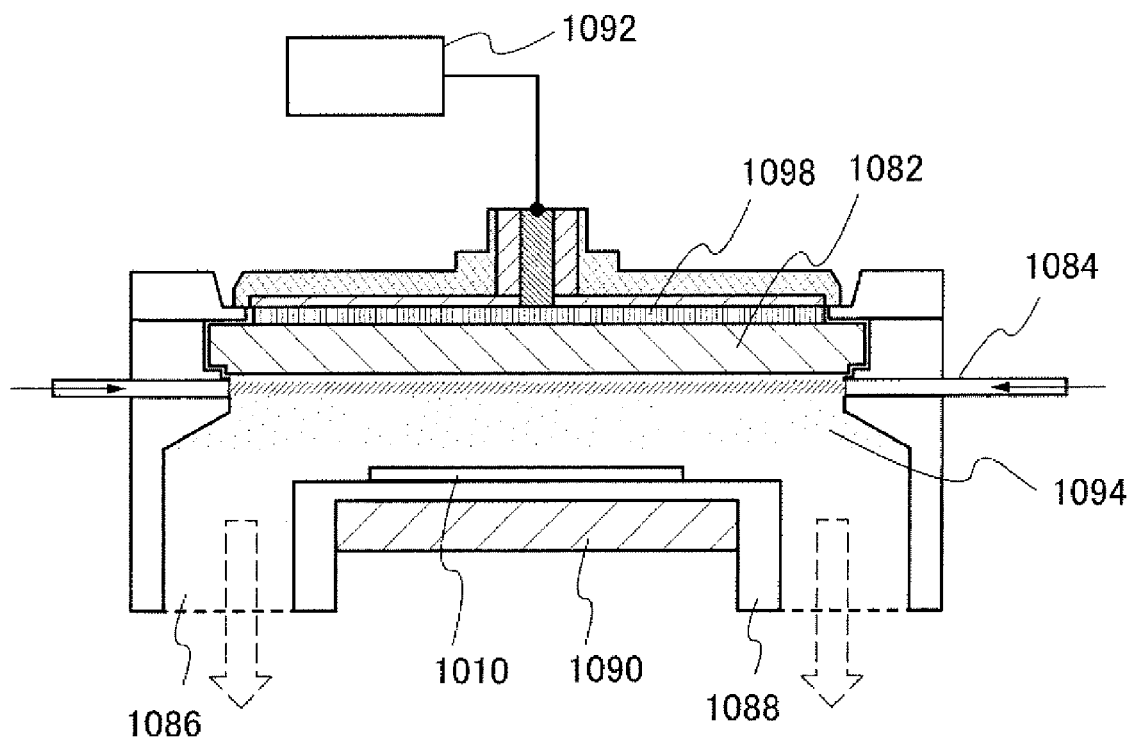
FIG. 12 is a view showing an example of a structure of plasma processing equipment.

FIG. 12 shows a structural example of plasma processing equipment 1080 for performing plasma treatment. The plasma processing equipment 1080 includes a support 1088, a gas supplying portion 1084 for supplying a gas, an exhaust port 1086 connected to a vacuum pump for exhausting a gas, an antenna 1098, a dielectric plate 1082, and a high-frequency wave supplying portion 1092 for supplying high-frequency waves for plasma generation. An object to be processed 1010 is held by the support 1088. In addition, by providing a temperature controller 1090 for the support 1088, the temperature of the object to be processed 1010 can be controlled. The object to be processed 1010 is a body to which plasma treatment is performed, and corresponds to an object in which the insulating layer 102 and the island-shaped semiconductor layer 104 are stacked in order over the substrate 100 in this embodiment mode.

Hereinafter, a specific example in which an insulating layer is formed on the surface of the semiconductor layer with the plasma processing equipment 1080 shown in FIG. 12 is described. Note that the plasma treatment includes oxidation treatment, nitridation treatment, oxynitridation treatment, hydrogenation treatment, and surface modification treatment performed to a substrate, a semiconductor layer, an insulating layer, and a conductive layer. For these treatments, a gas supplied from the gas supplying portion 1084 may be selected in accordance with an intended purpose.

First, a processing chamber of the plasma processing equipment 1080 shown in FIG. 12 is made in vacuum and a gas containing a rare gas and oxygen or nitrogen is supplied from the gas supplying portion 1084. The object to be processed 1010 is heated at room temperature or at temperatures of 100 to 550° C., inclusive, by the temperature controller 1090. The distance between the object to be processed 1010 and the dielectric plate 1082 (hereinafter also called an electrode interval) is approximately 20 to 200 mm, inclusive (preferably 20 to 60 mm, inclusive).

Next, high-frequency waves are supplied from the high-frequency wave supplying portion 1092 to the antenna 1098. Here, microwaves (frequency: 2.45 GHz) are input as the high-frequency waves. Then, the microwaves are introduced from the antenna 1098 into the processing chamber through the dielectric plate 1082; thus, plasma 1094 is generated. With the plasma 1094, oxygen radicals (which may include an OH radical) or nitrogen radicals (which may include an NH radical) are generated. At this time, the plasma 1094 is generated from the gas supplied.

When the plasma 1094 is generated by introducing high-frequency waves such as microwaves, plasma which has the low electron temperature (less than or equal to 3 eV, preferably less than or equal to 1.5 eV) and the high electron density (greater than or equal to $1 \times 10^{11}$ $cm^{-3}$) can be generated. Specifically, plasma which has electron temperatures of 0.5 to 1.5 eV, inclusive, and an electron density of $1 \times 10^{11}$ to $1 \times 10^{13}$ $cm^{-3}$, inclusive, is preferably generated. Note that in this specification, plasma which has the low electron temperature and the high electron density generated by introducing microwaves is also called high-density plasma. Further, plasma treatment utilizing high-density plasma is also called high-density plasma treatment.

With the oxygen radicals (which may include an OH radical) or nitrogen radicals (which may include an NH radical) generated by the plasma 1094, the surface of the semiconductor layer formed in the object to be processed 1010 is oxidized or nitrided, whereby an insulating layer is formed. In this case, if the rare gas such as argon is mixed in the gas supplied, oxygen radicals or nitrogen radicals can be generated efficiently by excited species of the rare gas. Note that in the case where the rare gas is used in the gas supplied, the rare gas may be contained in the insulating layer formed. In this method, by effective use of active radicals excited by plasma, oxidation or nitridation by a solid phase reaction can be performed at low temperatures of less than or equal to 500° C.

As one preferable example of the insulating layer 111 formed by the high-density plasma treatment using the equipment shown in FIG. 12, a silicon oxide layer is formed on one surface of the semiconductor layer 104 to have a thickness of 3 to 6 nm by plasma treatment in an atmosphere containing oxygen, and the surface of the silicon oxide layer is treated with nitridation plasma in an atmosphere containing nitrogen to form a nitrogen-plasma-treated layer (silicon nitride layer). Specifically, first, the silicon oxide layer is formed on one surface of the semiconductor layer 104 by plasma treatment in an atmosphere containing oxygen to have a thickness of 3 to 6 nm. Then continuously, the plasma treatment in an atmosphere containing nitrogen is performed, whereby the nitrogen-plasma-treated layer with high nitrogen concentration is provided on the one surface of the silicon oxide layer or in the periphery of the surface. Note that the "periphery of the surface" refers to a region in a depth of approximately 0.5 to 1.5 nm from the surface of the silicon oxide layer. For example, by performing the plasma treatment in an atmosphere containing nitrogen, a structure in which nitrogen is contained at 20 to 50 at. % in a region of the silicon oxide layer in a depth of approximately 1 nm from the surface thereof in a perpendicular direction is obtained. Further, the high-density plasma treatment can also oxidize or nitride the surface of the insulating layer 111.

For example, by forming a silicon layer as the semiconductor layer 104 and oxidizing the surface of the silicon layer with plasma treatment, an oxide layer which is not distorted at an interface and is dense can be formed. Further, by nitriding the oxide layer with plasma treatment, by which oxygen is substituted for nitrogen in the top surface layer portion to form a nitride layer, the insulating layer can be denser. In this manner, an insulating layer with a high withstand voltage can be formed.

In any case, by the solid phase oxidation treatment or solid phase nitridation treatment with plasma treatment as described above, even if a glass substrate with an upper temperature limit of less than or equal to 700° C. is used, an insulating layer which is equivalent to a thermally-oxidized film which is formed at temperatures of 950 to 1050° C. can be obtained. That is, a highly reliable insulating layer can be formed as the insulating layer that serves as a gate insulating layer in a semiconductor element, in particular, a thin film transistor or a nonvolatile memory element.

As the insulating layer 111, a high dielectric constant material may be used. When a high dielectric constant material is used for the insulating layer 111, leak current can be reduced. As the high dielectric constant material, zirconium dioxide, hafnium oxide, titanium dioxide, tantalum pentoxide, or the like can be used. Further, after the insulating layer is formed using the high dielectric constant material, a silicon oxide layer may be stacked by solid-phase oxidation by plasma treatment.

Next, the conductive layers 113 and 115 are formed using a conductive material by a CVD method or a sputtering method. As the conductive material, a metal element such as tantalum (Ta), tungsten (W), titanium (Ti), molybdenum (Mo), chromium (Cr), aluminum (Al), copper (Cu), or niobium (Nb); or an alloy material or a compound material containing any of the above metal elements can be used. Further, a semiconductor material typified by polycrystalline silicon to which an impurity element which imparts one conductivity type such as phosphorus is added can also be used. Although an example in which a stacked-layer structure including the conductive layers 113 and 115 is formed is shown, the conductive layer formed over the insulating layer 111 may have a single layer structure. The conductive layer (the stacked-layer structure including the conductive layers 113 and 115) is formed to have a thickness in the range of 50 to 1000 nm, preferably 100 to 800 nm, and more preferably 200 to 500 nm.

In this embodiment mode, as the conductive layers 113 and 115, a stacked-layer structure of a tantalum nitride layer having a thickness of 30 nm and a tungsten layer having a thickness of 370 nm is formed.

Figure 2C:
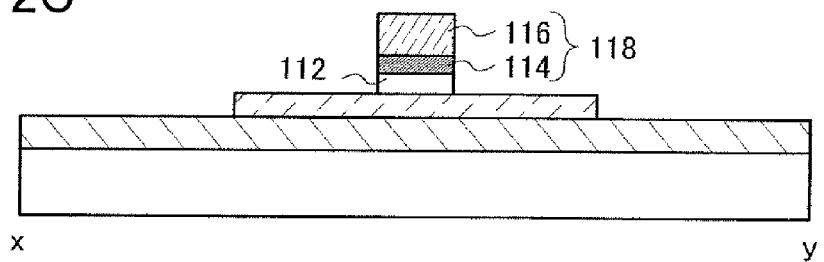

Next, the conductive layers 113 and 115 are selectively etched, so that the conductive layers 114 and 116 constituting the gate electrode 118 are formed (FIG. 2C). In addition, a region of the insulating layer 111 which does not overlap with the conductive layers 114 and 116 is selectively etched, so that the insulating layer 112 is formed. The insulating layer 112 serves as a gate insulating layer.

The conductive layers 114 and 116 can be formed as follows, the conductive layers 113 and 115 formed over the entire surface of the substrate are selectively covered with a resist mask, and the conductive layers 113 and 115 not covered with the resist mask are etched, so that a desired shape is obtained. After the etching, the resist mask is removed.

Figure 2D:
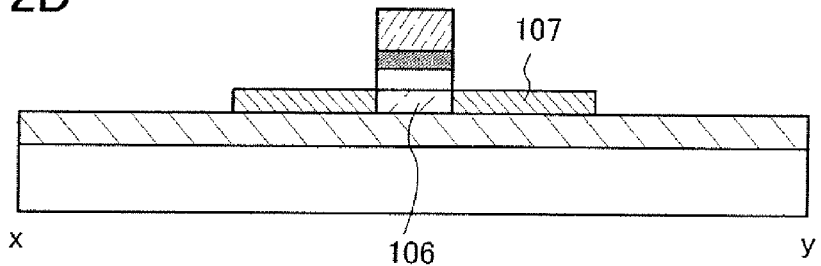
Figure 4C:
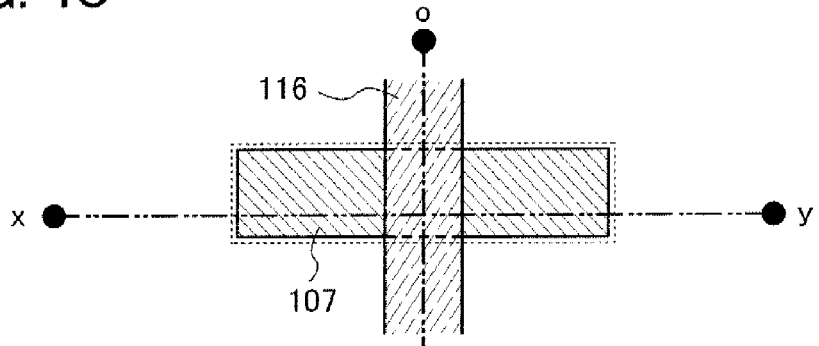

Next, an impurity element which imparts one conductivity type is selectively added to the semiconductor layer 104 at a first concentration, whereby a pair of low-concentration impurity regions 107 and the channel formation region 106 are formed (FIGS. 2D and 4C). Here, the impurity element is added with the conductive layers 114 and 116 as a mask so that the pair of low-concentration impurity regions 107 and the channel formation region 106 positioned between the pair of low-concentration impurity regions 107 are formed in a self-aligned manner. Parts of the low-concentration impurity regions 107 formed at this time form LDD regions later. As the impurity element which imparts one conductivity type, an element which imparts p-type conductivity such as boron (B), aluminum (Al), or gallium (Ga) or an element which imparts n-type conductivity such as phosphorus (P) or arsenic (As) can be used, In this embodiment mode, as the impurity element, phosphorus that is an element which imparts n-type conductivity is added to be contained at a peak concentration of about $1 \times 10^{18}$ cm$^{-3}$.

Figure 2E:
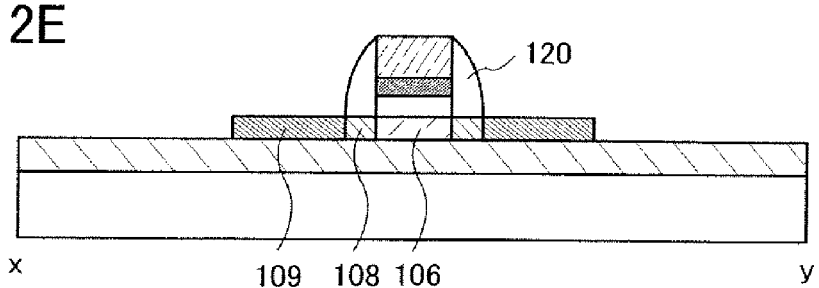
Figure 4D:
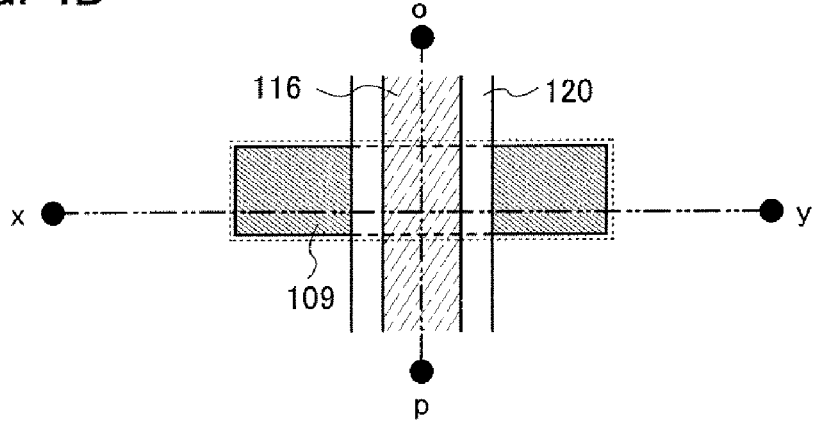

Next, the sidewall insulating layers 120 which are in contact with the side surfaces of the conductive layers 114 and 116 and the insulating layer 112 are formed (FIGS. 2E and 4D).

The sidewall insulating layers 120 are formed as follows: an insulating layer is formed so that a stacked-layer structure of the conductive layers 114 and 116 and the insulating layer 112 is embedded therein, and the insulating layer is selectively etched by anisotropic etching mainly in a perpendicular direction. Specifically, an insulating layer with a single layer structure or stacked-layer structure is formed using an inorganic material such as silicon oxide, silicon nitride, silicon oxynitride, or silicon nitride oxide, or an organic material such as an organic resin by a CVD method or a sputtering method, and the insulating layer is selectively etched. The sidewall insulating layer 120 can be used as a doping mask when LDD regions are formed later. Further, the sidewall insulating layer 120 can be used as a mask for forming silicide when a silicide region is formed later.

Here, an example is shown in which the surfaces of the sidewall insulating layers 120 which are not in contact with the side surfaces of the conductive layers 114 and 116 are curved. Although the shape of the sidewall insulating layers 120 is not particularly limited but the sidewall insulating layers 120 entirely cover the side surfaces of the conductive layers 114 and 116 included in the gate electrode 118. Here, the sidewall insulating layers 120 are formed to cover also the side surfaces of the insulating layer 112 serving as a gate insulating layer entirely. Note that part of an upper portion of the semiconductor layer 104 is also etched depending on etching conditions and reduced in thickness (referred to as film reduction) in some cases.

Next, an impurity element which imparts one conductivity type is selectively added to the semiconductor layer 104 at a second concentration, whereby a pair of high-concentration impurity regions 109 and the pair of low-concentration impurity regions 108 are formed (FIGS. 2E and 4D). Here, the impurity element is added with the conductive layers 114 and 116 and the sidewall insulating layers 120 formed to be in contact with the side surfaces of the conductive layers 114 and 116 as a mask, so that the pair of high-concentration impurity regions 109 and the pair of low-concentration impurity regions 108 are formed in a self-aligned manner. The high-concentration impurity regions 109 formed at this time serve as source and drain regions, and the low-concentration impurity regions 108 serve as LDD regions. As the impurity element which imparts one conductivity type, an impurity element which imparts the same conductivity type as the element which is added for forming the above-described low-concentration impurity regions 107 can be used. Note that, when the impurity elements are added, the second concentration is set to be higher than the first concentration. Therefore, the concentration of the impurity element in the high-concentration impurity regions 109 is higher than that of the low-concentration impurity regions 108. In this embodiment mode, as the impurity element, phosphorus which imparts n-type conductivity is added to be contained at a peak concentration of about $1 \times 10^{21}$ cm$^{-1}$.

Figure 3A:
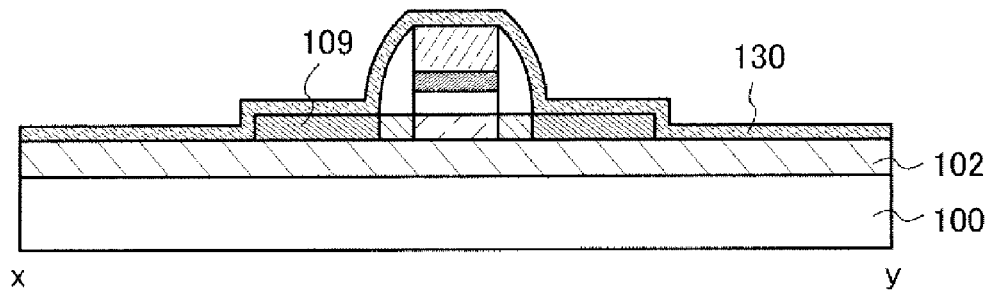
FIGS. 3A to 3D are views showing an example of a manufacturing method of a semiconductor device of the present invention.

Next, a metal layer 130 is formed over the semiconductor layer 104 (FIG. 3A). Before the metal layer 130 is formed, a region of the semiconductor layer 104 which does not overlap with the gate electrode 118 and the sidewall insulating layers 120 is exposed. When a natural oxide film is formed on the exposed semiconductor layer 104, the natural oxide film is removed and then the metal layer 130 is formed.

The metal layer 130 is formed using a material which reacts with the semiconductor layer and becomes silicide, such as a metal element, e.g., nickel, titanium, cobalt, or platinum, or an alloy material containing any of the metal elements by a sputtering method, an evaporation method, a plating method, or the like. The metal layer 130 is formed to have a thickness of 1 to 50 nm, preferably, 3 to 10 nm. In this embodiment mode, a nickel layer is formed to have a thickness of 10 nm as the metal layer 130.

Figure 3B:
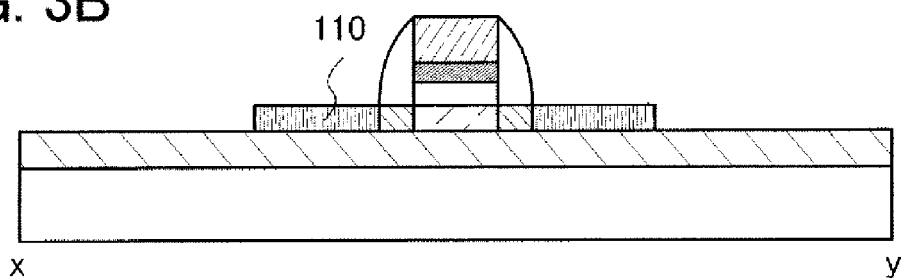
Figure 5A:
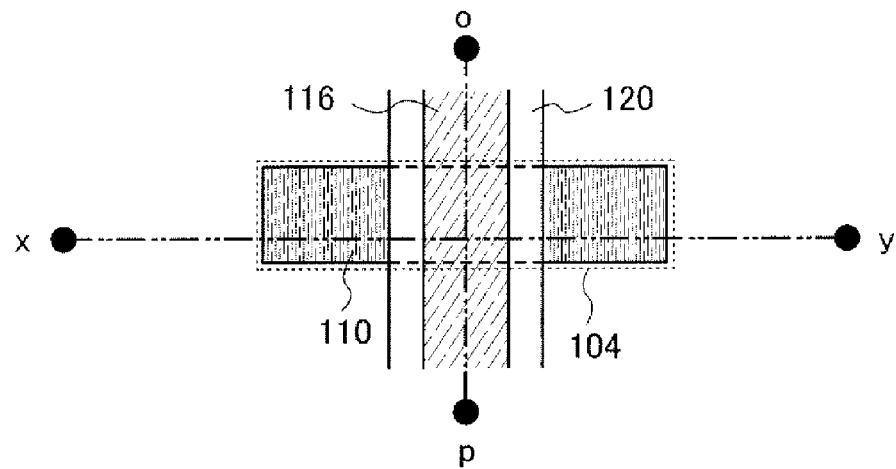
FIGS. 5A to 5C are top views showing an example of a manufacturing method of a semiconductor device of the present invention.

Next, silicide is formed in part of the semiconductor layer 104. In this embodiment mode, silicide is formed in the high-concentration impurity regions 109 entirely from the top surface to the bottom surface to form the high-concentration impurity regions 110 (FIGS. 3B and 5A). Note that the top surface is a surface of the semiconductor layer 104 on which the metal layer 130 for forming silicide is formed, and the bottom surface is a surface which is in contact with the insulating layer 102.

Silicide is formed when heat treatment is performed and reaction occurs in a region where the semiconductor layer 104 and the metal layer 130 are in contact with each other. For example, when nickel is formed as the metal layer 130, nickel silicide is formed in the high-concentration impurity regions 110. Similarly, when titanium, cobalt, or platinum is formed as the metal layer 130, titanium silicide, cobalt silicide, or platinum silicide is formed in the high-concentration impurity regions 110.

Heat treatment can be performed using RTA or an annealing furnace. Specifically, heat treatment may be performed at temperatures in the range of 300 to 700° C. for 10 seconds to 1 hour, preferably 20 seconds to 30 minutes. In this embodiment mode, heat treatment is performed at 500° C. for 30 seconds, so that the high-concentration impurity regions 110 formed of nickel silicide are formed.

The shape, thickness, and the like of the silicide region can be selected by appropriately controlling the thickness of the metal layer 130 to be reacted, temperature of heat treatment, time of heat treatment, and the like. FIGS. 1A to 1C (FIG. 3B) show an example of the high-concentration impurity regions 110 in which silicide is entirely formed. However, for example, as shown in FIG. 13B, a structure may be employed in which silicide is partially formed in the high-concentration impurity regions 180. In FIG. 13B, a silicide region 184 in which silicide is formed is formed on the top surface side of the high-concentration impurity region 180, and a non-silicide region 182 in which silicide is not formed is formed on the bottom surface side. In addition, FIGS. 1A to 1C show an example in which silicide is not formed in regions below the sidewall insulating layers 120, but the present invention is not limited thereto. Silicide may also be formed in the semiconductor layer 104 below the sidewall insulating layers 120 (except the channel formation region 106).

After silicide is formed in the semiconductor layer 104, the metal layer 130 which has not reacted is removed if it remains. Specifically, the metal layer 130 formed over the sidewall insulating layers 120, the gate electrode 118, and the insulating layer 102 is removed. If the metal layer which has not reacted also remains over the high-concentration impurity regions 110 in which silicide is formed, the remaining metal layer is removed. The metal layer which has not reacted can be removed by a wet etching method or a dry etching method. At this time, an etching gas or an etchant which has high etching selectivity of the metal layer which has not reacted with respect to other layers (such as the sidewall insulating layers 120, the conductive layer 116, the insulating layer 102, and the high-concentration impurity regions 110 in which silicide is formed) is used. In other words, an etching gas or an etchant which has a high etching rate with respect to the metal layer and a low etching rate with respect to other layers may be used. For example, when a nickel layer is formed as the metal layer 130, the metal layer 130 which has not reacted can be removed by wet etching using a solution such as sulfuric acid or nitric acid.

Through the above, the channel formation region 106, the pair of low-concentration impurity regions 108, and the pair of high-concentration impurity regions 110 are formed in the semiconductor layer 104. The channel formation region 106 is positioned between the pair of high-concentration impurity regions 110, and each of the low-concentration impurity regions 108 is formed to be in contact with and between each of the high-concentration impurity regions 110 and the channel formation region 106. The channel formation region 106 is formed in a region of the semiconductor layer 104 which overlaps with the gate electrode 118 (the conductive layers 114 and 116). The low-concentration impurity region 108 is formed in a region of the semiconductor layer 104 which overlaps with the sidewall insulating layer 120 but does not overlap with the gate electrode 118. The high-concentration impurity region 110 is formed in a region of the semiconductor layer 104 which does not overlap with the gate electrode 118 and the sidewall insulating layer 120.

Further, in order to control the threshold voltage of a transistor, an impurity element which imparts one conductivity type may be added to the channel formation region 106. By addition of the impurity element at a certain concentration to the channel formation region 106, the threshold voltage of a transistor can be shifted forcibly to a desired threshold voltage. As the impurity element which imparts one conductivity type, an element which imparts p-type conductivity such as boron (B), aluminum (Al), or gallium (Ga) or an element which imparts n-type conductivity such as phosphorus (P) or arsenic (As) can be used. The element which imparts p-type conductivity can be used in this embodiment mode, and for example, boron can be added so as to be contained at concentrations of about $1\times10^{16}$ to $1\times10^{18}$ cm$^{-3}$, inclusive. Note that addition of the impurity element to the channel formation region 106 may be performed before the gate electrode 118 is formed.

Further, after the impurity element which imparts one conductivity type is added to the semiconductor layer 104, heat treatment is preferably performed to activate the impurity element added. The heat treatment can be performed by laser beam irradiation, RTA, or using an annealing furnace. Specifically, the heat treatment may be performed at temperatures of 400 to 700° C., preferably 500 to 650° C. Further, the heat treatment is preferably performed in a nitrogen atmosphere. For example, activation can be performed by heating at 550° C. for 4 hours.

Figure 3C:
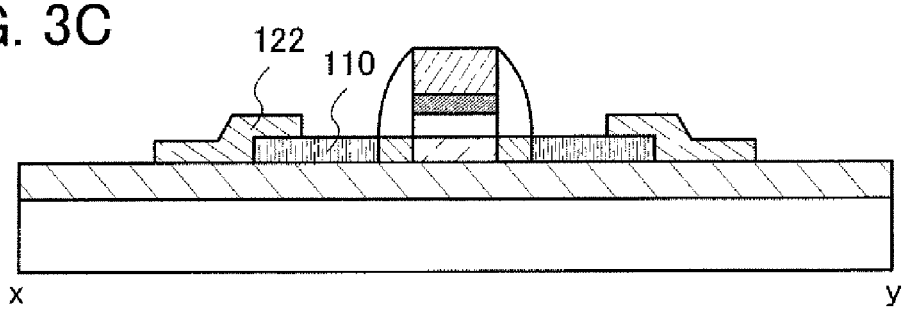
Figure 5B:
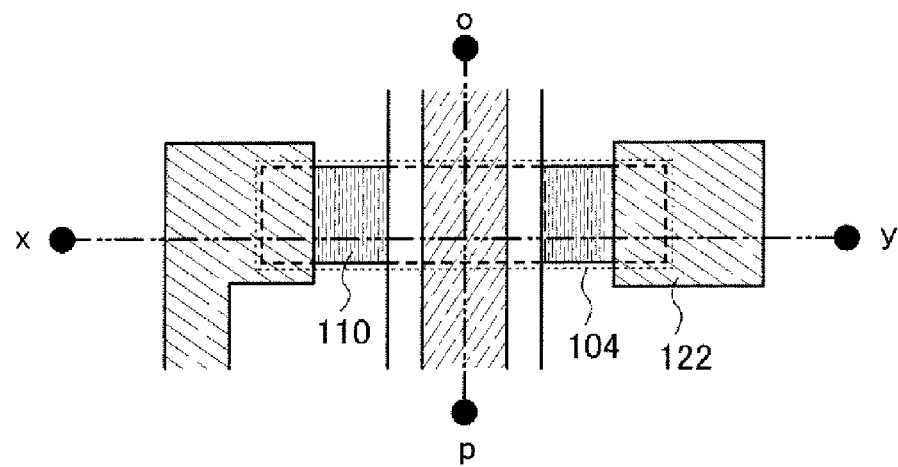

Next, the conductive layers 122 are formed to be in contact with the high-concentration impurity regions 110 (FIGS. 3C and 5B). The conductive layers 122 are formed on the side provided with the gate electrode 118 of the semiconductor layer 104. It is preferable that the conductive layers 122 be formed so as to partially cover the end portions of the semiconductor layer 104. Each of the conductive layers 122 preferably has a region which overlaps with the semiconductor layer 104 (the high-concentration impurity region 110) and a region which does not overlap with the semiconductor layer 104 (the high-concentration impurity region 110).

The conductive layers 122 are formed by the steps of forming a conductive layer to have a single layer structure or a stacked-layer structure using a conductive material by a CVD method or a sputtering method and etching the conductive layer selectively. As the conductive material, a metal element such as titanium (Ti), tantalum (Ta), tungsten (W), or molybdenum (Mo), or an alloy material or a compound material containing any of the above metal elements can be used. Preferably, a conductive material whose melting point is greater than or equal to 600° C. and resistance is low is used. The conductive layers 122 are formed to have a thickness of 10 to 200 nm.

The conductive layers 122 can be processed into a desired shape by covering the conductive layer formed over the entire surface of the substrate with a resist mask selectively and etching the conductive layer not covered with the resist mask. The conductive layer can be etched by a dry etching method or a wet etching method. An etching gas or an etchant which has high etching selectivity of the conductive layers 122 with respect to other layers (such as the high-concentration impurity regions 110 in which silicide is formed, the insulating layers 120, the gate electrode 118, and the insulating layer 102) is used. In other words, an etching gas or an etchant which has a high etching rate with respect to the conductive layers 122 and a low etching rate with respect to other layers may be used. For example, when nickel silicide is formed in the high-concentration impurity regions 110 and a titanium layer is formed for the conductive layers 122, wet etching using a solution such as hydrogen fluoride can be performed. In this embodiment mode, a titanium layer with a thickness of 100 nm is formed for the conductive layers 122.

Figure 3D:
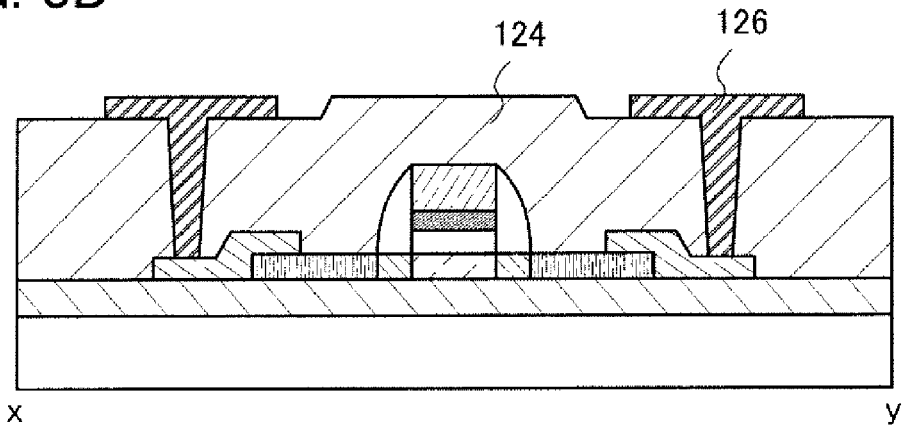
Figure 5C:
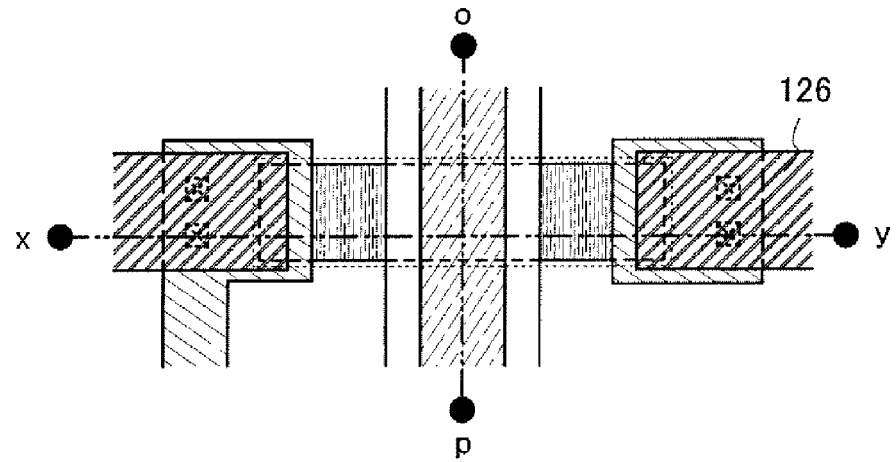

Next, the insulating layer 124 is formed so as to cover the insulating layer, conductive layer, and the like provided over the substrate 100. Then, after openings which reach the conductive layers 122 are formed in the insulating layer 124, the conductive layers 126 are formed in the openings and over the insulating layer 124 (FIGS. 3D and 5C).

The conductive layers 126 serve as source and drain electrodes. The conductive layers 126 are in contact with and connected to the conductive layers 122 through the openings formed in the insulating layer 124. The conductive layers 122 are in contact with the high-concentration impurity regions 110. Therefore, the conductive layers 126 serving as source and drain electrodes are electrically connected to the high-concentration impurity regions 110 serving as source and drain regions with the conductive layers 122 serving as connecting wirings interposed therebetween.

The insulating layer 124 is formed by a CVD method, a sputtering method, an ALD method, or a coating method, or by combination of insulating layers formed by these methods to have a single layer structure or a stacked-layer structure. For example, the insulating layer 124 is formed using an inorganic insulating material such as silicon oxide, silicon nitride, silicon oxynitride, or silicon nitride oxide; or an insulating material containing carbon such as DLC (diamond-like carbon) by a CVD method, a sputtering method, or an ALD method. Further, the insulating layer 124 can be formed using an organic insulating material such as epoxy, polyimide, polyamide, polyvinyl phenol, benzocyclobutene, or acrylic; or a siloxane material such as a siloxane resin by a coating method. Note that the siloxane material corresponds to a material having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Further, the insulating layer 124 may also be formed by forming an insulating layer by a CVD method, a sputtering method, an ALD method, or the like and then performing high-density plasma treatment thereto in an oxygen atmosphere or a nitrogen atmosphere. Although the insulating layer 124 of a single layer structure is formed over the gate electrode 118 and the like here, a stacked-layer structure including two or more layers may be employed. When the insulating layer has a stacked-layer structure, the insulating layer in a lower layer (on the side in contact with the gate electrode and the like) is preferably formed using an inorganic insulating material.

The opening formed in the insulating layer 124 is formed so that at least part thereof overlaps with the conductive layer 122. For example, the insulating layer 124 is selectively covered with a resist mask, and regions not covered with the resist mask are etched to form the openings. Although the openings can be formed by a wet etching method, it is preferable to employ a dry etching method. Further, after the openings are formed by dry etching, wet etching may be performed to remove a reaction product or the like. After formation of the openings, the resist mask is removed. Alternatively, ablation is utilized, so that the openings may be directly formed by irradiating the insulating layer 124 with a laser beam selectively.

Note that the openings are formed in the insulating layer 124 so that the conductive layers 122 are exposed at the bottom of the openings. Parts of the conductive layers 122 are etched in some cases, but the conductive layers 122 are made to remain at least at the bottom of the openings. Preferably, the openings are formed so as to reach regions where the conductive layers 122 do not overlap with the semiconductor layer 104. With such a structure, when the openings in which the conductive layers 126 are formed are formed in the insulating layer 124, the semiconductor layer (particularly the high-concentration impurity regions serving as source and drain regions) around the openings can be prevented from being removed. Therefore, yield in the manufacturing process can be improved.

The conductive layers 126 which forms source and drain electrodes are formed by a CVD method or a sputtering method using a conductive material such as a metal element, e.g., aluminum (Al), tungsten (W), titanium (Ti), tantalum (Ta), molybdenum (Mo), nickel (Ni), platinum (Pt), copper (Cu), gold (Au), silver (Ag), manganese (Mn), or neodymium (Nd), or an alloy material or a compound material containing any of the above metal elements, to have a single layer structure or a stacked-layer structure. As examples of an alloy material containing aluminum, an alloy material containing aluminum as its main component and nickel and an alloy material containing aluminum as its main component, nickel, and at least one of carbon and silicon can be given. The conductive layers 126 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin film formed of titanium, nitride of titanium, molybdenum, or nitride of molybdenum Aluminum and aluminum silicon which have low resistance and are inexpensive are suitable for forming the conductive layers 126. Further, generation of a hillock of aluminum or aluminum silicon can be prevented when upper and lower barrier layers are provided. The conductive layers 126 are preferably formed to have a thickness of 200 to 1000 nm. When natural oxide films are formed at the bottom of the openings formed in the insulating layer 124, the natural oxide films are removed, and then the conductive layers 126 are formed.

In this embodiment mode, as the conductive layers 126, a stacked-layer structure of a titanium layer with a thickness of 60 nm, a titanium nitride layer with a thickness of 40 nm, an aluminum layer with a thickness of 300 nm, and a titanium layer with a thickness of 100 nm is formed.

The conductive layers 126 are formed in the openings formed in the insulating layer 124. At the bottom of the openings formed in the insulating layer 124, the conductive layers 122 are exposed, and the conductive layers 126 reach the conductive layers 122 exposed. The conductive layers 122 are in contact with the high-concentration impurity regions 110. Therefore, the conductive layers 126 are electrically connected to the high-concentration impurity regions 110 with the conductive layers 122 interposed therebetween. With such a structure, contact between the conductive layers serving as source and drain electrodes and the impurity regions serving as source and drain regions can be favorable. Accordingly, reliability of a semiconductor device completed can be improved.

In this embodiment mode, silicide is formed in the high-concentration impurity regions 110, and the conductive layers 122 are formed to be in contact with the high-concentration impurity regions 110 in which silicide is formed. Therefore, contact resistance between the conductive layers and the semiconductor layer can be reduced. As a result, deterioration of operating characteristics of the semiconductor device due to reduction in on current can be prevented.

Through the above, a thin film transistor can be formed. Note that the structure of the transistor shown in this embodiment mode is only an example and the present invention is not limited to the illustrated structure.

For example, the transistor can have the structure shown in FIG. 13A as described above. In the thin film transistor shown in FIG. 13A, silicide is not formed in the high-concentration impurity regions 150 formed in the semiconductor layer 104. In this transistor, the conductive layers 122, the insulating layer 124, and the conductive layers 126 may be formed by the manufacturing method shown in FIGS. 2A to 5C without forming silicide in the semiconductor layer 104. When silicide is not formed in the semiconductor layer, the sidewall insulating layers that are in contact with the side surfaces of the gate electrode are not required to be provided.

In the structure of the transistor shown in FIG. 13B, the high-concentration impurity regions 180 formed in the semiconductor layer 104 each have a silicide region and a non-silicide region. This transistor can be formed by appropriately selecting the thickness of a metal layer formed, temperature and time of heat treatment, and the like in formation of silicide in the manufacturing method shown in FIGS. 2A to 5C. The conductive layers 122, the insulating layer 124, and the conductive layers 126 can be formed similarly to the above.

By applying the present invention, electrical connection between the conductive layer and the semiconductor layer can be favorable, so that reliability of the semiconductor device can be improved. In addition, since damage to the semiconductor layer in formation of the opening can be prevented, the semiconductor device can be formed with high yield.

This embodiment mode can be combined with other embodiment modes in this specification as appropriate.

Embodiment Mode 2

This embodiment mode will describe an example of a semiconductor device having a different structure from that in the preceding embodiment mode with reference to the drawings. Note that explanation of the same structure as that in Embodiment Mode 1 is simplified or partially omitted.

Figure 6A:
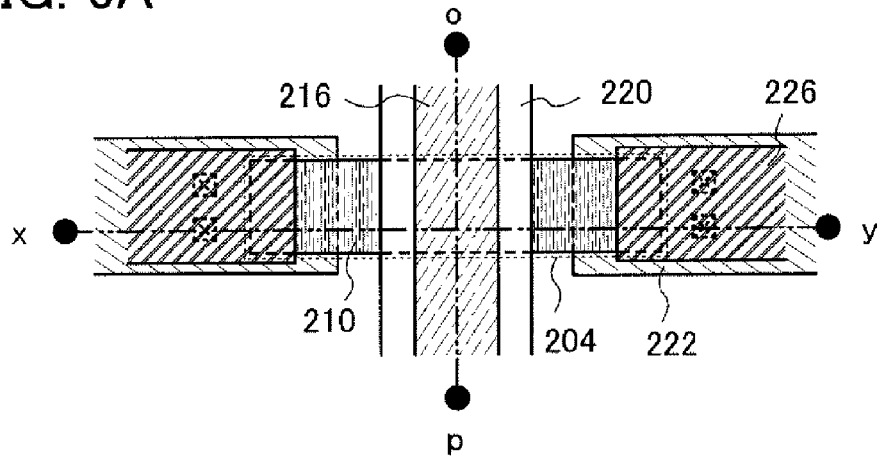
FIGS. 6A to 6C are views showing an example of a main structure of a semiconductor device of the present invention.
Figure 6B:
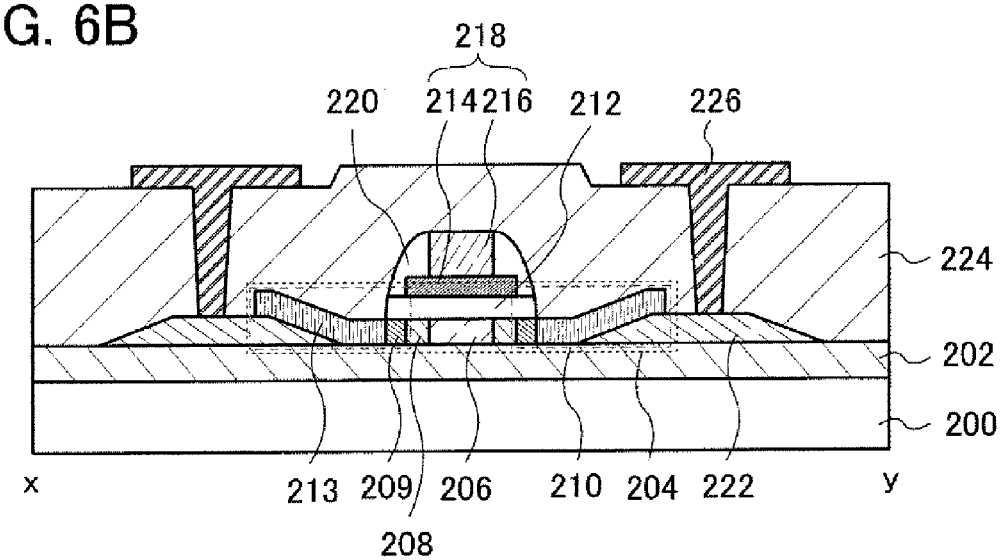
Figure 6C:
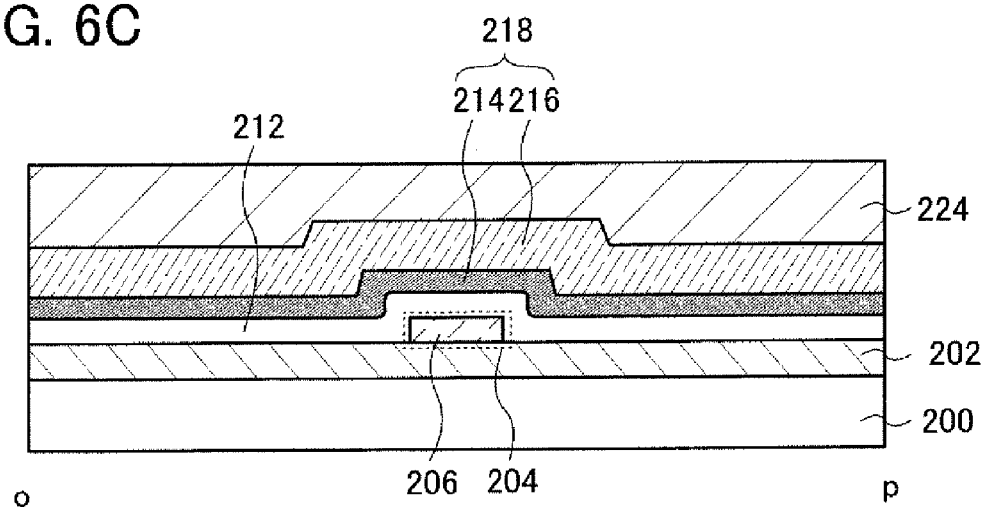

FIG. 6A is a top view and FIGS. 6B and 6C are cross-sectional views for explaining a main structure of a semiconductor device according to this embodiment mode. FIGS. 6A to 6C particularly show a structure of a thin film transistor. FIG. 6A is a top view, FIG. 6B is a cross-sectional view taken along a dashed line x-y in FIG. 6A, and FIG. 6C is a cross-sectional view taken along a dashed line o-p in FIG. 6A. In FIG. 6A, illustration of part of a thin film and the like is omitted. Note that these drawings show only an example and the structure can be changed as appropriate depending on a desired layout.

A semiconductor device shown in FIGS. 6A to 6C includes a thin film transistor provided over a substrate 200 with an insulating layer 202 interposed therebetween. The thin film transistor includes conductive layers 222 provided over the insulating layer 202, an island-shaped semiconductor layer 204 which is provided thereon to be partially in contact with the conductive layers 222, an insulating layer 212 provided over the semiconductor layer 204, a gate electrode 218 including conductive layers 214 and 216 provided over the semiconductor layer 204 with the insulating layer 212 interposed therebetween, and insulating layers 220 provided to be in contact with the side surfaces of the conductive layers 214 and 216. In addition, an insulating layer 224 is provided to cover the semiconductor layer 204, the conductive layer 216, and the like, and openings which reach the conductive layers 222 are formed in the insulating layer 224. Conductive layers 226 are formed in the openings formed in the insulating layer 224, and the conductive layers 226 are in contact with the conductive layers 222 through the openings. The conductive layers 226 and the semiconductor layer 204 are electrically connected to each other with the conductive layers 222 interposed therebetween.

The island-shaped semiconductor layer 204 includes a channel formation region 206, a pair of low-concentration impurity regions 208 serving as LDD regions, and a pair of high-concentration impurity regions 210 serving as source and drain regions.

The conductive layers 222 are provided over the substrate 200 with the insulating layer 202 interposed therebetween. That is, the conductive layers 222 are provided on the side not provided with the gate electrode 218 of the semiconductor layer 204. The conductive layers 222 are partially covered with the high-concentration impurity regions 210 formed in the semiconductor layer 204. End portions of the conductive layers 222 are preferably tapered. For example, the conductive layers 222 are preferably gently tapered at a taper angle of about 20 to 60°. When the end portions of the conductive layers 222 are gently tapered, coverage defects such as disconnection of the semiconductor layer 204 which partially covers the conductive layers 222 can be prevented.

The conductive layers 222 are connected to the conductive layers 226 through the openings formed in the insulating layer 224. At least part of the opening formed in the insulating layer 224 overlaps with the conductive layer 222. The conductive layers 226 serve as source and drain electrodes. Therefore, each of the conductive layers 222 serves as a connecting wiring for electrically connecting the conductive layer 226 serving as a source or drain electrode and the high-concentration impurity region 210 serving as a source or drain region. One feature of the present invention is that a conductive layer serving as a source or drain electrode is not directly in contact with a semiconductor layer to be connected thereto but is connected thereto with a conductive layer serving as a connecting wiring interposed therebetween. With such a structure, favorable contact between the source or drain electrode and the semiconductor layer can be obtained. Therefore, reliability of the semiconductor device can be improved. Although the conductive layer 222 has a region which overlaps with the semiconductor layer 204 and a region which does not overlap with the semiconductor layer 204, the conductive layer 226 may be in contact with either of the regions.

The gate electrode 218 is formed of a stacked-layer structure of the conductive layers 214 and 216. The gate electrode 218 is provided so as to get across the island-shaped semiconductor layer 204. Although the example in which the gate electrode is formed of the two-layer-stacked structure of the conductive layers 214 and 216 and the width of the lower conductive layer 214 is larger than that of the upper conductive layer 216 is described with reference to FIGS. 6A to 6C, the present invention is not limited thereto. For example, the gate electrode may employ a single layer structure or a stacked-layer structure including three or more layers. Further, the side surface of the conductive layer included in the gate electrode may be tapered. Furthermore, the gate electrode may employ a stacked-layer structure including two or more conductive layers in which the taper angles may be different among the layers. When the gate electrode is formed of a stacked-layer structure of conductive layers, the widths (the length in the direction parallel to a direction for carrier flow in a channel formation region (a direction which connects a source region and a drain region)) of the layers may also be almost equal to each other. Further, in this embodiment mode, although the sidewall insulating layers 220 are formed to be in contact with the side surfaces of the conductive layers 214 and 216 included in the gate electrode 218, the present invention is not limited thereto and the sidewall insulating layers 220 may be formed as needed.

In the island-shaped semiconductor layer 204, the channel formation region 206 is positioned between the pair of high-concentration impurity regions 210, and each of the low-concentration impurity regions 208 is positioned between the channel formation region 206 and each of the high-concentration impurity regions 210. That is, the channel formation region 206 is positioned between the pair of high-concentration impurity regions 210 and between the pair of low-concentration impurity regions 208, and is in contact with the pair of low-concentration impurity regions 208. The concentration of an impurity element which imparts one conductivity type added to the high-concentration impurity regions 210 is higher than that of the low-concentration impurity regions 208. By provision of each of the low-concentration impurity regions 208 between the channel formation region 206 and each of the high-concentration impurity regions 210 in the semiconductor layer 204, an electric field in the periphery of the drain region can be eased, and therefore, occurrence of a hot carrier can be suppressed. Occurrence of a hot carrier causes fluctuation of the threshold voltage, which may drastically reduce operating characteristics or reliability. In particular, if an element is miniaturized, i.e., the channel length (the length in the direction parallel to a direction for carrier flow in a channel formation region (a direction which connects a source region and a drain region)) is decreased, the problem of generating a high electric field in the periphery of the drain region becomes prominent, and therefore, formation of the low-concentration impurity regions which serve as LDD regions is very effective.

The thickness of the semiconductor layer 204 is 5 to 150 nm, preferably, 10 to 25 nm. In this embodiment mode, the thickness of the semiconductor layer 204 is 20 nm.

Further, the end portion of the semiconductor layer 204 may be tapered. For example, the end portion may be tapered at a taper angle of greater than or equal to 45° and less than 95°, preferably, at a taper angle of greater than or equal to 60° and less than 95°, or may be gently tapered at a taper angle of less than 45°. Note that the taper angle refers to an inclination angle formed by the side surface of a layer which is tapered and the bottom surface thereof. In this embodiment mode, the end portion is tapered at a taper angle of nearly 90°.

The channel formation region 206 is formed in a region of the semiconductor layer 204 which overlaps with the conductive layer 216 included in the gate electrode 218. The high-concentration impurity region 210 is formed in a region of the semiconductor layer 204 which does not overlap with the conductive layers 214 and 216 included in the gate electrode 218. The low-concentration impurity region 208 is formed in a region of the semiconductor layer 204 which overlaps with the conductive layer 214 included in the gate electrode 218. In other words, in the semiconductor layer 204, the channel formation region 206 is formed in a region which overlaps with the conductive layer 216 included in the gate electrode 218, and the low-concentration impurity regions 208 and the high-concentration impurity regions 210 are formed outside the region which overlaps with the conductive layer 216 included in the gate electrode 218.

An impurity element which imparts one conductivity type may be added to the channel formation region 206 to control the threshold voltage of the transistor. Although this embodiment mode shows an example in which the low-concentration impurity regions serving as LDD regions are formed in the semiconductor layer 204, the present invention is not limited thereto, and the LDD regions are not required to be formed. When the LDD regions are not formed, the semiconductor layer may have a structure in which the channel formation region is provided to be in contact with and between a pair of the impurity regions serving as source and drain regions. When the gate electrode has a stacked-layer structure in which the width of the lower conductive layer is made larger as shown in FIGS. 6A to 6C, the channel formation region may be formed so as to roughly overlap with the upper conductive layer with a smaller width, and the impurity regions serving as source and drain regions may be formed in regions which do not overlap with the upper conductive layer; alternatively, the channel formation region may be formed in a region which roughly overlaps with the lower conductive layer, and the impurity regions serving as source and drain regions may be formed in regions which do not overlap with the lower conductive layer. Further, when the gate electrode has a single layer structure or a stacked-layer structure in which the width of each conductive layer is almost the same, the channel formation region may be formed so as to roughly overlap with the gate electrode, and the impurity regions serving as source and drain regions may be formed in regions which do not overlap with the gate electrode. The LDD regions may be formed in the semiconductor layer in regions which overlap with the sidewall insulating layers and do not overlap with the gate electrode, or in regions which partially overlap with the gate electrode.

The high-concentration impurity region 210 has a region 213 in which silicide is formed (hereinafter also referred to as a silicide region 213) and a region 209 in which silicide is not formed (hereinafter also referred to as a non-silicide region 209). The non-silicide region 209 is placed in a region which roughly overlaps with the sidewall insulating layer 220. Silicide is formed in the entire silicide region 213. When silicide is formed at least in a region of the high-concentration impurity region 210 which is in contact with the conductive layer 222, contact resistance can be reduced. Therefore, it is possible to prevent signal delay and achieve low power consumption of the semiconductor device completed. In addition, when silicide is formed in the impurity regions serving as source and drain regions, the impurity regions can have low resistance. As a result, reduction in on current can be suppressed, and deterioration in operating characteristics can be prevented.

Although FIGS. 6A to 6C show an example in which silicide is entirely formed in the region of the high-concentration impurity region 210 which does not overlap with the sidewall insulating layer 220, the present invention is not limited thereto. Silicide is not required to be formed in the high-concentration impurity region, or silicide may be formed only in part of an upper surface thereof.

Between the semiconductor layer 204 and the gate electrode 218 (the conductive layer 214), the insulating layer 212 is formed. The insulating layer 212 serves as a gate insulating layer, and its thickness is 1 to 110 nm, preferably 2 to 20 nm. When the gate insulating layer is thinned, the transistor can be operated at low voltage with high speed, which is preferable. In this embodiment mode, the insulating layer 212 is formed to have a thickness of 20 nm.

Next, an example of a method for manufacturing the semiconductor device shown in FIGS. 6A to 6C will be described with reference to the drawings.

Figure 7A:
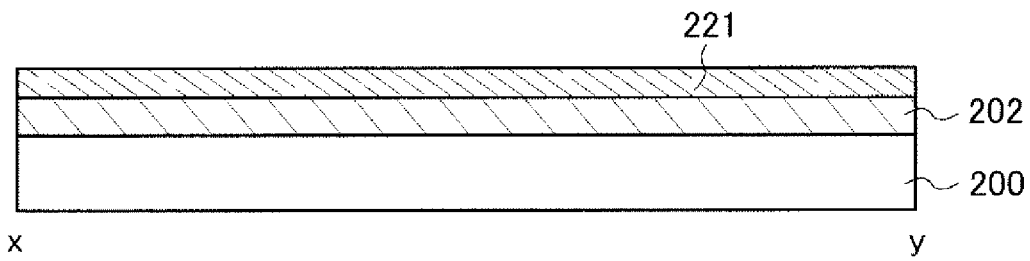
FIGS. 7A to 7D are views showing an example of a manufacturing method of a semiconductor device of the present invention.

A conductive layer 221 is formed over the substrate 200 with the insulating layer 202 interposed therebetween (FIG. 7A). The substrate 200 and the insulating layer 202 are formed based on the description of the substrate 100 and the insulating layer 102 in Embodiment Mode 1 and thus the description thereof is omitted.

The conductive layer 221 is formed of a single layer structure or a stacked-layer structure using a conductive material by a CVD method or a sputtering method. As the conductive material, a metal element such as titanium (Ti), tantalum (Ta), tungsten (W), or molybdenum (Mo), or an alloy material or a compound material containing any of the above metal elements can be used. Preferably, a conductive material whose melting point is greater than or equal to 1500° C. and resistance is low is used. The conductive layer 221 is formed to have a thickness of 10 to 200 nm. In this embodiment mode, a tungsten layer with a thickness of 50 nm is formed for the conductive layer 221.

Figure 7B:
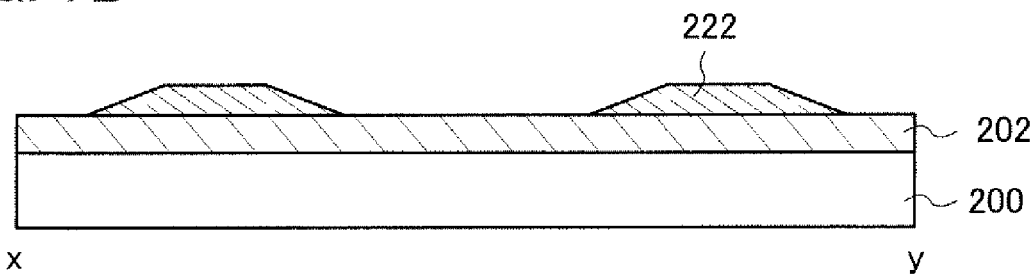

Next, the conductive layer 221 is selectively etched, so that the conductive layers 222 having a desired shape are formed (FIG. 7B).

The conductive layer 222 can be processed into a desired shape by covering the conductive layer 221 formed over the entire surface of the substrate with a resist mask selectively and etching the conductive layer 221 not covered with the resist mask. The conductive layer 221 may be etched by a dry etching method or a wet etching method. An etching gas or an etchant which has high etching selectivity of the conductive layer 222 (the conductive layer 221) with respect to the insulating layer 202 is used. In other words, an etching gas or an etchant which has a high etching rate with respect to the conductive layer 222 (the conductive layer 221) and a low etching rate with respect to the insulating layer 202 may be used. Preferably, a dry etching method is performed so that each of the end portions of the conductive layer 222 is tapered.

Figure 7C:
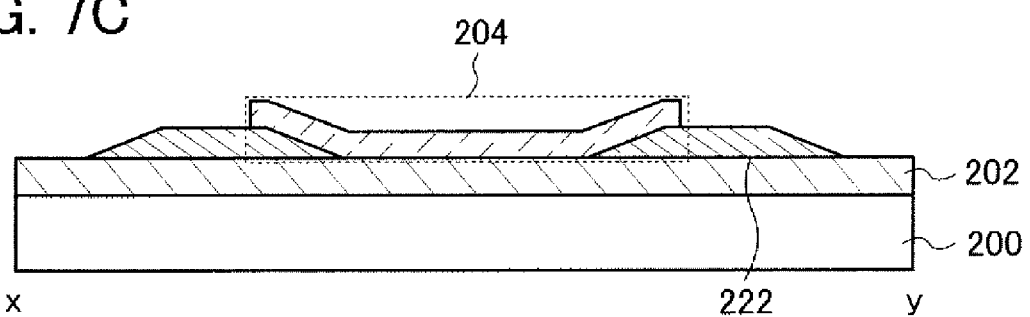

Next, the island-shaped semiconductor layer 204 is formed so as to cover the insulating layer 202 and the conductive layers 222 partially (FIG. 7C).

For the semiconductor layer 204, a single crystalline semiconductor or a crystalline semiconductor is preferably used. The semiconductor layer 204 is formed to have a thickness of 5 to 150 nm, preferably, 10 to 25 nm. The detailed description of crystallization and the like of the semiconductor layer is based on the description of the semiconductor layer 104 shown in Embodiment Mode 1. It is preferable to use laser crystallization using a CW laser or a pulsed laser with a repetition rate of greater than or equal to 10 MHz since crystal grains which are elongated in one direction can be formed.

The island-shaped semiconductor layer 204 can be formed as follows: a semiconductor layer formed over the insulating layer 202 to cover the conductive layers 222 by a CVD method or a sputtering method is crystallized and then selectively etched. The island-shaped semiconductor layer 204 is formed so as to cover parts of the conductive layers 222, e.g., the end portions of the conductive layers 222. When the end portions of the conductive layers 222 are gently tapered, disconnection of the semiconductor layer 204 provided thereover can be prevented. When the thickness of the semiconductor layer 204 is made to be less than or equal to 50 nm, the semiconductor layer may be thinned by etching after being formed to be greater than or equal to 50 nm thick. For the semiconductor layer, a single crystalline semiconductor layer of an SOI substrate may also be used. In that case, thin film process such as crystallization can be omitted.

In this embodiment mode, a crystalline silicon layer with a thickness of 20 nm is formed for the semiconductor layer 204.

Figure 7D:
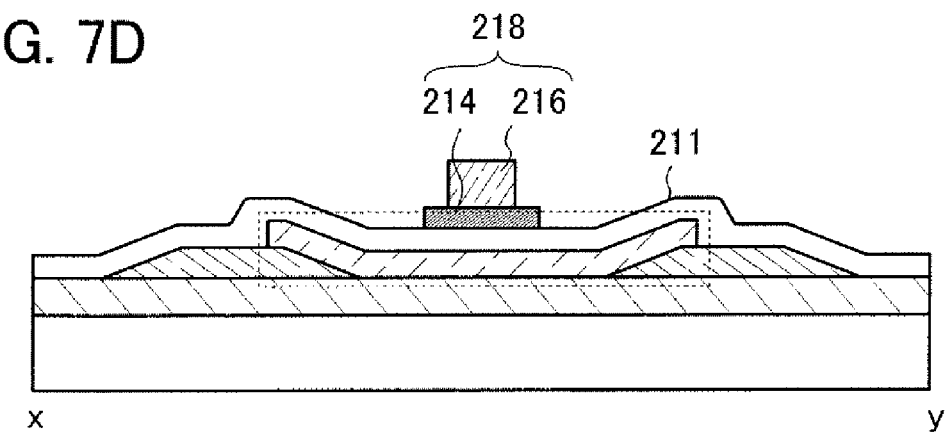

Next, after an insulating layer 211 is formed over the semiconductor layer 204, the gate electrode 218 is formed over the insulating layer 211 (FIG. 7D). The gate electrode 218 is formed of a stacked-layer structure of the conductive layers 214 and 216 in which the width of the conductive layer 214 in the lower layer is made larger than that of the conductive layer 216 in the upper layer.

The insulating layer 211 is formed by a CVD method, a sputtering method, an ALD method, high-density plasma treatment, or the like, using silicon oxide, silicon nitride, silicon oxynitride, silicon nitride oxide, aluminum nitride, and/or the like to have a single layer structure or stacked-layer structure. The insulating layer 211 may be formed similarly to the insulating layer 111 shown in Embodiment Mode 1 and thus the detailed description thereof is omitted. The insulating layer 211 is formed to have a thickness of 1 to 110 nm, preferably 2 to 20 nm. Part of the insulating layer 211 serves as a gate insulating layer of a thin film transistor completed later. In this embodiment mode, the insulating layer 211 is formed of a silicon oxynitride layer with a thickness of 20 nm.

The conductive layers 214 and 216 can be each formed as follows: a conductive layer is formed over the entire surface of the substrate using a conductive material by a CVD method or a sputtering method and then selectively etched into a desired shape. As the conductive material, a metal element such as tantalum (Ta), tungsten (W), titanium (Ti), molybdenum (Mo), chromium (Cr), aluminum (Al), copper (Cu), or niobium (M); or an alloy material or a compound material containing any of the metal elements can be used. Further, a semiconductor material typified by polycrystalline silicon to which an impurity element which imparts one conductivity type such as phosphorus is added can also be used. Although the example in which a stacked-layer structure including the conductive layers 214 and 216 is formed is shown, the conductive layer formed over the insulating layer 211 may have a single layer structure. Further, the example in which the width of the conductive layer 214 in the lower layer is made larger than that of the conductive layer 216 in the upper layer is shown; however, the both upper and lower layers may have roughly the same width. In this embodiment mode, the lower conductive layer with a larger width serves as a doping mask when the LDD regions are formed later. The conductive layer (the stacked-layer structure including the conductive layers 214 and 216) is formed to have a thickness in the range of 50 to 1000 nm, preferably 100 to 800 nm, and more preferably 200 to 500 nm.

Figure 8A:
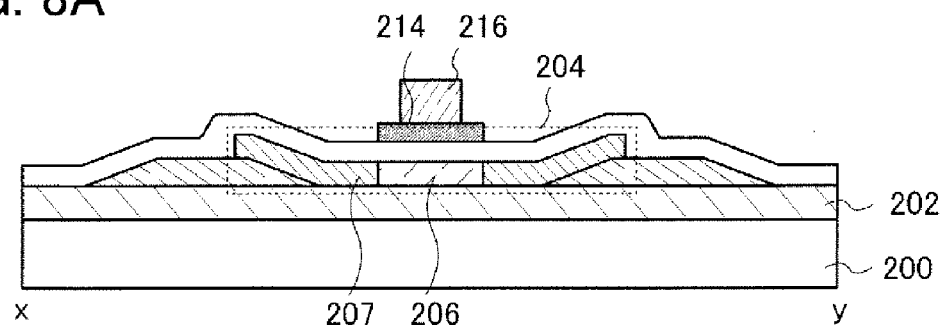
FIGS. 8A to 8D are views showing an example of a manufacturing method of a semiconductor device of the present invention.

Next, an impurity element which imparts one conductivity type is selectively added to the semiconductor layer 204 at a first concentration, whereby a pair of low-concentration impurity regions 207 and the channel formation region 206 are formed (FIG. 8A). Here, the impurity element is added with the conductive layer 216 as a mask, so that the pair of low-concentration impurity regions 207 and the channel formation region 206 positioned between the pair of low-concentration impurity regions 207 are formed in a self-aligned manner. The end portions of the channel formation region 206 and the end portions of the conductive layer 216 are roughly in alignment. Parts of the low-concentration impurity regions 207 formed at this time form LDD regions later. As the impurity element which imparts one conductivity type, an element which imparts p-type conductivity such as boron (B), aluminum (Al), or gallium (Ga) or an element which imparts n-type conductivity such as phosphorus (P) or arsenic (As) can be used. In this embodiment mode, as the impurity element, phosphorus that is an element which imparts n-type conductivity is added to be contained at a peak concentration of about $1\times10^{18}$ cm$^{-3}$.

Figure 8B:
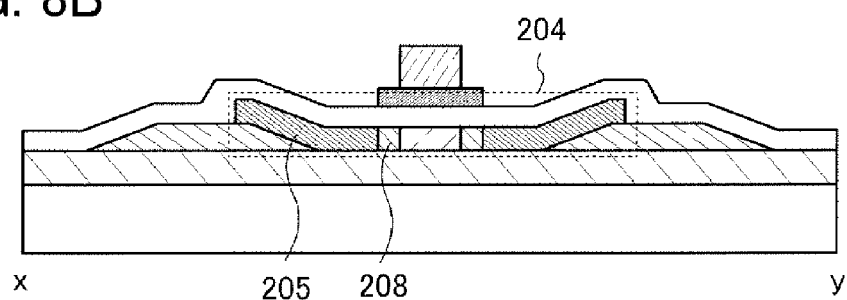

Next, an impurity element which imparts one conductivity type is selectively added to the semiconductor layer 204 at a second concentration, whereby a pair of high-concentration impurity regions 205 and the pair of low-concentration impurity regions 208 are formed (FIG. 8B). Here, the impurity element is added with the conductive layer 214 as a mask, so that the pair of high-concentration impurity regions 205 and the pair of low-concentration impurity regions 208 are formed in a self-aligned manner. The high-concentration impurity regions 205 formed at this time serve as source and drain regions, and the low-concentration impurity regions 208 serve as LDD regions. As the impurity element which imparts one conductivity type, an impurity element which imparts the same conductivity type as the element which is added for forming the above-described low-concentration impurity regions 207 can be used. Note that, when the impurity element is added, the second concentration is set to be higher than the first concentration. Therefore, the concentration of the impurity element in the high-concentration impurity regions 205 is higher than that of the low-concentration impurity regions 208. In this embodiment mode, as the impurity element, phosphorus that is an element which imparts n-type conductivity is added to be contained at a peak concentration of about $1\times10^{21}$ cm$^{-3}$.

Further, in order to control the threshold voltage of a transistor, an impurity element which imparts one conductivity type may be added to the channel formation region 206. By addition of the impurity element at a certain concentration to the channel formation region 206, the threshold voltage of a transistor can be shifted forcibly to a desired threshold voltage. As the impurity element which imparts one conductivity type, an element which imparts p-type conductivity such as boron (B), aluminum (Al), or gallium (Ga) or an element which imparts n-type conductivity such as phosphorus (P) or arsenic (As) can be used. The element which imparts p-type conductivity can be used in this embodiment mode, and for example, boron can be added so as to be contained at concentrations of about $1\times10^{16}$ to $1\times10^{18}$ cm$^{-3}$, inclusive. Note that addition of the impurity element to the channel formation region 206 may be performed before the gate electrode 218 is formed.

Further, after the impurity element which imparts one conductivity type is added to the semiconductor layer 204, heat treatment is preferably performed to activate the impurity element added. The heat treatment can be performed by laser beam irradiation, RTA, or using an annealing furnace. Specifically, the heat treatment may be performed at temperatures of 400 to 700° C., preferably 500 to 650° C. Further, the heat treatment is preferably performed in a nitrogen atmosphere. For example, activation can be performed by heating at 550° C. for 4 hours.

Figure 8C:
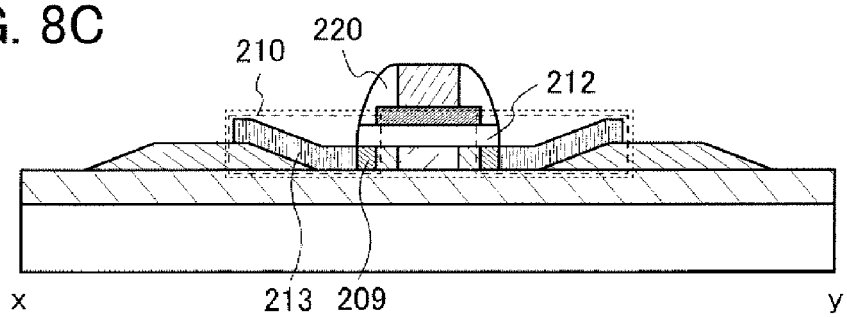

Next, the sidewall insulating layers 220 which are in contact with the side surfaces of the conductive layers 214 and 216 are formed (FIG. 8C).

The sidewall insulating layers 220 are formed as follows: an insulating layer is formed so that a stacked-layer structure of the conductive layers 214 and 216 is embedded therein, and the insulating layer is selectively etched by anisotropic etching mainly in a perpendicular direction. Specifically, an insulating layer with a single layer structure or a stacked-layer structure is formed using an inorganic material such as silicon oxide, silicon nitride, silicon oxynitride, or silicon nitride oxide, or an organic material such as an organic resin by a CVD method or a sputtering method, and the insulating layer is selectively etched. The sidewall insulating layer 220 can be used as a mask for forming silicide when a silicide region is formed.

Here, an example is shown in which the surfaces of the sidewall insulating layers 220 which are not in contact with the side surfaces of the conductive layers 214 and 216 are curved. Although the shape of the sidewall insulating layers 220 is not particularly limited but the sidewall insulating layers 220 entirely cover at least the side surfaces of the conductive layers 214 and 216 included in the gate electrode 218. Here, the insulating layer 211 in the lower layer is also etched when the sidewall insulating layer 220 is formed, and part of the semiconductor layer 204 is selectively exposed. Specifically, the high-concentration impurity regions 205 in regions which do not overlap with the sidewall insulating layers 220 are exposed. Note that an upper portion of each of the high-concentration impurity regions 205 is also etched depending on etching conditions and reduced in thickness (referred to as film reduction) in some cases.

Next, a metal layer is formed over the semiconductor layer 204 which is exposed, and then, the high-concentration impurity regions 210 in which silicide is partially formed by heat treatment are formed (FIG. 8C). The high-concentration impurity regions 210 each have the silicide region 213 and the non-silicide region 209.

Silicide can be formed in the high-concentration impurity regions 210 by heat treatment after the metal layer is formed to be in contact with at least the semiconductor layer 204 exposed. The metal layer is formed using a material which reacts with the semiconductor layer and becomes silicide, such as a metal element, e.g., nickel, titanium, cobalt, or platinum, or an alloy material containing any of the above metal elements by a sputtering method, an evaporation method, a plating method, or the like. Note that in formation of the metal layer, when a natural oxide film is formed on the semiconductor layer exposed, the natural oxide film is removed, and then the metal layer is formed. In this embodiment mode, a nickel layer with a thickness of 10 nm is formed as the metal layer.

Heat treatment can be performed using RTA or an annealing furnace. Specifically, heat treatment may be performed at temperatures in the range of 300 to 700° C. for 10 seconds to 1 hour, preferably 20 seconds to 30 minutes. By heat treatment, reaction occurs in a region where the semiconductor layer 204 and the metal layer are in contact with each other, and silicide is formed in part of the semiconductor layer 204 in this region, so that the silicide region 213 is formed. In the high-concentration impurity region 210, a region which does not overlap with the sidewall insulating layer 220 is to be the silicide region 213 in which silicide is entirely formed from the upper surface to the bottom surface and a region which overlaps with the sidewall insulating layer 220 is to be the non-silicide region 209 in which silicide is not formed. In this embodiment mode, heat treatment is performed at 500° C. for 30 seconds, so that the high-concentration impurity region 210 including the nickel silicide region 213 and the non-silicide region 209 is formed.

The shape, thickness, and the like of the silicide region can be selected by appropriately controlling the thickness of the metal layer to be reacted, temperature of heat treatment, time of heat treatment, and the like. FIGS. 6A to 6C (FIG. 8C) show an example in which silicide is entirely formed in a region of the high-concentration impurity region 210 which does not overlap with the sidewall insulating layer 220. However, the present invention is not limited thereto, and a structure in which silicide is not formed may be employed. In addition, an example in which silicide is not formed in a region of the high concentration impurity region 210 which overlaps with the sidewall insulating layer 220 is shown; however, silicide may be formed in the entire high-concentration impurity region 210 (note that silicide is prevented from being formed in the channel formation region 206). Although silicide may be formed on only the upper surface side of the high-concentration impurity region 210 to lower resistance of the source or drain region, silicide is preferably formed in a region which is in contact with the conductive layer 222 in order to lower contact resistance as well. After formation of silicide, the metal layer which has not reacted is removed by wet etching or dry etching.

Through the above, the channel formation region 206, the pair of low-concentration impurity regions 208, and the pair of high-concentration impurity regions 210 are formed in the semiconductor layer 204. The channel formation region 206 is provided between the pair of high-concentration impurity regions 210, and each of the pair of low-concentration impurity regions 208 is formed to be in contact with and between each of the pair of high-concentration impurity regions 210 and the channel formation region 206. The channel formation region 206 is provided in a region where the semiconductor layer 204 overlaps with the conductive layer 216. The low-concentration impurity region 208 is formed in a region where the semiconductor layer 204 overlaps with the conductive layer 214 and does not overlap with the conductive layer 216. The high-concentration impurity region 210 is formed in a region where the semiconductor layer 204 does not overlap with the gate electrode 218. The high-concentration impurity region 210 has the silicide region 213 and the non-silicide region 209. The silicide region 213 is positioned in a region which does not overlap with the gate electrode 218 and the sidewall insulating layer 220, and the non-silicide region 209 is positioned in a region which overlaps with the sidewall insulating layer 220 and does not overlap with the gate electrode 218.

Figure 8D:
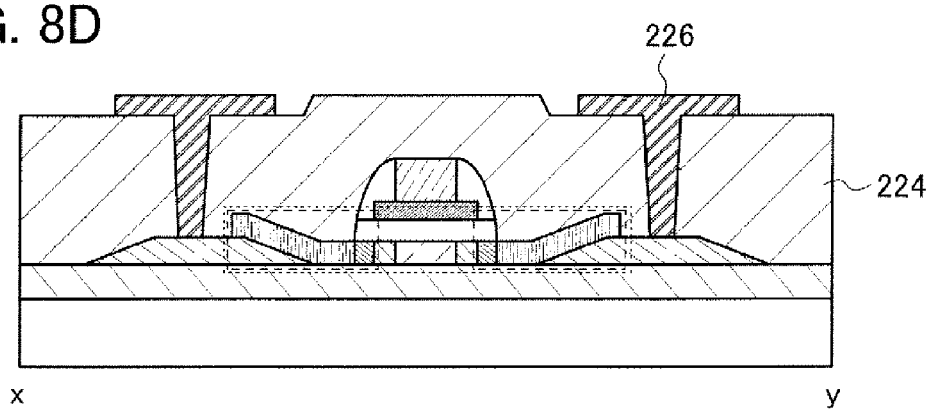

Next, the insulating layer 224 is formed so as to cover the insulating layer, conductive layer, and the like provided over the substrate 200. Then, after the openings which reach the conductive layers 222 are formed in the insulating layer 224, the conductive layers 226 are formed in the openings and over the insulating layer 224 (FIG. 8D).

The conductive layers 226 serve as source and drain electrodes. The conductive layers 226 reach the conductive layers 222 through the openings formed in the insulating layer 224. The conductive layers 222 are in contact with the high-concentration impurity regions 210. Therefore, the conductive layer 226 serving as a source or drain electrode is electrically connected to the high-concentration impurity region 210 serving as a source or drain region with the conductive layer 222 serving as a connecting wiring interposed therebetween.

The insulating layer 224 is formed by a CVD method, a sputtering method, an ALD method, or a coating method, or by combination of insulating layers formed by these methods to have a single layer structure or a stacked-layer structure. For example, the insulating layer 224 is formed using an inorganic insulating material such as silicon oxide, silicon nitride, silicon oxynitride, or silicon nitride oxide; or an insulating material containing carbon such as DLC (diamond-like carbon) by a CVD method, a sputtering method, or an ALD method. Further, the insulating layer 224 can be formed using an organic insulating material such as epoxy, polyimide, polyamide, polyvinyl phenol, benzocyclobutene, or acrylic; or a siloxane material such as a siloxane resin by a coating method. Note that the siloxane material corresponds to a material having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Further, the insulating layer 224 may also be formed by forming an insulating layer by a CVD method, a sputtering method, an ALD method, or the like and then performing high-density plasma treatment thereto in an oxygen atmosphere or a nitrogen atmosphere. Although the insulating layer 224 of a single layer structure is formed over the gate electrode 218 and the like here, a stacked-layer structure including two or more layers may be employed. When the insulating layer has a stacked-layer structure, the insulating layer in a lower layer (on the side in contact with the gate electrode and the like) is preferably formed using an inorganic insulating material.

The conductive layers 226 which form source and drain electrodes are formed by a CVD method or a sputtering method using a conductive material such as a metal element, e.g., aluminum (Al), tungsten (W), titanium (Ti), tantalum (Ta), molybdenum (Mo), nickel (Ni), platinum (Pt), copper (Cu), gold (Au), silver (Ag), manganese (Mg), or neodymium (Nd), or an alloy material or a compound material containing any of the above metal elements, to have a single layer structure or a stacked-layer structure. As examples of an alloy material containing aluminum, an alloy material containing aluminum as its main component and nickel and an alloy material containing aluminum as its main component, nickel, and at least one of carbon and silicon can be given. The conductive layer 226 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin film formed of titanium, nitride of titanium, molybdenum, or nitride of molybdenum. Aluminum and aluminum silicon which have low resistance and are inexpensive are suitable for forming the conductive layers 226. Further, generation of a hillock of aluminum or aluminum silicon can be prevented when upper and lower barrier layers are provided. The conductive layer 226 is formed to have a thickness of 50 to 1000 nm, preferably, 100 to 800 nm, more preferably, 200 to 500 nm. Note that when a natural oxide film is formed at the bottom of the opening formed in the insulating layer 224, the natural oxide film is removed, and then the conductive layer 226 is formed.

The opening formed in the insulating layer 224 is formed so that at least part thereof overlaps with the conductive layer 222. For example, the insulating layer 224 is selectively covered with a resist mask, and regions not covered with the resist mask are etched to form the openings. Although the openings can be formed by a wet etching method, it is preferable to use a dry etching method because fine processing is easily performed. Further, after the openings are formed by dry etching, wet etching may be performed to remove a reaction product or the like. After formation of the openings, the resist mask is removed. Alternatively, ablation is utilized, so that the openings may be directly formed by irradiating the insulating layer 224 with a laser beam selectively.

Note that the opening is formed in the insulating layer 224 so that the conductive layer 222 is exposed at the bottom of the opening. Part of the conductive layer 222 is etched in some cases, but the conductive layer 222 is made to remain at least at the bottom of the opening. The conductive layer 226 is formed in the opening formed in the insulating layer 224. The conductive layer 222 is in contact with the conductive layer 226 through the opening. In addition, the conductive layer 222 is in contact with the high-concentration impurity region 210. Therefore, the conductive layer 226 is electrically connected to the high-concentration impurity region 210 with the conductive layer 222 interposed therebetween. Also when the semiconductor layer has such a thickness that part thereof is removed by etching in forming the opening in the insulating layer 224, with such a structure, contact between the conductive layer and the semiconductor layer can be favorable with the conductive layer 222. Accordingly, reliability of the semiconductor device completed can be improved. In addition, it is preferable to form the opening so as to reach a region where the conductive layer 222 does not overlap with the semiconductor layer 204. With such a structure, the semiconductor layer can be prevented from being removed.

In this embodiment mode, the high-concentration impurity region 210 has a region in which silicide is formed, and the conductive layer 222 is in contact with the region in which silicide is formed (the silicide region 213). Therefore, contact resistance between the conductive layer and the semiconductor layer can be reduced. As a result, deterioration of operating characteristics of the semiconductor device due to reduction in on current can be prevented.

By applying the present invention, electrical connection between the conductive layer and the semiconductor layer can be favorable, so that reliability of the semiconductor device can be improved. In addition, since the semiconductor layer is formed over the conductive layer serving as a connection wiring, damage to the semiconductor layer due to etching or the like can be prevented.

This embodiment mode can be combined with other embodiment modes in this specification as appropriate.

Embodiment Mode 3

This embodiment mode will describe an example of a semiconductor device having a different structure from that in the preceding embodiment modes with reference to the drawings. Specifically, in this example, in the structure of Embodiment Mode 2, an insulating layer is provided between the conductive layer serving as a connection wiring and the semiconductor layer, and the conductive layer serving as a connection wiring and the semiconductor layer are in contact with and connected to each other through an opening formed in the insulating layer. Note that explanation of the same structure as that in Embodiment Modes 1 and 2 is simplified or partially omitted.

Figure 9A:
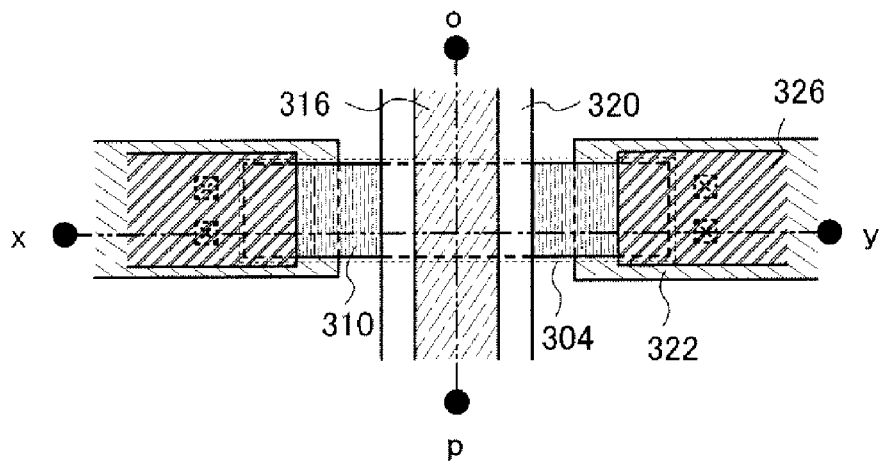
FIGS. 9A to 9C are views showing an example of a main structure of a semiconductor device of the present invention.
Figure 9B:
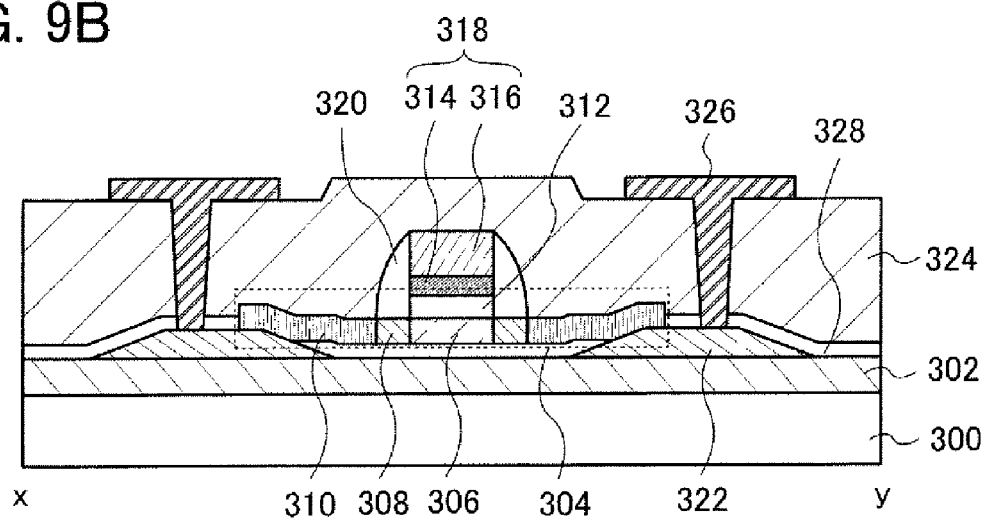
Figure 9C:
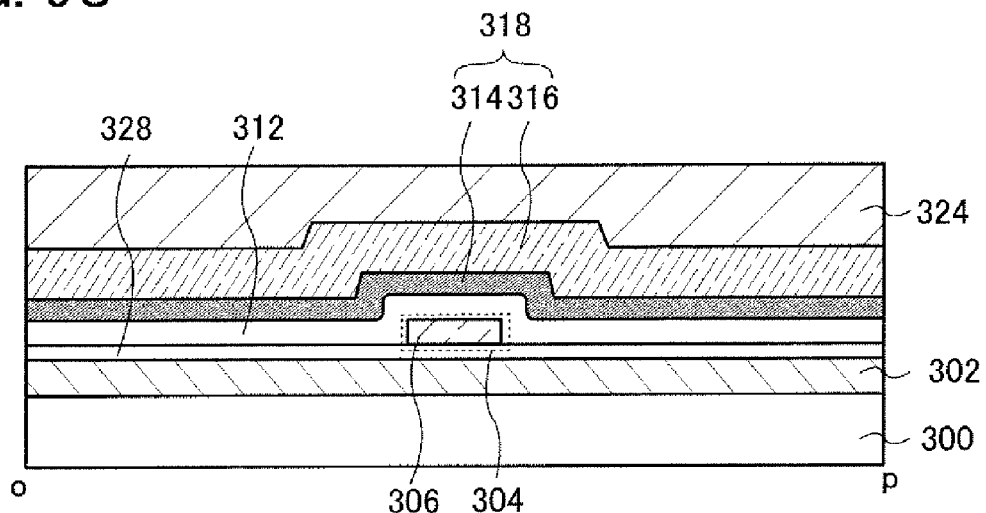

FIG. 9A is a top view and FIGS. 9B and 9C are cross-sectional views for explaining a main structure of a semiconductor device according to this embodiment mode. FIGS. 9A to 9C particularly show a structure of a thin film transistor. FIG. 9A is a top view, FIG. 9B is a cross-sectional view taken along a dashed line x-y in FIG. 9A, and FIG. 9C is a cross-sectional view taken along a dashed line o-p in FIG. 9A. In FIG. 9A, illustration of part of a thin film and the like is omitted. Note that these drawings show only an example and the structure can be changed as appropriate depending on a desired layout.

A semiconductor device shown in FIGS. 9A to 9C includes a thin film transistor provided over a substrate 300 with an insulating layer 302 interposed therebetween. The thin film transistor includes conductive layers 322 provided over the insulating layer 302, an insulating layer 328 provided over the insulating layer 302 and the conductive layers 322, an island-shaped semiconductor layer 304 which is partially in contact with the conductive layers 322 through openings provided in the insulating layer 328, an insulating layer 312 provided over the semiconductor layer 304, conductive layers 314 and 316 provided over the semiconductor layer 304 with the insulating layer 312 interposed therebetween, and insulating layers 320 provided to be in contact with the side surfaces of the conductive layers 314 and 316. The pair of conductive layers 322 are provided to be in contact with the semiconductor layer 304, and the pair of conductive layers 322 are in contact with a pair of impurity regions 310 included in the semiconductor layer 304. The insulating layer 328 is provided between the pair of conductive layers 322, and the semiconductor layer 304 is provided over the insulating layer 328. The semiconductor layer 304 and the conductive layers 322 are insulated with the insulating layer 328 except regions where the semiconductor layer 304 and the conductive layers 322 are in contact with each other through the openings. In addition, an insulating layer 324 is provided to cover the semiconductor layer 304, the conductive layer 316, and the like, and openings which reach the conductive layers 322 are formed in the insulating layers 324 and 328. Conductive layers 326 are formed in the openings formed in the insulating layers 324 and 328, and the conductive layers 326 are in contact with the conductive layers 322 through the openings. The conductive layer 326 and the semiconductor layer 304 are electrically connected to each other with the conductive layer 322 interposed therebetween.

Next, an example of a method for manufacturing the semiconductor device shown in FIGS. 9A to 9C will be described with reference to the drawings.

Figure 10A:
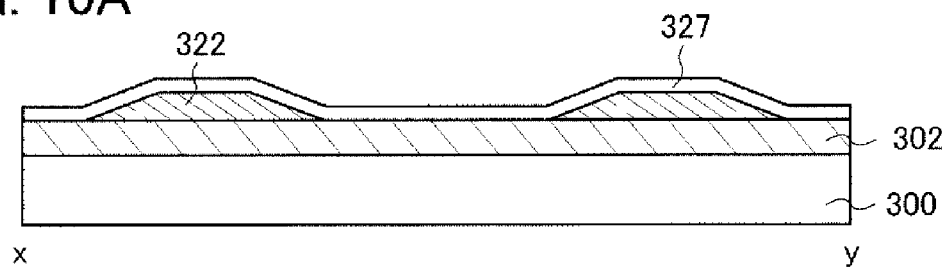
FIGS. 10A to 10D are views showing an example of a manufacturing method of a semiconductor device of the present invention.

The conductive layers 322 are formed by the steps of forming a conductive layer over the entire surface of the substrate 300 with the insulating layer 302 interposed therebetween and etching the conductive layer selectively into a desired shape. Next, an insulating layer 327 is formed so as to cover the insulating layer 302 and the conductive layers 322 (FIG. 10A). The substrate 300, the insulating layer 302, and the conductive layers 322 are formed based on the description of the substrate 200, the insulating layer 202, and the conductive layers 222 in Embodiment Mode 2 and thus the description thereof is omitted.

The insulating layer 327 is formed by a CVD method, a sputtering method, an ALD method, or the like using an inorganic insulating material such as silicon oxide, silicon nitride, silicon oxynitride, or silicon nitride oxide, or an insulating material containing carbon such as DLC (diamond-like carbon). The insulating layer 327 is formed to have a thickness of 1 to 200 nm. When the end portions of the conductive layers 322 are gently tapered, coverage defects of the conductive layer 327 provided thereover can be prevented. In this embodiment mode, the insulating layer 327 is formed of a silicon oxynitride layer with a thickness of 100 nm.

Figure 10B:
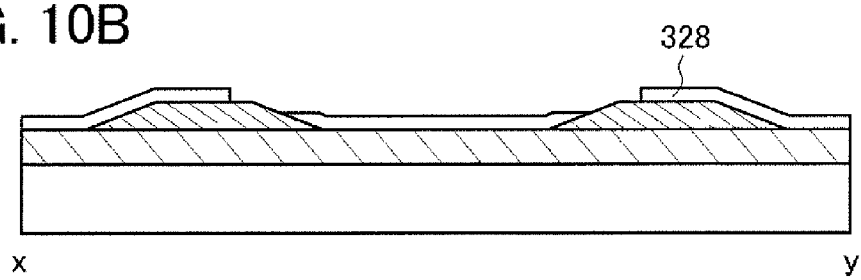

Next, the insulating layer 327 is selectively etched to expose the conductive layers 322 partially, so that the insulating layer 328 is formed (FIG. 10B).

For example, the insulating layer 327 is selectively covered with a resist mask, and regions not covered with the resist mask are etched, so that the insulating layer 328 which partially exposes the conductive layers 322 can be formed. The etching may be performed by either a dry etching method or a wet etching method. Alternatively, ablation is utilized, so that the openings may be directly formed by irradiating the insulating layer 327 with a laser beam selectively.

Figure 10C:
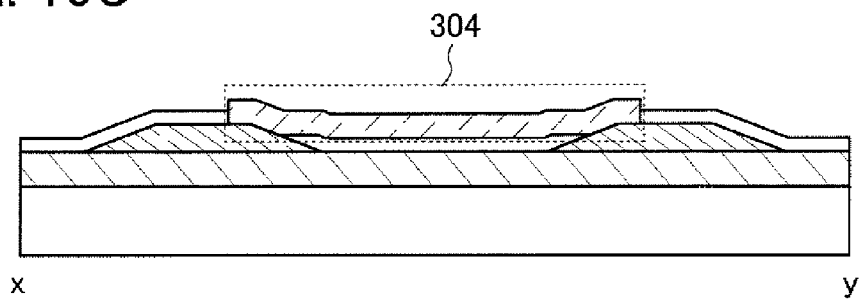

Next, the island-shaped semiconductor layer 304 is formed over the insulating layer 328. The semiconductor layer 304 is formed to be in contact with the conductive layers 322 exposed (FIG. 10C).

For the semiconductor layer 304, a single crystalline semiconductor or a crystalline semiconductor is preferably used. The semiconductor layer 304 is formed to have a thickness of 5 to 150 nm, preferably, 10 to 25 nm. The detailed description of crystallization and the like of the semiconductor layer is based on the description of the semiconductor layer 104 shown in Embodiment Mode 1. It is preferable to use laser crystallization using a CW laser or a pulsed laser with a repetition rate of greater than or equal to 10 MHz since crystal grains which are elongated in one direction can be formed.

The island-shaped semiconductor layer 304 can be formed as follows: a semiconductor layer formed over the insulating layer 328 by a CVD method or a sputtering method is crystallized and then selectively etched. The island-shaped semiconductor layer 304 is formed so as to be in contact with the exposed portions of the conductive layers 322. When the thickness of the semiconductor layer 304 is set to be less than or equal to 50 nm, the semiconductor layer may be thinned by etching after being formed to have a thickness of greater than or equal to 50 nm.

In this embodiment mode, a crystalline silicon layer with a thickness of 20 nm is formed for the semiconductor layer 304. In this embodiment mode, the insulating layer 328 is formed so as to cover the conductive layers 322, and the semiconductor layer 304 and the conductive layers 322 are insulated with the insulating layer 328 except in the openings. With such a structure, defects that a conductive material forming the conductive layers 322 leaks into the semiconductor layer 304 and the like can be suppressed. In addition, the conductive layers 322 are covered with the insulating layer 328 except in parts to be exposed, so that damage thereto in forming the semiconductor layer 304 can be prevented.

Next, after the insulating layer 312 is formed over the semiconductor layer 304, a stacked-layer structure of the conductive layers 314 and 316 which constitute the gate electrode 318 is formed over the insulating layer 312. Then, after an impurity element which imparts one conductivity type is added at a first concentration with the gate electrode 318 as a mask, the sidewall insulating layers 320 which are in contact with the side surfaces of the gate electrode 318 and the insulating layer 312 are formed. Then, an impurity element which imparts one conductivity type is added at a second concentration with the sidewall insulating layers 320 and the gate electrode 318 as a mask, so that a pair of high-concentration impurity regions 310, a pair of low-concentration impurity regions 308, and a channel formation region 306 are formed in a self-aligned manner. Impurity elements having the same conductivity type are added at the first concentration and the second concentration. For example, an impurity element which imparts p-type conductivity such as boron (B), aluminum (Al), or gallium (Ga), or an impurity element which imparts n-type conductivity such as phosphorus (P) or arsenic (As) can be added. Note that the second concentration is made higher than the first concentration. In addition, regions of the semiconductor layer 304 which do not overlap with the sidewall insulating layers 320 (the high-concentration impurity regions 310) are exposed by etching for forming the sidewall insulating layers 320.

Figure 10D:
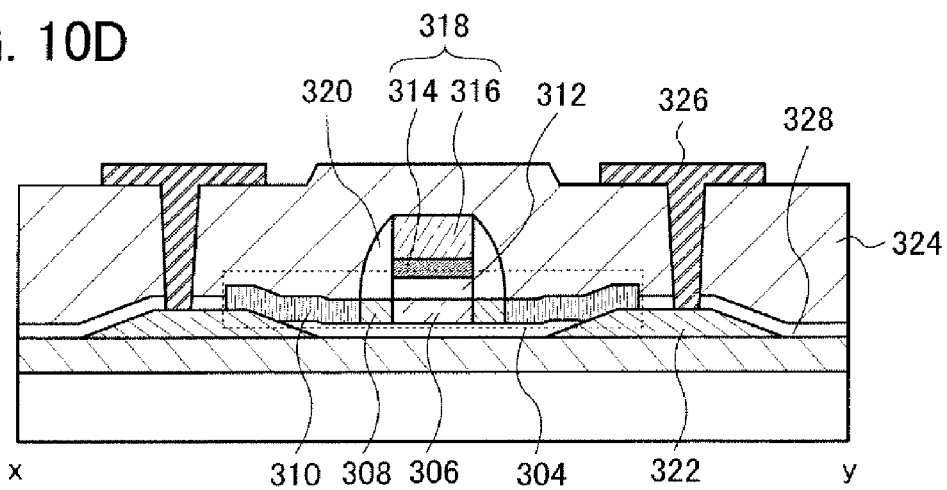

After a metal layer is formed to be in contact with at least the exposed regions of the high concentration impurity regions 310, heat treatment is performed to the high-concentration impurity regions 310, so that silicide is formed in regions of the high-concentration impurity regions 310 which are in contact with the metal layer. Here, an example is shown in which silicide is formed in the entire high-concentration impurity regions 310 (FIG. 10D). The steps before formation of the channel formation region 306, the low-concentration impurity regions 308, and the high-concentration impurity regions 310 in which silicide is formed in the island-shaped semiconductor layer 304 after formation of the semiconductor layer 304 are based on the description of the insulating layer 112, the conductive layers 114 and 116, the sidewall insulating layers 120, the semiconductor layer 104, and the like in Embodiment Mode 1, and thus omitted.

Note that an impurity element which imparts one conductivity type may be added to the channel formation region 306 in order to control the threshold voltage of the transistor, and the impurity element may be added to the channel formation region 306 before the gate electrode 318 is formed.

Further, after the impurity element which imparts one conductivity type is added to the semiconductor layer 304, heat treatment may be performed to activate the impurity element added. The heat treatment can be performed by laser beam irradiation, RTA, or using an annealing furnace. Specifically, the heat treatment may be performed at temperatures of 400 to 700° C., preferably 500 to 650° C. Further, the heat treatment is preferably performed in a nitrogen atmosphere.

An example is shown in which silicide is formed in the entire high-concentration impurity regions 310. However, the present invention is not limited thereto, and silicide is not required to be formed in the high-concentration impurity regions 310 or silicide may be formed in part of the high-concentration impurity regions 310. In addition, silicide may be formed also below the sidewall insulating layers 320 (except the channel formation region 306).

Next, the insulating layer 324 is formed so as to cover the insulating layer, conductive layer, and the like provided over the substrate 300. Then, after openings which reach the conductive layers 322 are formed in the insulating layers 324 and 328, the conductive layers 326 are formed in the openings and over the insulating layer 324 (FIG. 10D).

The conductive layers 326 serve as source and drain electrodes. The conductive layers 326 reach the conductive layers 322 through the openings formed in the insulating layers 324 and 328. The conductive layers 322 are in contact with the high-concentration impurity regions 310. Therefore, the conductive layers 326 serving as source and drain electrodes are electrically connected to the high-concentration impurity regions 310 serving as source and drain regions with the conductive layers 322 serving as connecting wirings interposed therebetween.

The insulating layer 324 and the conductive layers 326 are based on the insulating layer 224 and the conductive layers 226 described in Embodiment Mode 2, and thus the description thereof is omitted.

The opening formed in the insulating layers 324 and 328 is formed so that at least part thereof overlaps with the conductive layer 322. For example, the insulating layer 324 is selectively covered with a resist mask, and regions not covered with the resist mask are etched to form the openings. Although the openings can be formed by a wet etching method, it is preferable to use a dry etching method because fine processing is easily performed. Further, after the openings are formed by dry etching, wet etching may be performed to remove a reaction product or the like. After formation of the openings, the resist mask is removed. Alternatively, ablation is utilized, so that the openings may be directly formed by irradiating the insulating layers 324 and 328 with a laser beam selectively.

Note that the openings are formed in the insulating layers 324 and 328 so that the conductive layers 322 are exposed at the bottom of the openings. Parts of the conductive layers 322 are etched in some cases, but the conductive layers 322 are made to remain at least at the bottom of the openings. The conductive layers 326 are formed in the openings formed in the insulating layers 324 and 328. The conductive layers 322 are in contact with the conductive layer 326 through the openings. In addition, the conductive layers 322 are in contact with the high-concentration impurity regions 310. Therefore, the conductive layers 326 are electrically connected to the high-concentration impurity regions 310 with the conductive layers 322 interposed therebetween. It is preferable to form the opening so as to reach a region where the conductive layer 322 does not overlap with the semiconductor layer 304. With such a structure, the semiconductor layer can be prevented from being removed, and contact between the conductive layer and the semiconductor layer can be favorable. Accordingly, reliability of the semiconductor device completed can be improved.

It is also possible that the conductive layer 326 is electrically connected to the semiconductor layer 304 through an opening formed in the insulating layer 324 in a region where the insulating layer 328 is not formed. In this case, also when the semiconductor layer has such a thickness that part thereof is removed by etching in forming the opening in the insulating layer 324, contact between the conductive layer and the semiconductor layer can be favorable with the conductive layer 322.

In this embodiment mode, the insulating layer 328 is provided between the conductive layers 322 serving as connecting wirings and the semiconductor layer 304. Specifically, the insulating layer 328 having the openings is provided so as to cover the conductive layers 322, and the conductive layers 322 are partially exposed in the openings. The semiconductor layer 304 is provided over the conductive layers 322 and the insulating layer 328 which covers the conductive layers 322. In addition, the semiconductor layer 304 is in contact with the conductive layers 322 through the openings formed in the insulating layer 328. The semiconductor layer 304 and the conductive layers 322 are insulated with the insulating layer 328 except the regions where the semiconductor layer 304 and the conductive layers 322 are in contact with each other through the openings. By the insulating layer 328, the conductive layer 322 can also be provided to get across a part below the semiconductor layer 304 without contact with the semiconductor layer 304; therefore, higher integration can be achieved with a multilayer wiring structure.

In addition, silicide is formed in the high-concentration impurity regions 310, and the conductive layers 322 are in contact with the high-concentration impurity regions 310 in which silicide is formed. Therefore, contact resistance between the conductive layers and the semiconductor layer can be reduced. As a result, deterioration of operating characteristics of the semiconductor device due to reduction in on current can be prevented.

By applying the present invention, electrical connection between the conductive layer and the semiconductor layer can be favorable, so that reliability of the semiconductor device can be improved. In addition, since a multilayer wiring structure can be made, much higher integration is possible.

This embodiment mode can be combined with other embodiment modes in this specification as appropriate.

Embodiment Mode 4

This embodiment mode will describe an example of a semiconductor device having a different structure from that in the preceding embodiment modes and a manufacturing method thereof with reference to FIGS. 14 to 18C. Specifically, an example of a semiconductor device including a plurality of thin film transistors having different conductivity types will be described.

Figure 14:
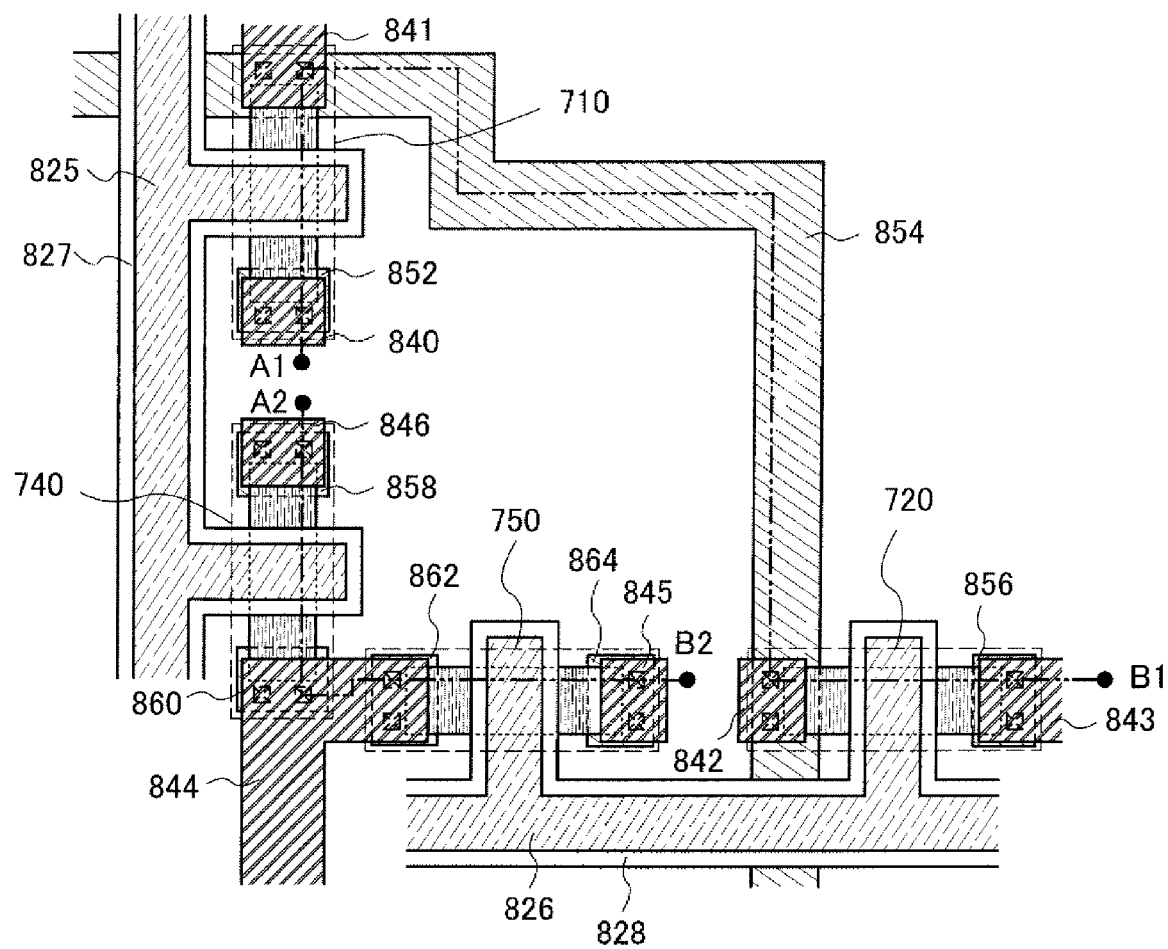
FIG. 14 is a top view showing an example of a main structure of a semiconductor device of the present invention.
Figure 15A:
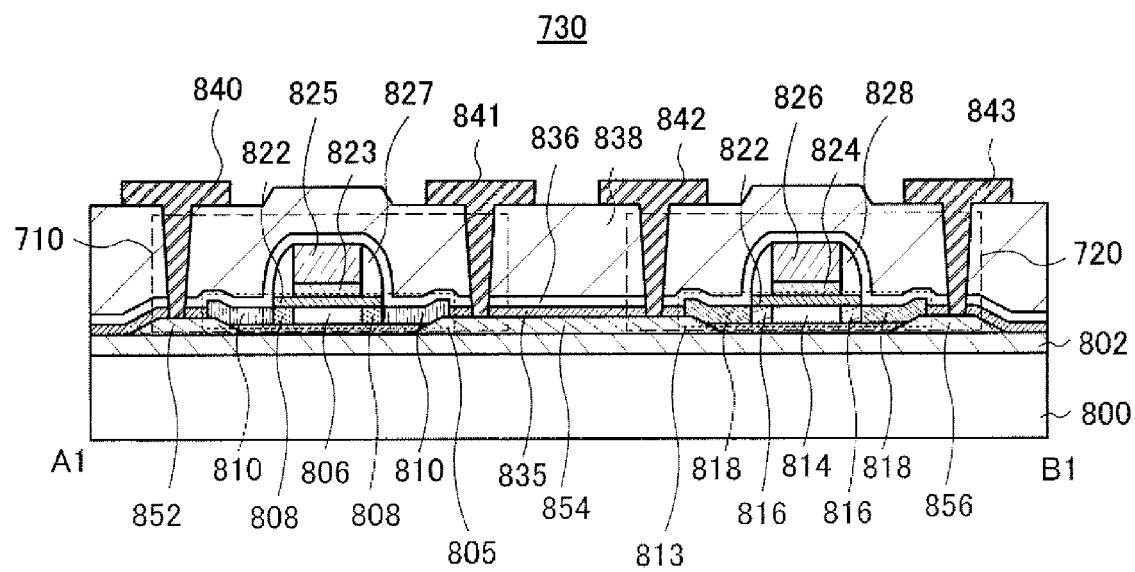
FIGS. 15A and 15B are cross-sectional views showing an example of a main structure of a semiconductor device of the present invention.
Figure 15B:
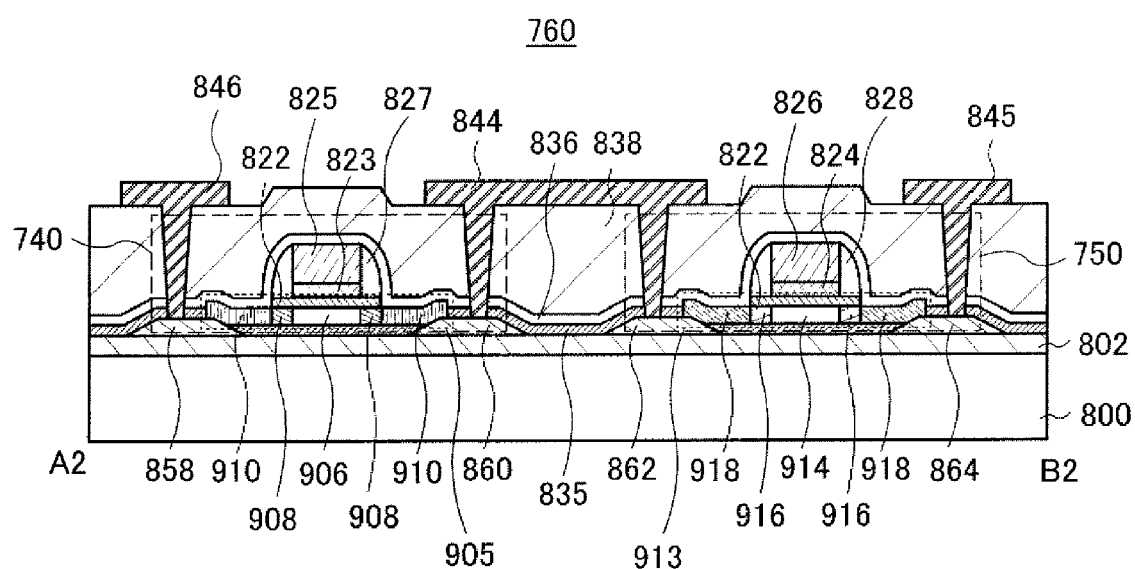

FIG. 14 is a top view and FIGS. 15A and 15B are cross-sectional views of a semiconductor device shown in this embodiment mode, and an example of a semiconductor device including a plurality of thin film transistors (hereinafter also referred to as TFTs) is shown. FIG. 14 is a top view, FIG. 15A is a cross-sectional view taken along a dashed line A1-B1 in FIG. 14, and FIG. 15B is a cross-sectional view taken along a dashed line A2-B2 in FIG. 14. In FIG. 14, illustration of part of components such as a thin film is omitted. Note that these drawings show only an example and the structure can be changed as appropriate depending on a desired layout.

A semiconductor device shown in FIGS. 15A and 15B includes TFTs 710, 720, 740, and 750 provided over a substrate 800 with an insulating layer 802 interposed therebetween. The TFTs 710 and 720 are electrically connected to each other through a conductive layer 854 to constitute a CMOS transistor 730. In addition, the TFTs 740 and 750 are electrically connected to each other through a conductive layer 844 to constitute a CMOS transistor 760.

The CMOS transistor 730 includes a conductive layer 852, the conductive layer 854, and a conductive layer 856 provided over the substrate 800 with the insulating layer 802 interposed therebetween, an insulating layer 835 provided to cover the conductive layers 852, 854, and 856, the TFT 710 connected to the conductive layers 852 and 854 through openings formed in the insulating layer 835, and the TFT 720 connected to the conductive layers 854 and 856 through openings formed in the insulating layer 835. In addition, insulating layers 836 and 838 are provided to cover the TFTs 710 and 720. In the insulating layers 836 and 838, openings which reach the conductive layers 852, 854, and 856 are formed. A conductive layer 840 is formed in the opening which reaches the conductive layer 852, and the conductive layer 840 is in contact with the conductive layer 852 through the opening. A conductive layer 841 is formed in the opening which reaches the conductive layer 854, and the conductive layer 841 is in contact with the conductive layer 854 through the opening. A conductive layer 842 is formed in another opening which reaches the conductive layer 854, and the conductive layer 842 is in contact with the conductive layer 854 through the opening. A conductive layer 843 is formed in the opening which reaches the conductive layer 856, and the conductive layer 843 is in contact with the conductive layer 856 through the opening. The conductive layers 840, 841, 842, and 843 serve as source and drain electrodes.

The TFT 710 includes an island-shaped semiconductor layer 805 provided over the insulating layer 835, conductive layers 823 and 825 included in a gate electrode which are provided over the semiconductor layer 805 with an insulating layer 822 interposed therebetween, and sidewall insulating layers 827 provided to be in contact with the side surfaces of the conductive layers 823 and 825.

The island-shaped semiconductor layer 805 includes a channel formation region 806, a pair of low-concentration impurity regions 808 serving as LDD regions, and a pair of high-concentration impurity regions 810 serving as source and drain regions. The channel formation region 806 is formed in a region of the semiconductor layer 805 which overlaps with the conductive layers 823 and 825 with the insulating layer 822 interposed therebetween. The low-concentration impurity region 808 is formed in a region of the semiconductor layer 805 which overlaps with the sidewall insulating layer 827 with the insulating layer 822 interposed therebetween. The high-concentration impurity region 810 is formed in a region of the semiconductor layer 805 which does not overlap with the conductive layers 823 and 825 and the sidewall insulating layer 827 with the insulating layer 822 interposed therebetween. In other words, in the semiconductor layer 805, the channel formation region 806 is formed in a region which overlaps with the conductive layers 823 and 825 and the impurity regions (the low-concentration impurity region 808 and the high-concentration impurity region 810) are formed outside the region which overlaps with the conductive layers 823 and 825. Here, silicide is formed in the entire high-concentration impurity region 810.

The channel formation region 806 is positioned between the pair of high-concentration impurity regions 810, and each of the low-concentration impurity regions 808 is positioned between the channel formation region 806 and each of the high-concentration impurity regions 810. That is, the channel formation region 806 is positioned between the pair of high-concentration impurity regions 810 and between the pair of low-concentration impurity regions 808, and is in contact with the pair of low-concentration impurity regions 808. The concentration of an impurity element which imparts one conductivity type added to the high-concentration impurity regions 810 is higher than that of the low-concentration impurity regions 808.

In addition, the insulating layer 822 serving as a gate insulating layer is formed only in a region where the semiconductor layer 805, the sidewall insulating layers 827, and the conductive layers 823 and 825 included in the gate electrode overlap with one another. When silicide is not formed in the semiconductor layer, the insulating layer 822 serving as a gate insulating layer may be formed to cover the entire semiconductor layer. Further, parts of the high-concentration impurity regions 810 formed in the semiconductor layer 805 are in contact with the conductive layers 852 and 854 through the openings foxed in the insulating layer 835. Therefore, the high-concentration impurity regions 810 formed in the semiconductor layer 805 are electrically connected to the conductive layers 840 and 841 with the conductive layers 852 and 854, respectively, interposed therebetween. The conductive layers 852 and 854 serve as connecting wirings.

The TFT 720 includes an island-shaped semiconductor layer 813 provided over the insulating layer 835, conductive layers 824 and 826 included in a gate electrode which are provided over the semiconductor layer 813 with the insulating layer 822 interposed therebetween, and sidewall insulating layers 828 provided to be in contact with the side surfaces of the conductive layers 824 and 826.

The island-shaped semiconductor layer 813 includes a channel formation region 814, a pair of low-concentration impurity regions 816 serving as LDD regions, and a pair of high-concentration impurity regions 818 serving as source and drain regions. The channel formation region 814 is formed in a region of the semiconductor layer 813 which overlaps with the conductive layers 824 and 826 with the insulating layer 822 interposed therebetween. The low-concentration impurity region 816 is formed in a region of the semiconductor layer 813 which overlaps with the sidewall insulating layer 828 with the insulating layer 822 interposed therebetween. The high-concentration impurity region 818 is formed in a region of the semiconductor layer 813 which does not overlap with the conductive layers 824 and 826 and the sidewall insulating layers 828 with the insulating layer 822 interposed therebetween. In other words, in the semiconductor layer 813, the channel formation region 814 is formed in a region which overlaps with the conductive layers 824 and 826 and the impurity regions (the low-concentration impurity region 816 and the high-concentration impurity region 818) are formed outside the region which overlaps with the conductive layers 824 and 826. Here, silicide is formed in the entire high-concentration impurity region 818.

The channel formation region 814 is positioned between the pair of high-concentration impurity regions 818, and each of the low-concentration impurity regions 816 is positioned between the channel formation region 814 and each of the high-concentration impurity regions 818. That is, the channel formation region 814 is positioned between the pair of high-concentration impurity regions 818 and between the pair of low-concentration impurity regions 816, and is in contact with the pair of low-concentration impurity regions 816. The concentration of an impurity element which imparts one conductivity type added to the high-concentration impurity regions 818 is higher than that of the low-concentration impurity regions 816.

In addition, the insulating layer 822 serving as a gate insulating layer is formed only in a region where the semiconductor layer 813, the sidewall insulating layers 828, and the conductive layers 824 and 826 included in the gate electrode overlap with one another. When silicide is not formed in the semiconductor layer, the insulating layer 822 serving as a gate insulating layer may be formed to cover the entire semiconductor layer. Further, parts of the high-concentration impurity regions 818 formed in the semiconductor layer 813 are in contact with the conductive layers 854 and 856 through the openings formed in the insulating layer 835. Therefore, the high-concentration impurity regions 818 formed in the semiconductor layer 813 are electrically connected to the conductive layers 842 and 843 with the conductive layers 854 and 856, respectively, interposed therebetween. The conductive layers 854 and 856 serve as connecting wirings.

The semiconductor layer 805 included in the TFT 710 and the semiconductor layer 813 included in the TFT 720 are doped with impurity elements having different conductivity types. In other words, the impurity element added to the low-concentration impurity regions 808 and the high-concentration impurity regions 810 has a different conductivity type from that of the impurity element added to the low-concentration impurity regions 816 and the high-concentration impurity regions 818.

The high-concentration impurity region 818 formed in the semiconductor layer 813 included in the TFT 720 and the high-concentration impurity region 810 formed in the semiconductor layer 805 included in the TFT 710 are electrically connected to each other through the conductive layer 854 serving as a connecting wiring, whereby the CMOS transistor 730 is formed.

The CMOS transistor 760 includes a conductive layer 858, a conductive layer 860, a conductive layer 862, and a conductive layer 864 provided over the substrate 800 with the insulating layer 802 interposed therebetween, the insulating layer 835 provided to cover the conductive layers 858, 860, 862, and 864, the TFT 740 connected to the conductive layers 858 and 860 through openings formed in the insulating layer 835, and the TFT 750 connected to the conductive layers 862 and 864 through openings formed in the insulating layer 835. In addition, the insulating layers 836 and 838 are provided to cover the TFTs 740 and 750. In the insulating layers 836 and 838, openings which reach the conductive layers 858, 860, 862, and 864 are formed. A conductive layer 846 is formed in the opening which reaches the conductive layer 858, and the conductive layer 846 is in contact with the conductive layer 858 through the opening. A conductive layer 844 is formed in the opening which reaches the conductive layer 860 and the opening which reaches the conductive layer 862, and the conductive layer 844 is in contact with the conductive layers 860 and 862 through the openings. A conductive layer 845 is formed in the opening which reaches the conductive layer 864, and the conductive layer 845 is in contact with the conductive layer 864 through the opening. The conductive layers 844, 845, and 846 serve as source or drain electrodes.

The TFT 740 includes an island-shaped semiconductor layer 905 provided over the insulating layer 835, the conductive layers 823 and 825 included in a gate electrode which are provided over the semiconductor layer 905 with the insulating layer 822 interposed therebetween, and the sidewall insulating layers 827 provided to be in contact with the side surfaces of the conductive layers 823 and 825.

The island-shaped semiconductor layer 905 includes a channel formation region 906, a pair of low-concentration impurity regions 908 serving as LDD regions, and a pair of high-concentration impurity regions 910 serving as source and drain regions. The channel formation region 906 is formed in a region of the semiconductor layer 905 which overlaps with the conductive layers 823 and 825 with the insulating layer 822 interposed therebetween. The low-concentration impurity region 908 is formed in a region of the semiconductor layer 905 which overlaps with the sidewall insulating layer 827 with the insulating layer 822 interposed therebetween. The high-concentration impurity region 910 is formed in a region of the semiconductor layer 905 which does not overlap with the conductive layers 823 and 825 and the sidewall insulating layer 827 with the insulating layer 822 interposed therebetween. In other words, in the semiconductor layer 905, the channel formation region 906 is formed in a region which overlaps with the conductive layers 823 and 825 and the impurity regions (the low-concentration impurity region 908 and the high-concentration impurity region 910) are formed outside the region which overlaps with the conductive layers 823 and 825. Here, silicide is formed in the entire high-concentration impurity region 910.

The channel formation region 906 is positioned between the pair of high-concentration impurity regions 910, and each of the low-concentration impurity regions 908 is positioned between the channel formation region 906 and each of the high-concentration impurity regions 910. That is, the channel formation region 906 is positioned between the pair of high-concentration impurity regions 910 and between the pair of low-concentration impurity regions 908, and is in contact with the pair of low-concentration impurity regions 908. The concentration of an impurity element which imparts one conductivity type added to the high-concentration impurity regions 910 is higher than that of the low-concentration impurity regions 908.

In addition, the insulating layer 822 serving as a gate insulating layer is formed only in a region where the semiconductor layer 905, the sidewall insulating layers 827, and the conductive layers 823 and 825 included in the gate electrode overlap with one another. When silicide is not formed in the semiconductor layer, the insulating layer 822 serving as a gate insulating layer may be formed to cover the entire semiconductor layer. Further, parts of the high-concentration impurity regions 910 formed in the semiconductor layer 905 are in contact with the conductive layers 858 and 860 through the openings formed in the insulating layer 835. Therefore, the high-concentration impurity regions 910 formed in the semiconductor layer 905 are electrically connected to the conductive layers 846 and 844 with the conductive layers 858 and 860, respectively, interposed therebetween. The conductive layers 858 and 860 serve as connecting wirings.

The TFT 750 includes an island-shaped semiconductor layer 913 provided over the insulating layer 835, the conductive layers 824 and 826 included in a gate electrode which are provided over the semiconductor layer 913 with the insulating layer 822 interposed therebetween, and the sidewall insulating layers 828 provided to be in contact with the side surfaces of the conductive layers 824 and 826.

The island-shaped semiconductor layer 913 includes a channel formation region 914, a pair of low-concentration impurity regions 916 serving as LDD regions, and a pair of high-concentration impurity regions 918 serving as source and drain regions. The channel formation region 914 is formed in a region of the semiconductor layer 913 which overlaps with the conductive layers 824 and 826 with the insulating layer 822 interposed therebetween. The low-concentration impurity region 916 is formed in a region of the semiconductor layer 913 which overlaps with the sidewall insulating layer 828 with the insulating layer 822 interposed therebetween. The high-concentration impurity region 918 is formed in a region of the semiconductor layer 913 which does not overlap with the conductive layers 824 and 826 and the sidewall insulating layer 828 with the insulating layer 822 interposed therebetween. In other words, in the semiconductor layer 913, the channel formation region 914 is formed in a region which overlaps with the conductive layers 824 and 826 and the impurity regions (the low-concentration impurity region 916 and the high-concentration impurity region 918) are formed outside the region which overlaps with the conductive layers 824 and 826. Here, silicide is formed in the entire high-concentration impurity region 918.

The channel formation region 914 is positioned between the pair of high-concentration impurity regions 918, and each of the low-concentration impurity regions 916 is positioned between the channel formation region 914 and each of the high-concentration impurity regions 918. That is, the channel formation region 914 is positioned between the pair of high-concentration impurity regions 918 and between the pair of low-concentration impurity regions 916, and is in contact with the pair of low-concentration impurity regions 916. The concentration of an impurity element which imparts one conductivity type added to the high-concentration impurity regions 918 is higher than that of the low-concentration impurity regions 916.

In addition, the insulating layer 822 serving as a gate insulating layer is formed only in a region where the semiconductor layer 913, the sidewall insulating layers 828, and the conductive layers 824 and 826 included in the gate electrode overlap with one another. When silicide is not formed in the semiconductor layer, the insulating layer 822 serving as a gate insulating layer may be formed to cover the entire semiconductor layer. Further, parts of the high-concentration impurity regions 918 formed in the semiconductor layer 913 are in contact with the conductive layers 862 and 864 through the openings formed in the insulating layer 835. Therefore, the high-concentration impurity regions 918 formed in the semiconductor layer 913 are electrically connected to the conductive layers 844 and 845 with the conductive layers 862 and 864, respectively, interposed therebetween. The conductive layers 862 and 864 serve as connecting wirings.

The semiconductor layer 905 included in the TFT 740 and the semiconductor layer 913 included in the TFT 750 are doped with impurity elements having different conductivity types. In other words, the impurity element added to the low-concentration impurity regions 908 and the high-concentration impurity regions 910 has a different conductivity type from that of the impurity element added to the low-concentration impurity regions 916 and the high-concentration impurity regions 918.

The high-concentration impurity region 918 formed in the semiconductor layer 913 included in the TFT 750 and the high-concentration impurity region 910 formed in the semiconductor layer 905 included in the TFT 740 are electrically connected to each other through the conductive layer 844 serving as a source or drain electrode, whereby the CMOS transistor 760 is formed.

The gate electrode formed of a stacked-layer structure of the conductive layers 823 and 825 is provided so as to get across the island-shaped semiconductor layers 805 and 905. In addition, the sidewall-insulating layers 827 are formed to be in contact with the side surfaces of the conductive layers 823 and 825. Similarly, the gate electrode formed of a stacked-layer structure of the conductive layers 824 and 826 is provided so as to get across the island-shaped semiconductor layers 813 and 913. In addition, the sidewall-insulating layers 828 are formed to be in contact with the side surfaces of the conductive layers 824 and 826. Although the example in which the gate electrode has a stacked-layer structure including two conductive layers is shown, the present invention is not limited thereto. For example, a single layer structure or a stacked-layer structure including three or more layers may be used. When the gate electrode is formed of a stacked-layer structure, the width of the lower conductive layer may be made larger than that of the upper conductive layer. Further, the side surface of the conductive layer formed as the gate electrode may be tapered, or a stacked-layer structure including two or more conductive layers in which the taper angles are different among the layers may be employed. When silicide is not formed later, the sidewall insulating layers 827 and 828 are not required to be formed.

Next, an example of a method for manufacturing the semiconductor device shown in FIGS. 14 to 15B will be described with reference to the drawings. Here, an example of a method for manufacturing the CMOS transistor 730 shown in FIG. 15A will be described.

Figure 16A:
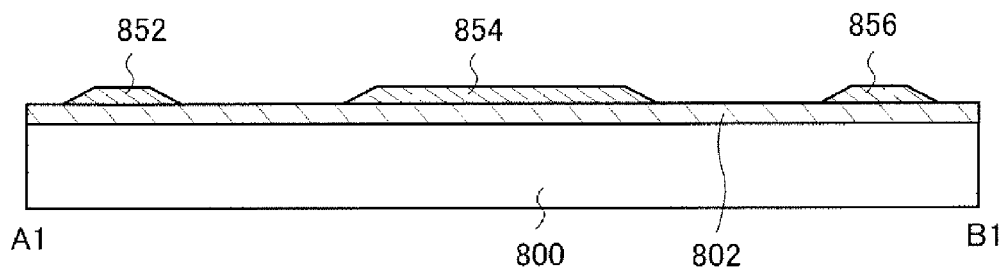
FIGS. 16A to 16D are views showing an example of a manufacturing method of a semiconductor device of the present invention.

The conductive layers 852, 854, and 856 are formed over the substrate 800 with the insulating layer 802 interposed therebetween (FIG. 16A).

For the substrate 800, a substrate having an insulating surface may be used. For example, a glass substrate, a quartz substrate, a sapphire substrate, a ceramic substrate, a metal substrate with an insulating layer formed over the surface, or the like can be used.

The insulating layer 802 is formed using silicon oxide, silicon nitride, silicon oxynitride, silicon nitride oxide, or the like by a CVD method, a sputtering method, an ALD method, or the like. The insulating layer 802 serves as a blocking layer that prevents contamination of the semiconductor layer due to diffusion of an alkali metal or the like from the substrate 800 to the semiconductor layer. In addition, when the surface of the substrate 800 is uneven, the insulating layer 802 can serve as a layer for planarization. Note that the insulating layer 802 is not necessary to be formed if impurity diffusion from the substrate 800 or unevenness of the surface of the substrate 800 is not a problem. Further, although the base insulating layer has a single layer structure, it may have a stacked-layer structure including two or more layers.

The conductive layers 852, 854, and 856 are formed by the steps of forming a conductive layer using a conductive material such as a metal element, e.g., titanium (Ti), tantalum (Ta), tungsten (W), or molybdenum (Mo), or an alloy material or a compound material containing any of the above metal elements by a CVD method or a sputtering method over the entire surface of the substrate and selectively etching the conductive layer into a desired shape. Preferably, the conductive layers 852, 854, and 856 are processed so as to have tapered end portions.

Figure 16B:
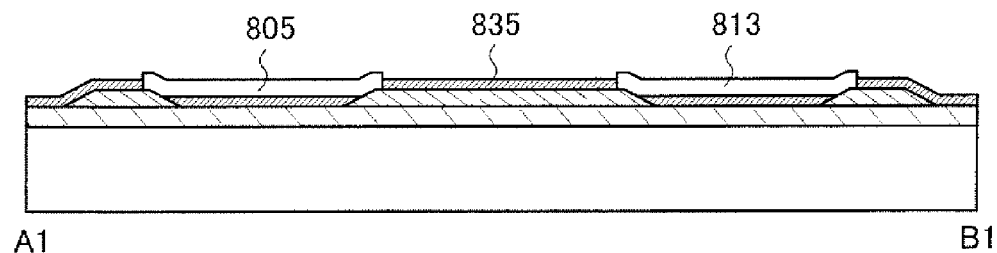

Next, the insulating layer 835 is formed so as to cover the insulating layer 802 and the conductive layers 852, 854, and 856. After the insulating layer 835 is selectively etched to expose parts of the conductive layers 852, 854, and 856, the island-shaped semiconductor layers 805 and 813 are formed (FIG. 16B). At this time, parts of the semiconductor layer 805 are in contact with the exposed conductive layers 852 and 854. That is, the semiconductor layer 805 is formed so as to be in contact with the conductive layers 852 and 854 through the openings formed in the insulating layer 835. In addition, parts of the semiconductor layer 813 are in contact with the exposed conductive layers 854 and 856. That is, the semiconductor layer 813 is formed so as to be in contact with the conductive layers 854 and 856 through the openings formed in the insulating layer 835.

The insulating layer 835 is formed by a CVD method, a sputtering method, an ALD method, or the like using an inorganic insulating material such as silicon oxide, silicon nitride, silicon oxynitride, or silicon nitride oxide, or an insulating material containing carbon such as DLC (diamond-like carbon).

The semiconductor layers 805 and 813 are preferably formed using a material mainly containing silicon, specifically, silicon, germanium, silicon germanium, or the like by a CVD method or a sputtering method. For example, the semiconductor layers 805 and 813 can be formed as follows: an amorphous semiconductor layer is formed using a material mainly containing silicon, the amorphous semiconductor layer is crystallized and selectively etched, and thus the island-shaped semiconductor layers are formed. When the amorphous semiconductor layer is crystallized, a laser crystallization method, a thermal crystallization method using RTA or an annealing furnace, a thermal crystallization method using a metal element that promotes crystallization, or a method combining these methods can be used. It is preferable to use laser crystallization using a CW laser or a pulsed laser with a repetition rate of greater than or equal to 10 MHz since crystal grains which are elongated in one direction can be formed.

The semiconductor layers 805 and 813 are formed to have a thickness of 5 to 150 nm, preferably, 10 to 25 nm. When the thickness of the semiconductor layers is set to be less than or equal to 50 nm, the semiconductor layers may be thinned by etching after being formed to have a thickness of greater than or equal to 50 nm.

The semiconductor layers 805 and 813 may be formed such that the end portions have a tapered shape or a perpendicular shape. The shape of the end portions of the semiconductor layers can be controlled by appropriately selecting etching conditions.

Figure 16C:
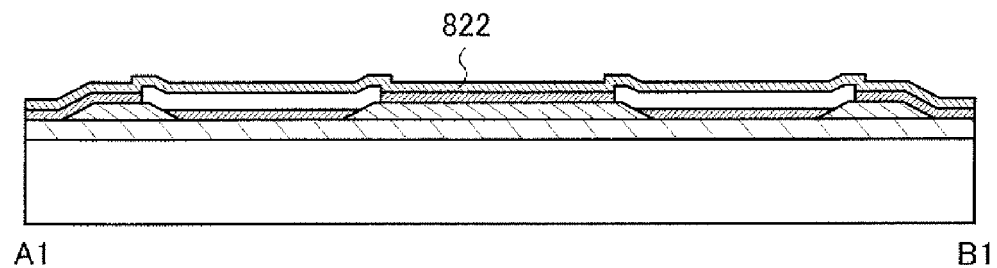

Next, the insulating layer 822 is formed over the semiconductor layers 805 and 813 (FIG. 16C).

The insulating layer 822 is formed by a CVD) method, a sputtering method, or an ALD method using silicon oxide, silicon nitride, silicon oxynitride, silicon nitride oxide, aluminum nitride, or the like. The insulating layer 822 is formed to have a single layer structure or a stacked-layer structure of at least one of the above materials. Further, the insulating layer 822 can also be formed by solid phase oxidation or solid phase nitridation of the semiconductor layers 805 and 813 with high-density plasma treatment. The insulating layer 822 serves as a gate insulating layer.

In order to control the threshold voltage of the thin film transistors to be completed later, an impurity element which imparts one conductivity type may be added to the semiconductor layers 805 and 813 at a low concentration. In this case, the impurity element is also added to the channel formation regions of the thin film transistors to be completed. As the impurity element which imparts one conductivity type, an impurity element which imparts n-type conductivity such as phosphorus (P) or arsenic (As) or an impurity element which imparts p-type conductivity such as boron (B), aluminum (Al), or gallium (Ga) can be used. For example, boron can be added as the impurity element to the semiconductor layers 805 and 813 to be contained at a concentration of about $1 \times 10^{16}$ to $1 \times 10^{18}$ cm$^{-3}$. Note that the impurity element may be added to the semiconductor layers 805 and 813 at different concentrations or the impurity elements having different conductivity types may be added to the semiconductor layers 805 and 813.

Figure 16D:
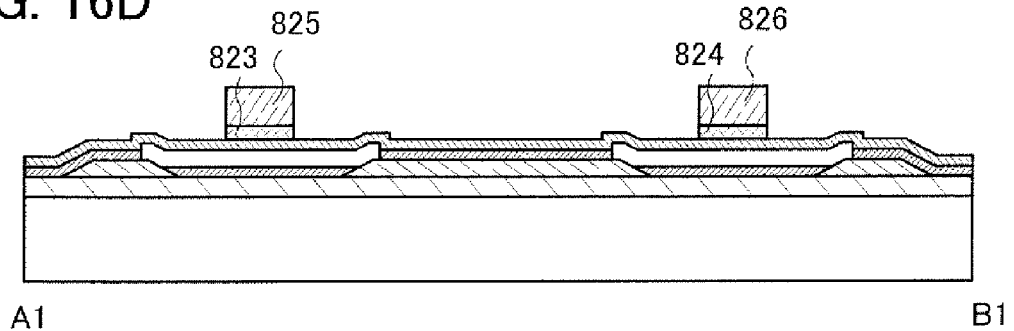

The conductive layers 823 and 825 and the conductive Layers 824 and 826 are stacked over the semiconductor layers 805 and 813, respectively, with the insulating layer 822 interposed therebetween, to serve as gate electrodes (FIG. 16D).

Each of the conductive layers included in the gate electrode can be formed by forming a conductive layer by a CVD method or a sputtering method using a metal element such as tantalum (Ta), tungsten (W), titanium (Ti), molybdenum (Mo), chromium (Cr), aluminum (Al), copper (Cu), or niobium (Nb), or an alloy material or a compound material containing the above-described metal element over the entire surface of the substrate, and then selectively etching the conductive layer. Further, a semiconductor material typified by polycrystalline silicon to which an impurity element which imparts one conductivity type such as phosphorus is added can also be used. Note that the gate electrode may be formed of a single layer structure or a stacked-layer structure of three or more conductive layers. Further, the side surface of the conductive layer may be tapered. When the gate electrode has a stacked-layer structure of conductive layers, the width of the lower conductive layer may be made larger than the upper conductive layer, or a tapered shape in which the side surface of each layer has a different angle may be used.

In this embodiment mode, the stacked-layer structure of the conductive layers 823 and 825 and the stacked-layer structure of the conductive layers 824 and 826 are formed as follows: a stacked-layer structure of conductive layers is formed over the entire surface of the substrate and then selectively etched into a desired shape.

Figure 17A:
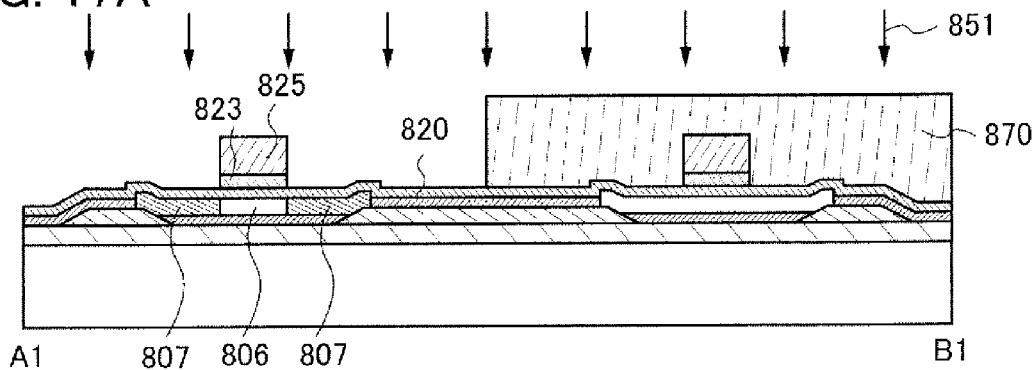
FIGS. 17A to 17D are views showing an example of a manufacturing method of a semiconductor device of the present invention.

Next, a resist mask 870 is selectively formed so as to cover the semiconductor layer 813, and an impurity element 851 which imparts one conductivity type is added to the semiconductor layer 805 at a first concentration with the resist mask 870 and the conductive layers 823 and 825 as masks, whereby impurity regions 807 are formed (FIG. 17A). In this embodiment mode, the impurity element 851 is added with the conductive layers 823 and 825 as a mask, so that the pair of impurity regions 807 and the channel formation region 806 which is positioned between the pair of impurity regions 807 are formed in a self-aligned manner. The impurity regions 807 are formed in regions of the semiconductor layer 805 which do not overlap with the conductive layers 823 and 825. In addition, the channel formation region 806 is formed in the semiconductor layer 805 below the conductive layers 823 and 825. As the impurity element 851, an impurity element which imparts n-type conductivity such as phosphorus or arsenic or an impurity element which imparts p-type conductivity such as boron, aluminum, or gallium can be used. In this embodiment mode, phosphorus (P) is added as the impurity element 851. Note that parts of the impurity regions 807 form low-concentration impurity regions which serve as LDD regions later.

Figure 17B:
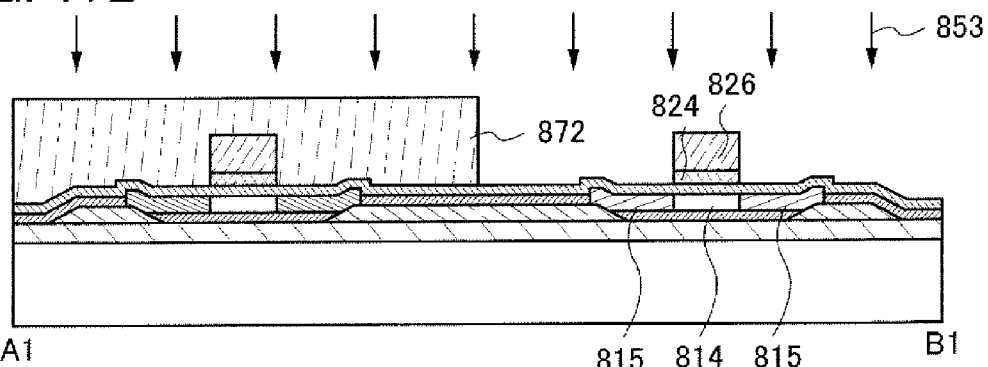

Next, a resist mask 872 is selectively formed so as to cover the semiconductor layer 805, and an impurity element 853 which imparts one conductivity type is added to the semiconductor layer 813 at a second concentration with the resist mask 872 and the conductive layers 824 and 826 as masks, whereby impurity regions 815 are formed (FIG. 17B). In this embodiment mode, the impurity element 853 is added with the conductive layers 824 and 826 as a mask, so that the pair of impurity regions 815 and the channel formation region 814 which is positioned between the pair of impurity regions 815 are formed in a self-aligned manner. The impurity regions 815 are formed in regions of the semiconductor layer 813 which do not overlap with the conductive layers 824 and 826. Further, the channel formation region 814 is formed in the semiconductor layer 813 below the conductive layers 824 and 826.

As the impurity element 853, an element having a conductivity type which is different from that of the impurity element 851 added to the semiconductor layer 805 is added. In this embodiment mode, boron (B) is added Note that parts of the impurity regions 815 form low-concentration impurity regions which serve as LDD regions later.

Figure 17C:
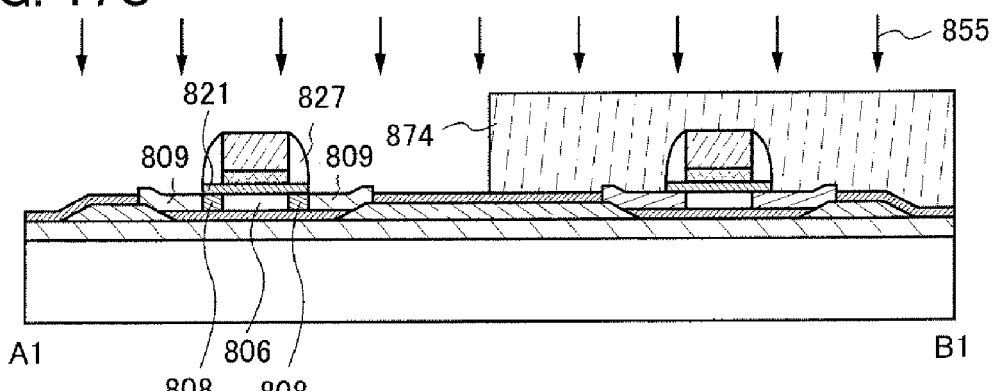

Next, the sidewall insulating layers 827 which are in contact with the side surfaces of the conductive layers 823 and 825 are formed, and further, the sidewall insulating layers 828 which are in contact with the side surfaces of the conductive layers 824 and 826 are formed (FIG. 17C). The sidewall insulating layers 827 and 828 can be formed so as to be in contact with the side surfaces of the conductive layers 823 and 825 and the conductive layers 824, and 826, respectively, as follows: an insulating layer having a single layer structure or a stacked-layer structure is formed by a CVD method or a sputtering method using an inorganic material such as silicon oxide, silicon nitride, silicon oxynitride, or silicon nitride oxide, or an organic material such as an organic resin, and the insulating layer is selectively etched by anisotropic etching mainly in a perpendicular direction. In this embodiment mode, the surfaces of the sidewall insulating layers 827 and 828, which are not in contact with the side surfaces of the conductive layers 823 and 825 and the conductive layers 824 and 826, respectively, are curved. Specifically, the sidewall insulating layers 827 and 828 are formed so as to have an appropriate curvature to curve convexly with respect to the side surfaces of the conductive layers 823 and 825 and the conductive layers 824 and 826 which are in contact with the sidewall insulating layers 827 and 828, respectively. It is needless to say that the present invention is not limited thereto, and the sidewall insulating layers 827 and 828 may be angulated instead of being curved. Note that the sidewall insulating layers 827 and 828 can also be used as doping masks for forming the low-concentration impurity regions which serve as LDD regions.

Further, the etching for forming the sidewall insulating layers 827 and 828 also etches the insulating layer 822 below the sidewall insulating layers 827 and 828 to selectively expose parts of the semiconductor layers 805 and 813. Specifically, the semiconductor layer 805 in regions which do not overlap with the conductive layers 823 and 825 and the sidewall insulating layers 827 and the semiconductor layer 813 in regions which do not overlap with the conductive layers 824 and 826 and the sidewall insulating layers 828 are selectively exposed. Furthermore, depending on the etching condition for forming the sidewall insulating layers 827 and 828, the upper portion of each of the semiconductor layers 805 and 813 may also be etched to be reduced in thickness.

Next, a resist mask 874 is selectively formed so as to cover the semiconductor layer 813. An impurity element 855 which imparts one conductivity type is added to the semiconductor layer 805 at a third concentration with the resist mask 874, the conductive layers 823 and 825, and the sidewall insulating layers 827 which are in contact with the side surfaces of the conductive layers 823 and 825 as masks (FIG. 17C). In this embodiment mode, the impurity element 855 is added to the semiconductor layer 805 with the conductive layers 823 and 825 and the sidewall insulating layers 827 which are in contact with the side surfaces of the conductive layers 823 and 825 as a mask, so that a pair of high-concentration impurity regions 809 and the pair of low-concentration impurity regions 808 are formed in a self-aligned manner. The high-concentration impurity regions 809 serve as source and drain regions and the low-concentration impurity regions 808 serve as LDD regions. As the impurity element 855, an impurity element which imparts the same conductivity type as the impurity element 851 added to the semiconductor layer 805 is added. In this embodiment mode, phosphorus (P) is added. Further, as for the addition of the impurity element, the third concentration is higher than the first concentration. Therefore, the concentration of the impurity element in the high-concentration impurity regions 809 is higher than that of the low-concentration impurity regions 808.

Figure 17D:
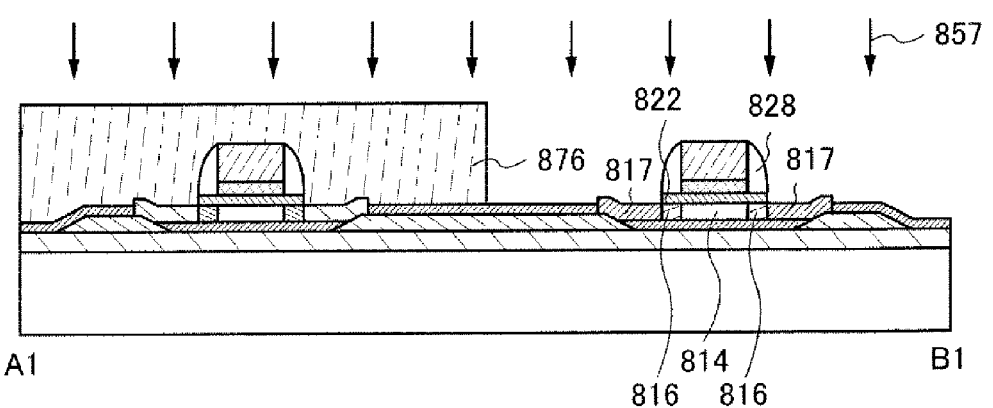

Next, a resist mask 876 is selectively formed so as to cover the semiconductor layer 805. An impurity element 857 which imparts one conductivity type is added to the semiconductor layer 813 at a fourth concentration with the resist mask 876, the conductive layers 824 and 826, and the sidewall insulating layers 828 which are in contact with the side surfaces of the conductive layers 824 and 826 as masks (FIG. 17D). In this embodiment mode, the impurity element 857 is added to the semiconductor layer 813 with the conductive layers 824 and 826 and the sidewall insulating layers 828 which are in contact with the side surfaces of the conductive layers 824 and 826 as a mask, so that a pair of high-concentration impurity regions 817 and the pair of low-concentration impurity regions 816 are formed in a self-aligned manner. The high-concentration impurity regions 817 serve as source and drain regions, and the low-concentration impurity regions 816 serve as LDD regions. As the impurity element 857, an impurity element which imparts the same conductivity type as the impurity element 853 added to the semiconductor layer 813 is added. In this embodiment mode, boron (B) is added. Further, as for the addition of the impurity element, the fourth concentration is higher than the second concentration. Therefore, the concentration of the impurity element in the high-concentration impurity regions 817 is higher than that of the low-concentration impurity regions 816.

Through the above, the high-concentration impurity regions 809 which serve as source and drain regions, the low-concentration impurity regions 808 which serve as LDD regions, and the channel formation region 806 are formed in the semiconductor layer 805, and the high-concentration impurity regions 817 which serve as source and drain regions, the low-concentration impurity regions 816 which serve as LDD regions, and the channel formation region 814 are formed in the semiconductor layer 813. In this embodiment mode, the channel formation region 806 can be formed in a self-aligned manner by using the stacked-layer structure of the conductive layers 823 and 825, and the channel formation region 814 can be formed in a self-aligned manner by using the stacked-layer structure of the conductive layers 824 and 826. Further, the low-concentration impurity regions 808 can be formed in a self-aligned manner by using the conductive layers 823 and 825 and the sidewall insulating layers 827 which are in contact with the side surfaces of the conductive layers 823 and 825, and the low-concentration impurity regions 816 can be formed in a self-aligned manner by using the conductive layers 824 and 826 and the sidewall insulating layers 828 which are in contact with the side surfaces of the conductive layers 824 and 826.

Figure 18A:
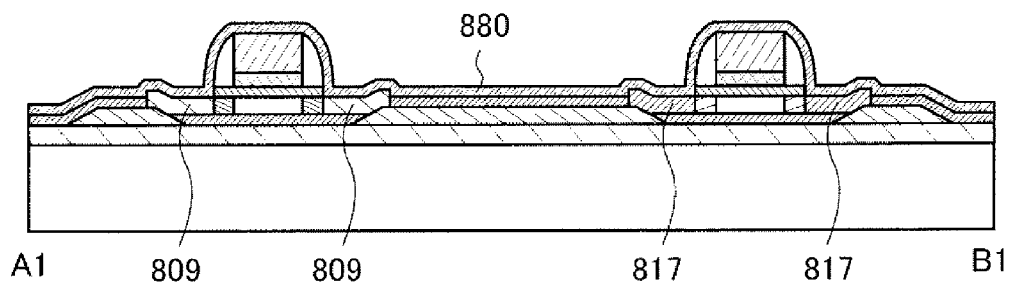
FIGS. 18S to 18C are views showing an example of a manufacturing method of a semiconductor device of the present invention.

Next, a metal layer 880 is formed over the exposed semiconductor layers 805 and 813 (FIG. 18A).

The metal layer 880 is formed at least over the exposed semiconductor layers 805 and 813. In this embodiment mode, the metal layer 880 is formed over the entire surface of the substrate. The metal layer 880 may be formed of a material which reacts with the semiconductor layer and becomes silicide. For example, the metal layer 880 may be formed by a sputtering method or the like using a metal element such as nickel, titanium, cobalt, or platinum, or an alloy material containing any of the metal elements. The thickness of the metal layer 880 may be selected as appropriate in accordance with the shape, thickness, and the like of a silicide region to be formed. If a natural oxide layer has been formed on the exposed semiconductor layer when the metal layer 880 is formed, the metal layer 880 is formed after the natural oxide layer is removed.

Figure 18B:
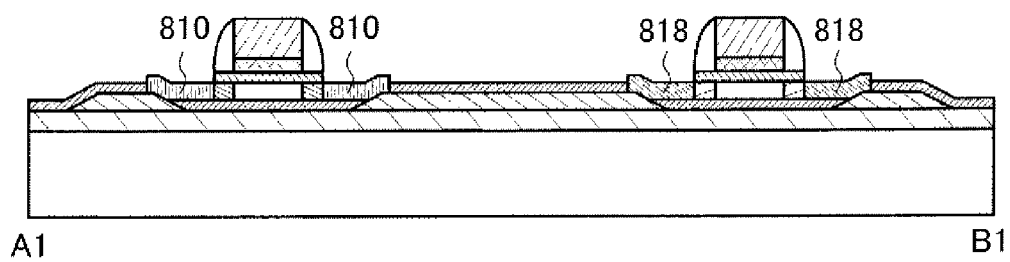

Next, by heat treatment, silicide is formed in parts of the semiconductor layers 805 and 813. In this embodiment mode, silicide is formed in the high-concentration impurity regions 809 formed in the semiconductor layer 805 entirely from the top surface to the bottom surface to form the high-concentration impurity regions 810. In addition, silicide is formed in the high-concentration impurity regions 817 formed in the semiconductor layer 813 entirely from the top surface to the bottom surface to form the high-concentration impurity regions 818 (FIG. 18B).

Silicide is formed when heat treatment is performed and reaction occurs in a region where the semiconductor layer 805 and the metal layer 880 are in contact with each other and a region where the semiconductor layer 813 and the metal layer 880 are in contact with each other. For example, when nickel is formed as the metal layer 880, nickel silicide is formed in the high-concentration impurity regions 810 and 818. Similarly, when titanium, cobalt, or platinum is formed as the metal layer 880, titanium silicide, cobalt silicide, or platinum silicide is formed in the high-concentration impurity regions 810 and 818. The heat treatment may be performed using RTA or an annealing furnace.

The thickness, shape, and the like of the silicide region can be selected by appropriately controlling the thickness of the metal layer 880, time for heat treatment, temperature of heat treatment, and the like. In this embodiment mode, although the example in which silicide is entirely formed in the high-concentration impurity regions 810 and 818 is described, it is possible that silicide is partially formed in the high-concentration impurity regions. In addition, silicide is not required to be formed in the high-concentration impurity regions. Further, the silicide region may extend to the regions overlapping with the sidewall insulating layers 827 and 828, but silicide is prevented from being formed in the channel formation regions.

After silicide is formed, the metal layer which has not reacted is removed by etching. For example, since the metal layer is formed over the entire surface of the substrate in this embodiment mode, the metal layer above the insulating layer 835, the sidewall insulating layers 827 and 828, and the conductive layers 825 and 826 is removed. Further, in the case where the metal layer which has not reacted also remains above the high-concentration impurity regions 810 and 818, the remaining metal layer is removed.

Figure 18C:
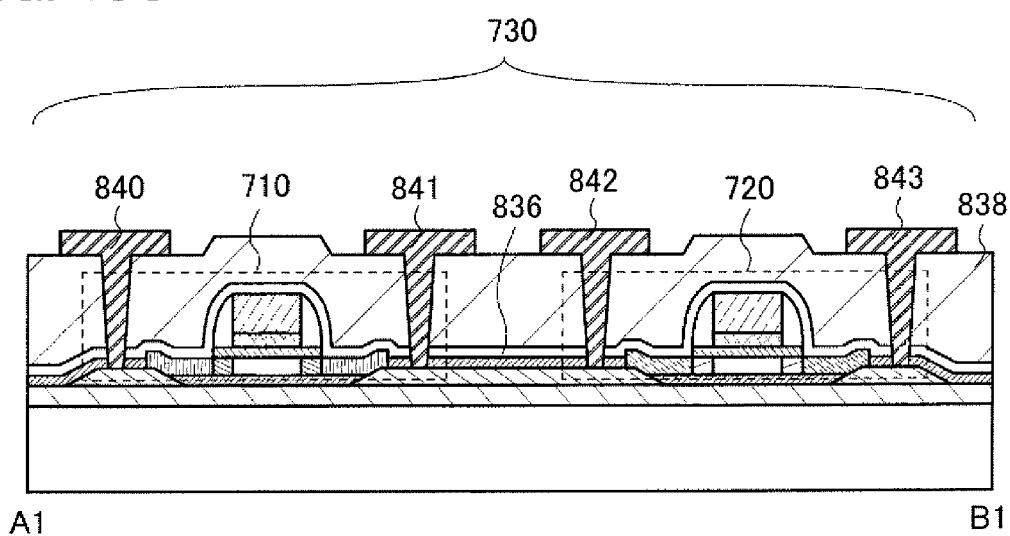

Next, the insulating layers 836 and 838 are formed so as to cover the insulating layers, conductive layers, and the like provided over the substrate 800. After the opening which reaches the conductive layer 852 is formed in the insulating layers 835, 836, and 838, the conductive layer 840 is formed in the opening. Similarly, after the openings which reach the conductive layers 854 and 856 are formed in the insulating layers 835, 836, and 838, the conductive layers 841, 842, and 843 are formed in the openings (FIG. 18C). The conductive layers 840, 841, 842, and 843 serve as source and drain electrodes.

Each of the insulating layers 836 and 838 is formed by a CVD method, a sputtering method, an ALD method, or a coating method, or by combination of insulating layers formed by these methods to have a single layer structure or a stacked-layer structure. For example, each of the insulating layers 836 and 838 is formed using an inorganic insulating material such as silicon oxide, silicon nitride, silicon oxynitride, or silicon nitride oxide; or an insulating material containing carbon such as DLC (diamond-like carbon) by a CVD method, a sputtering method, or an ALD method. Further, each of the insulating layers 836 and 838 can be formed using an organic insulating material such as epoxy, polyimide, polyamide, polyvinyl phenol, benzocyclobutene, or acrylic; or a siloxane material such as a siloxane resin by a coating method. Note that the siloxane material corresponds to a material having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Further, the insulating layers 836 and 838 may also be formed by forming an insulating layer by a CVD method, a sputtering method, or an ALD method and then performing high-density plasma treatment thereto in an oxygen atmosphere or a nitrogen atmosphere. Although the two-layer-stacked structure of the insulating layers 836 and 838 is formed over the conductive layers 825 and 826 and the like in this embodiment mode, either a single layer structure or a stacked-layer structure including three or more layers may be employed as well.

The conductive layers 840, 841, 842, and 843 can be formed by a CVD method or a sputtering method using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mg), neodymium (Nd), carbon (C), or silicon (Si), or an alloy material or a compound material containing any of the metal elements, to have a single layer structure or a stacked-layer structure. As examples of an alloy material containing aluminum, an alloy material containing aluminum as its main component and nickel, and an alloy material containing aluminum as its main component, nickel, and at least one of carbon and silicon can be given. The conductive layers 840, 841, 842, and 843 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that the barrier layer corresponds to a thin film formed of titanium, nitride of titanium, molybdenum, or nitride of molybdenum. Aluminum and aluminum silicon which have low resistance and are inexpensive are suitable for forming the conductive layers 840, 841, 842, and 843. Further, generation of a hillock of aluminum or aluminum silicon can be prevented when upper and lower barrier layers are provided, which is preferable.

Each of the openings formed in the insulating layers 835, 836, and 838 is formed so that at least part thereof overlaps with the conductive layer 852, 854, or 856. Further, the openings are formed so that the conductive layers 852, 854, and 856 are exposed at the bottom of the openings. At this time, the exposed conductive layers 852, 854, and 856 are partially etched in some cases, but the conductive layers 852, 854, and 856 are made to remain at least at the bottom of the openings.

The conductive layer 840 reaches the conductive layer 852 through the opening formed in the insulating layers 835, 836, and 838. The conductive layer 852 is in contact with the high-concentration impurity region 810. Therefore, the conductive layer 840 serving as a source or drain electrode and the high-concentration impurity region 810 serving as a source or drain region are electrically connected to each other with the conductive layer 852 serving as a connecting wiring interposed therebetween. Similarly, the conductive layer 841 reaches the conductive layer 854 through the opening formed in the insulating layers 835, 836, and 838. The conductive layer 854 is in contact with the high-concentration impurity region 810. Therefore, the conductive layer 841 serving as a source or drain electrode and the high-concentration impurity region 810 serving as a source or drain region are electrically connected to each other with the conductive layer 854 serving as a connecting wiring interposed therebetween.

The conductive layer 842 reaches the conductive layer 854 through the opening formed in the insulating layers 835, 836, and 838. The conductive layer 854 is also in contact with the high-concentration impurity region 818. Therefore, the conductive layer 842 serving as a source or drain electrode and the high-concentration impurity region 818 serving as a source or drain region are electrically connected to each other with the conductive layer 854 serving as a connecting wiring interposed therebetween. Similarly, the conductive layer 843 reaches the conductive layer 856 through the opening formed in the insulating layers 835, 836, and 838. The conductive layer 856 is in contact with the high-concentration impurity region 818. Therefore, the conductive layer 843 serving as a source or drain electrode and the high-concentration impurity region 818 serving as a source or drain region are electrically connected to each other with the conductive layer 856 serving as a connecting wiring interposed therebetween.

The conductive layers 840, 841, 842, and 843 are preferably in contact with the conductive layers 852, 854, and 856 serving as connecting wirings in regions which do not overlap with the semiconductor layers 805 and 813. With such a structure, the semiconductor layer can be prevented from being removed, and contact between the conductive layer and the semiconductor layer can be favorable. Accordingly, reliability of the semiconductor device completed can be improved.

It is also possible that the conductive layer 840, 841, 842, or 843 serving as a source or drain electrode is electrically connected to the semiconductor layers 805 or 813 through an opening formed in the insulating layers 836 and 838 in a region where the insulating layer 835 is not formed. In this case, also when the semiconductor layer has such a thickness that part thereof is removed by etching in forming the opening in the insulating layers 836 and 838, favorable contact can be obtained with the conductive layers 852, 854, and 856 serving as connecting wirings.

In addition, silicide is formed in the high-concentration impurity regions 810 and 818, and the conductive layers serving as connecting wirings are in contact with the high-concentration impurity regions 810 and 818 in which silicide is formed. Therefore, contact resistance between the conductive layers and the semiconductor layer can be reduced. As a result, deterioration of operating characteristics of the semiconductor device due to reduction in on current can be prevented.

As described above, a semiconductor device including the n-channel TFT 710 formed using the semiconductor layer 805 and the p-channel TFT 720 formed using the semiconductor layer 813 can be manufactured. In this embodiment mode, the high-concentration impurity region 810 formed in the semiconductor layer 805 and the high-concentration impurity region 818 formed in the semiconductor layer 813 are electrically connected to each other through the conductive layer 854 serving as a connecting wiring, so that the CMOS transistor 730 having the n-channel TFT and the p-channel TFT is formed. Note that the present invention is not limited thereto, and the high-concentration impurity regions 840 and 818 may be electrically connected to each other through the conductive layer serving as a source or drain electrode.

The CMOS transistor 760 can be manufactured similarly to the CMOS transistor 730. For example, the TFT 740 can be formed similarly to the TFT 710. The TFT 750 can be formed similarly to the TFT 720. Thus, the CMOS transistor 760 including the n-channel TFT 740 and the p-channel TFT 750 can be formed.

In the CMOS transistor 760 shown in this embodiment mode, the high-concentration impurity region 910 formed in the semiconductor layer 905 of the TFT 740 and the high-concentration impurity region 918 formed in the semiconductor layer 913 of the TFT 750 are electrically connected to each other through the conductive layer 844 serving as a source or drain electrode, so that the CMOS transistor 760 having the n-channel TFT and the p-channel TFT is formed.

In the semiconductor device including a plurality of CMOS transistors of this embodiment mode, in one CMOS transistor, TFTs having different conductivity types are electrically connected to each other through a conductive layer serving as a connecting wiring. In another CMOS transistor, TFTs having different conductivity types are electrically connected to each other through a conductive layer serving as a source or drain electrode. With such a structure, a multilayer wiring structure can be made, and thus much higher integration is possible.

In this embodiment mode, the insulating layer is provided between the conductive layer serving as a connecting wiring and the semiconductor layer, whereby the conductive layer serving as a connecting wiring and the semiconductor layer are insulated with the insulating layer except a region where the conductive layer serving as a connecting wiring and the semiconductor layer are in contact with each other. Therefore, it is also possible to provide the conductive layer serving as a connecting wiring so as to get across a region below the semiconductor layer. As a result, much higher integration can be achieved.

In addition, in this embodiment mode, the gate electrode formed of the stacked-layer structure of the conductive layers 823 and 825 branches to get across the semiconductor layer 805 included in the TFT 710 and the semiconductor layer 905 included in the TFT 740. The branched gate electrodes (the stacked-layer structure of the conductive layers 823 and 825) are united in a region which does not overlap with the semiconductor layers 805 and 905. In other words, two gate electrodes branched from the continuous gate electrode are formed so as to get across the semiconductor layers 805 and 905. Similarly, the gate electrode formed of the stacked-layer structure of the conductive layers 824 and 826 branches to get across the semiconductor layer 813 included in the TFT 720 and the semiconductor layer 913 included in the TFT 750.

The branched gate electrodes (the stacked-layer structure of the conductive layers 824 and 826) are united in a region which does not overlap with the semiconductor layers 813 and 913. In other words, two gate electrodes branched from the continuous gate electrode are formed so as to get across the semiconductor layers 813 and 913 (FIG. 14).

Although this embodiment mode shows an example in which the CMOS transistor including two thin film transistors with different conductivity types is manufactured, the present invention is not limited thereto. As an example of manufacturing two thin film transistors, instead of manufacturing two thin film transistors with different conductivity types, two thin film transistors with the same conductivity type may be manufactured. For example, two n-channel thin film transistors (nMOS transistors) or two p-channel thin film transistors (pMOS transistors) may be manufactured. An impurity element added to the semiconductor layer may be appropriately selected to form the nMOS transistor, the pMOS transistor, or the like. In addition, the thin film transistor included in the CMOS transistor according to the present invention is not limited to have the structure shown in this embodiment mode, and the thin film transistors shown in other embodiment modes can also be employed as appropriate.

In the semiconductor device to which the present invention is applied, electrical connection between the conductive layer and the semiconductor layer can be favorable, so that reliability of the semiconductor device can be improved. Therefore, since contact resistance between the conductive layer and the semiconductor layer can be reduced, it is possible to prevent signal delay and achieve low power consumption of the semiconductor device completed. As a result, a high performance semiconductor device can be achieved.

This embodiment mode can be combined with other embodiment modes in this specification as appropriate.

Embodiment Mode 5

The semiconductor device according to the present invention can be applied to an integrated circuit such as a CPU (central processing unit). In this embodiment mode, an example of a CPU to which the semiconductor device shown in the preceding embodiment modes is applied will be described below with reference to the drawings.

Figure 19:
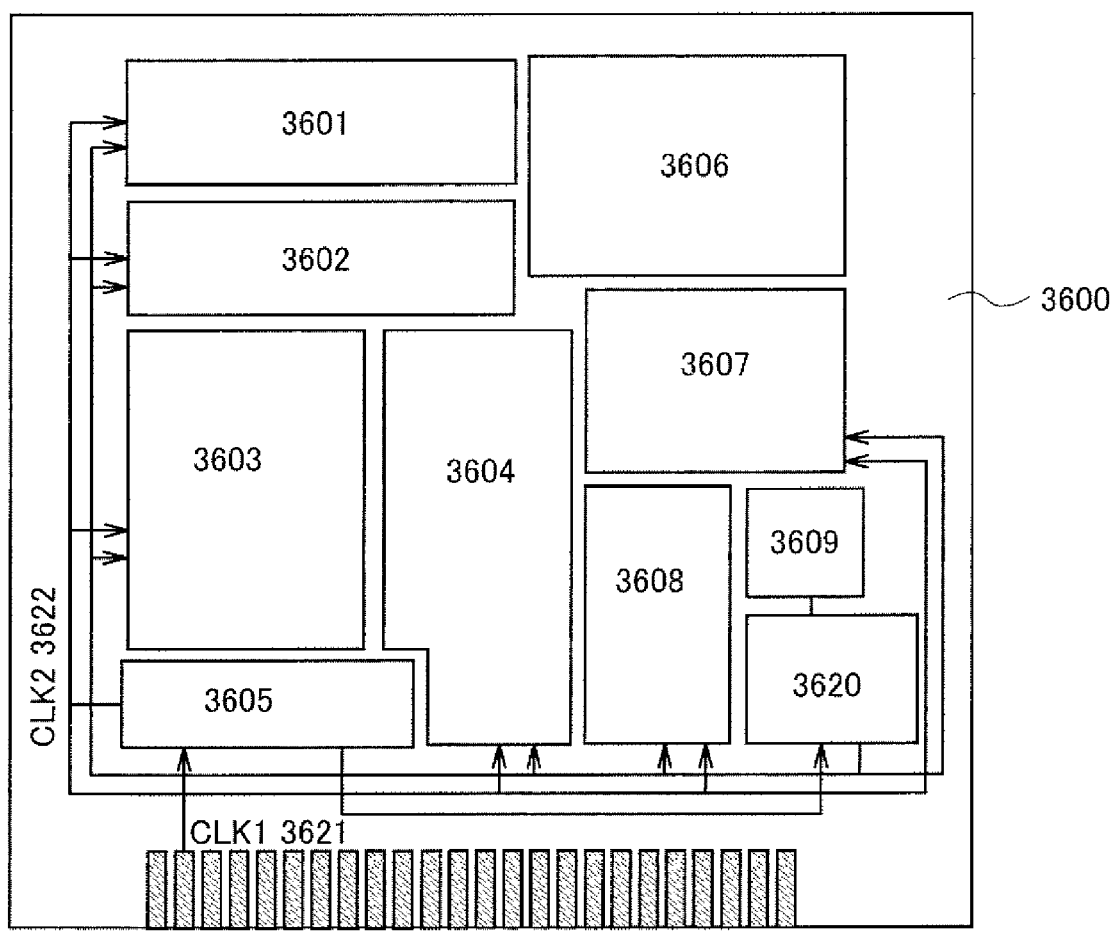
FIG. 19 is a block diagram showing an example of a semiconductor device of the present invention.

A CPU 3660 shown in FIG. 19 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, an erasable programmable ROM 3609, and a ROM interface (ROM I/F) 3620, over a substrate 3600. The ROM 3609 and the ROM interface 3620 may be provided over a different chip. Such various circuits included in the CPU 3660 can be formed by using the thin film transistor described in any of Embodiment Modes 1 to 4, or an nMOS transistor, a pMOS transistor, a CMOS transistor, or the like formed by combining the thin film transistors.

Note that the CPU 3660 shown in FIG. 19 is only an example whose structure is simplified, and an actual CPU has various structures depending on the uses. Therefore, the structure of the CPU to which the present invention is applied is not limited to that shown in FIG. 19.

An instruction input to the CPU 3660 through the bus interface 3608 is input to the instruction decoder 3603 and decoded therein, and then input to the ALU controller 3602, the interrupt controller 3604, the register controller 3607, and the timing controller 3605.

The ALU controller 3602, the interrupt controller 3604, the register controller 3607, and the timing controller 3605 perform various controls based on the decoded instruction. Specifically, the ALU controller 3602 generates a signal for controlling the drive of the ALU 3601. While the CPU 3660 is executing a program, the interrupt controller 3604 judges an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates a signal for controlling a timing of drive of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the internal clock signal CLK2 to the above various circuits.

Figure 20:
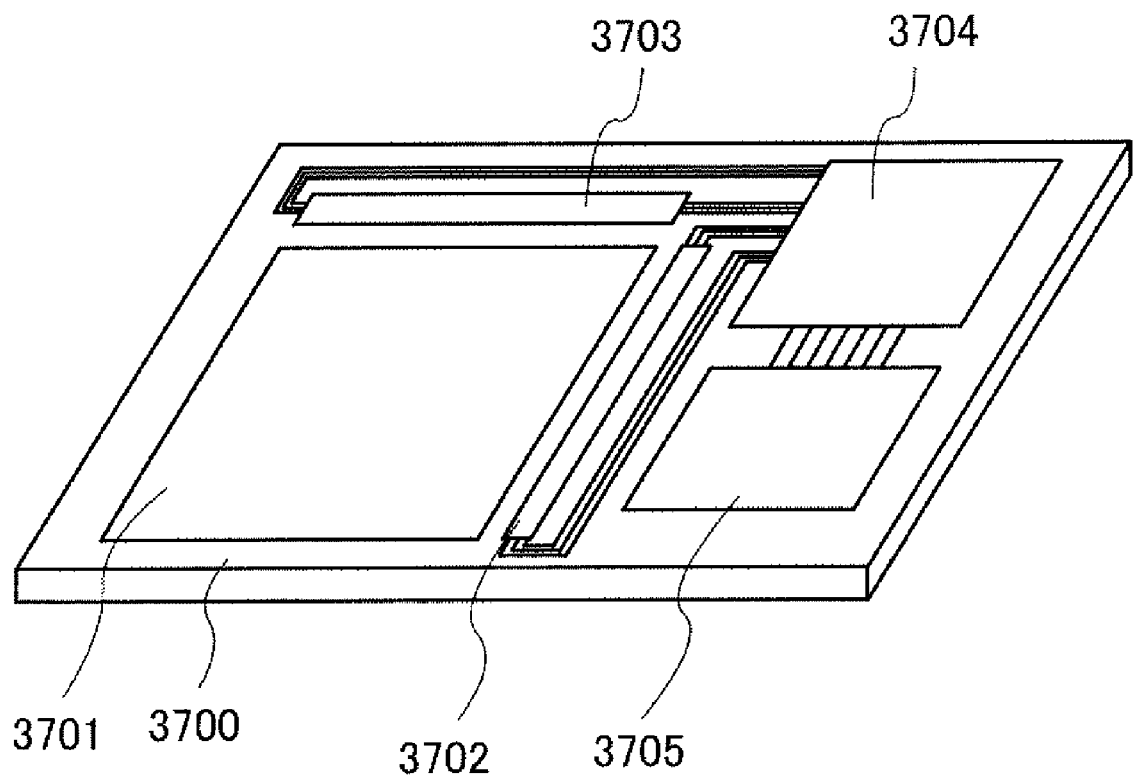
FIG. 20 is a perspective view showing an example of a semiconductor device of the present invention.

A display device in which a pixel portion, a CPU, and the other circuits are formed over the same substrate, a so-called system-on-panel is shown in FIG. 20. A pixel portion 3701, a scanning line driver circuit 3702 for selecting a pixel included in the pixel portion 3701, and a signal line driver circuit 3703 for supplying a video signal to each selected pixel are provided over a substrate 3700. A CPU 3704 and other circuits such as a control circuit 3705 are connected to wirings drawn from the scanning line driver circuit 3702 and the signal line driver circuit 3703. Note that the control circuit includes an interface. Further, a connection portion for connection to an FPC terminal is provided at the edge of the substrate to communicate with an external signal.

As the other circuits, in addition to the control circuit 3705, an image signal processing circuit, a power source circuit, a gray scale power source circuit, a video RAM, a memory (e.g., DRAM, SWAM, or PROM), and/or the like can be provided. Further, such a circuit may be formed using an IC chip and mounted on the substrate. Furthermore, the scanning line driver circuit 3702 and the signal line driver circuit 3703 are not necessarily formed over the same substrate as the pixel portion; for example, the scanning line driver circuit 3702 may be formed over the same substrate as the pixel portion and the signal line driver circuit 3703 may be formed using an IC chip and mounted on the substrate.

Note that although the example in which the semiconductor device according to the present invention is applied to a CPU is described in this embodiment mode, the present invention is not limited thereto. For example, the semiconductor device according to the present invention can be applied to a pixel portion, a driver circuit portion, or the like of a display device including an organic light-emitting element, an inorganic light-emitting element, a liquid crystal element, or the like. Furthermore, by applying the present invention, the following can also be manufactured; a camera such as a digital camera, an audio reproducing device such as a car audio system, a laptop computer a game machine, a portable information terminal (e.g., a cellular phone or a mobile game machine), an image reproducing device provided with a recording medium such as a home-use game machine, and the like.

In the semiconductor device to which the present invention is applied, electrical connection between the conductive layer and the semiconductor layer can be favorable, so that reliability of the semiconductor device can be improved.

Further, since contact resistance can be reduced when the transistor having a silicide region as shown in the preceding embodiment modes is used, it is possible to prevent signal delay of the semiconductor device. As a result, the circuit can be driven at high speed.

Embodiment Mode 6

In this embodiment mode, one example of a usage mode of the semiconductor device described in the preceding embodiment modes will be described. Specifically, an application example of a semiconductor device to/from which data can be input/output without contact will be described below with reference to the drawings. The semiconductor device to/from which data can be input/output without contact is also called an RFID tag, an ID tag, an IC tag, an IC chip, an RF tag, a wireless tag, an electronic tag, or a wireless chip depending on the usage mode.

One example of a top structure of a semiconductor device described in this embodiment mode is described with reference to FIG. 21A. A semiconductor device 2180 shown in FIG. 21A includes a thin film integrated circuit 2131 including a plurality of elements such as thin film transistors for forming a memory portion and a logic portion, and a conductive layer 2132 which serves as an antenna. The conductive layer 2132 which serves as an antenna is electrically connected to the thin film integrated circuit 2131. The thin film transistor according to the present invention described in any of Embodiment Modes 1 to 4 can be applied to the thin film integrated circuit 2131.

Figure 21A:
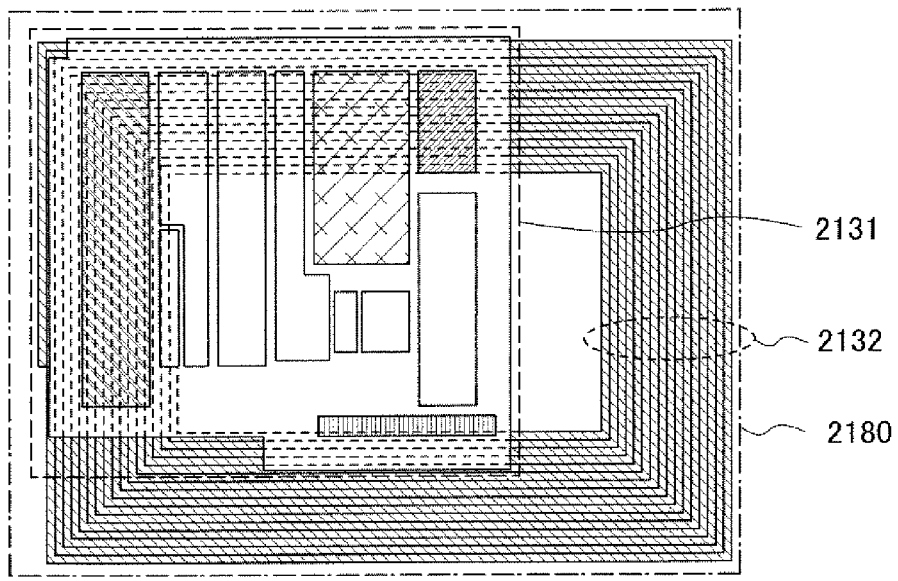
FIG. 21A is a top view and FIGS. 21B and 21C are cross-sectional views showing an example of a semiconductor device of the present invention.
Figure 21B:
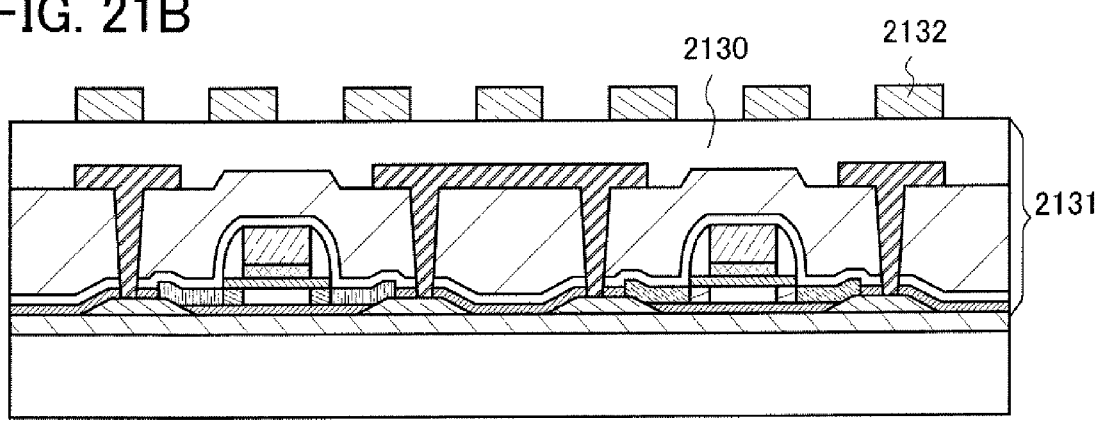
Figure 21C:
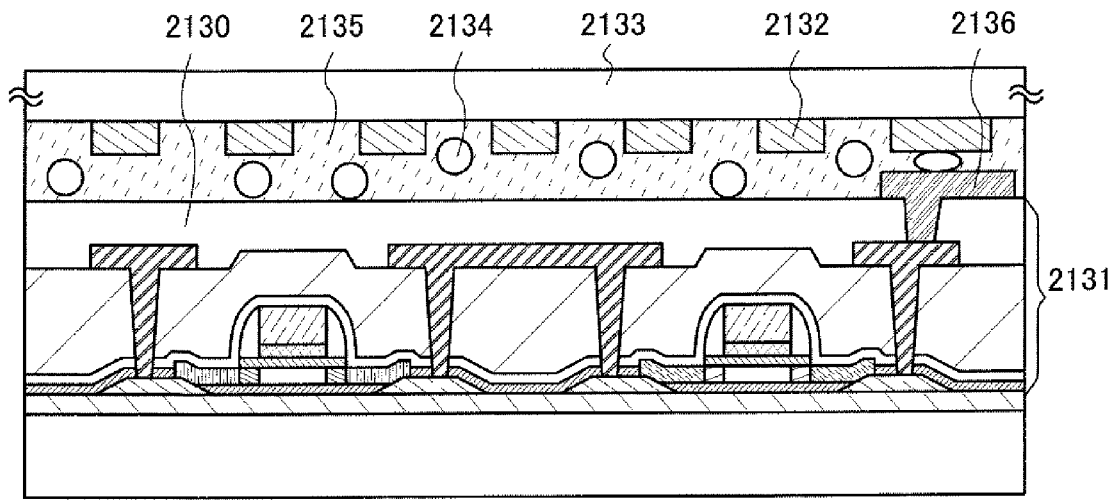

Schematic cross-sectional views of FIG. 21A are shown in FIGS. 21B and 21C. The conductive layer 2132 which serves as an antenna is provided above the elements for forming the memory portion and the logic portion; for example, the conductive layer 2432 which serves as an antenna can be provided above the thin film integrated circuit 2131 with the structure described in Embodiment Mode 4 with an insulating layer 2130 interposed therebetween (FIG. 21B). Alternatively, the conductive layer 2132 which serves as an antenna may be provided over a substrate 2133 and then the substrate 2133 and the thin film integrated circuit 2131 may be attached to each other so as to sandwich the conductive layer 2132 (FIG. 21C). The example in which a conductive layer 2136 provided over the insulating layer 2130 and the conductive layer 2132 which serves as an antenna are electrically connected to each other with conductive particles 2134 contained in an adhesive resin 2135 is shown in FIG. 21C.

Note that, although the example in which the conductive layer 2132 which serves as an antenna is provided in the shape of a coil and either an electromagnetic induction method or an electromagnetic coupling method is employed is described in this embodiment mode, the semiconductor device of the present invention is not limited thereto, and a microwave method may be employed as well. In the case of a microwave method, the shape of the conductive layer 2132 which serves as an antenna may be decided as appropriate depending on the wavelength of an electromagnetic wave.

Figure 22A:
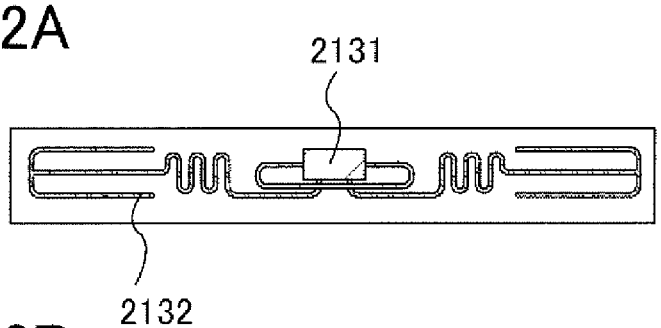
FIGS. 22A to 22D are explanatory views of an antenna which can be applied to a semiconductor device of the present invention.
Figure 22B:
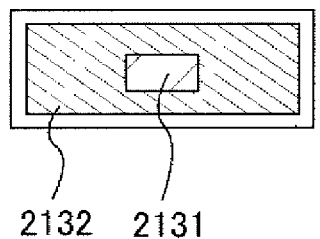
Figure 22C:
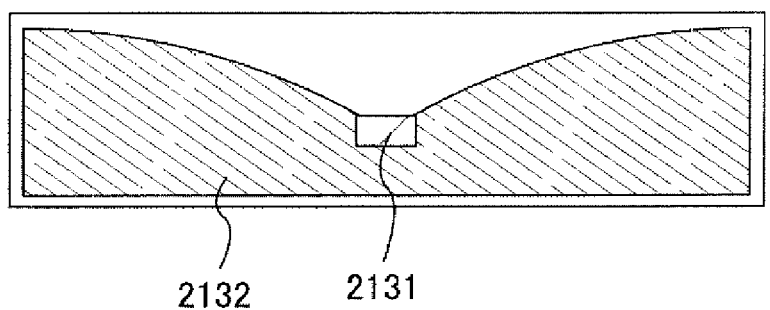
Figure 22D:
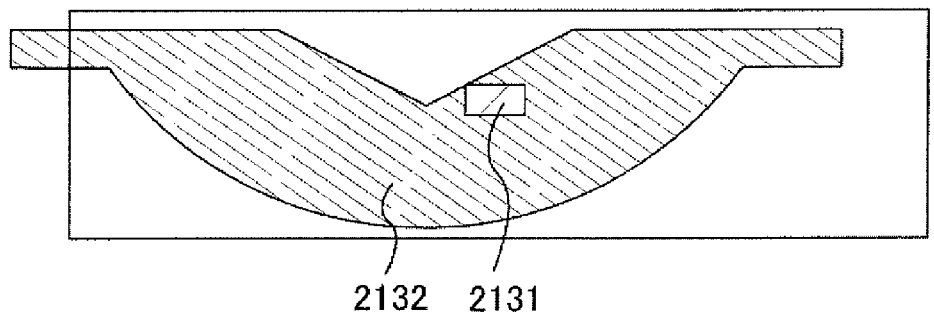

For example, when the microwave method (e.g., with an UHF band (in the range of 860 to 960 MHz), a frequency band of 2.45 GHz, or the like) is employed as the signal transmission method of the semiconductor device 2180, the shape such as the length of the conductive layer which serves as an antenna may be set as appropriate in consideration of the wavelength of an electromagnetic wave used in sending a signal. For example, the conductive layer which serves as an antenna can be formed into the shape of a line (e.g., a dipole antenna (FIG. 22A)), into the flat shape (e.g., a patch antenna (FIG. 22B)), into the shape of a ribbon (FIGS. 22C and 22D), or the like. Further, the shape of the conductive layer 2132 which serves as an antenna is not limited to a line, and the conductive layer in the shape of a curved line, in an S-shape, or in a shape combining them may be provided as well in consideration of the wavelength of the electromagnetic wave.

The conductive layer 2132 which serves as an antenna is formed of a conductive material by a CVD method, a sputtering method, a printing method such as a screen printing method or a gravure printing method, a droplet discharging method, a dispenser method, a plating method, or the like. As the conductive material, any of metal elements such as aluminum (Al), titanium (Ti), silver (Ag), copper (Cu), gold (Au), platinum (Pt), nickel (Ni), palladium (Pd), tantalum (Ta), molybdenum (Mo), and the like, or an alloy material or a compound material including any of the above metal elements as its main component is used, and the conductive layer 2132 employs a single layer structure or a stacked-layer structure.

For example, when the conductive layer 2132 which serves as an antenna is formed by a screen printing method, it can be provided by selectively printing a conductive paste in which conductive particles with a grain diameter of several nm to several tens of μm are dissolved or dispersed in an organic resin. As the conductive particle, at least one of metal particles such as silver (Ag), gold (Ag), copper (Cu), nickel (Ni), platinum (Pt), palladium (Pd), tantalum (Ta), molybdenum (Mo), titanium (Ti), and the like; fine particles of silver halide; or dispersive nanoparticles can be used. Further, as the organic resin included in the conductive paste, at least one of organic resins which function as a binder, a solvent, a dispersing agent, and a coating material of metal particles can be used. Typically, an organic resin such as an epoxy resin and a silicone resin can be given as an example. Further, in forming the conductive layer, it is preferable to bake the conductive paste after providing it. For example, in the case of using fine particles (e.g., with a grain diameter of 1 to 100 nm, inclusive) containing silver as its main component as a material of the conductive paste, the conductive layer can be formed by baking the conductive paste at temperatures in the range of 150 to 300° C. to harden it. Alternatively, fine particles containing solder or lead-free solder as its main component may be used. In this case, fine particles with a grain diameter of less than or equal to 20 μm are preferably used. Solder and lead-free solder have the advantage of low cost.

Next, an operation example of the semiconductor device according to this embodiment mode is described.

Figure 23A:
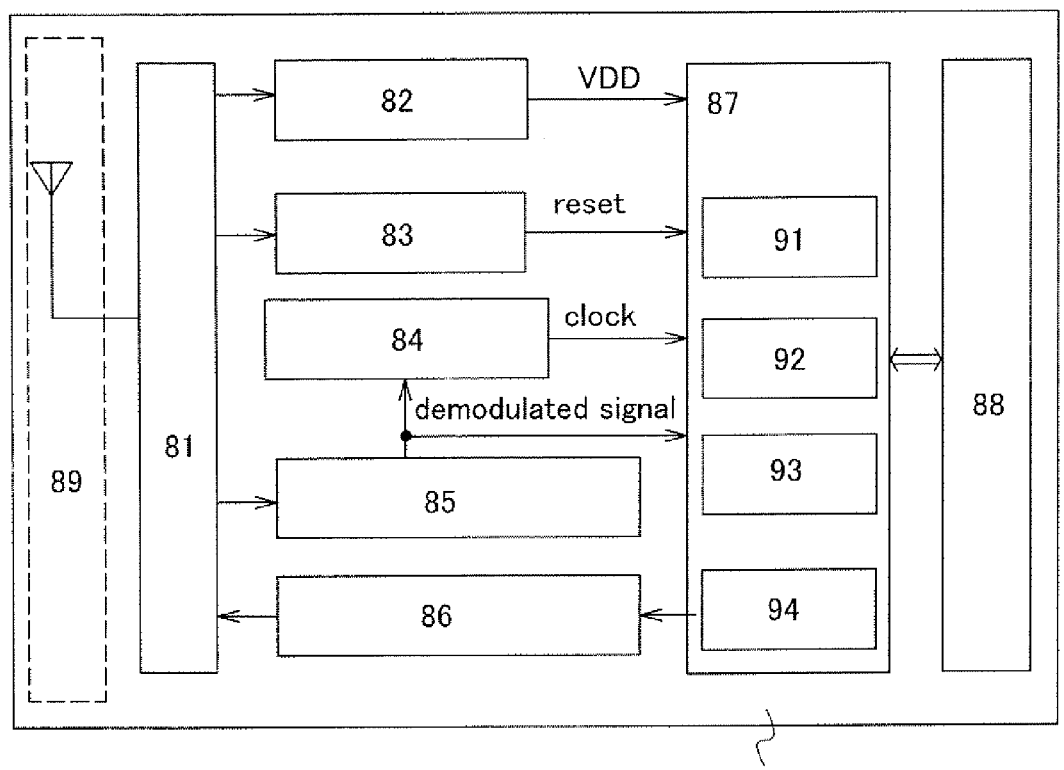
FIG. 23A is a block diagram showing an example and FIGS. 23B and 23C are views showing examples of a usage mode of a semiconductor device of the present invention.

The semiconductor device 2180 has a function of exchanging data without contact, and includes a high-frequency circuit 81, a power source circuit 82, a reset circuit 83, a clock generating circuit 84, a data demodulating circuit 85, a data modulating circuit 86, a controlling circuit 87 for controlling other circuits, a memory circuit 88, and an antenna 89 (FIG. 23A). The high-frequency circuit 81 receives a signal from the antenna 89 and then outputs a signal received from the data modulating circuit 86 through the antenna 89. The power source circuit 82 generates a power source potential from a received signal. The reset circuit 83 generates a reset signal. The clock generating circuit 84 generates various clock signals based on a received signal input from the antenna 89. The data demodulating circuit 85 demodulates a received signal and outputs it to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the controlling circuit 87. The code judging circuit 92 judges the content of the instruction by comparing each extracted code with a code corresponding to a reference. The CRC judging circuit 93 detects whether or not there is a transmission error or the like based on a judged code. In FIG. 23A, in addition to the controlling circuit 87, the high-frequency circuit 81 and the power source circuit 82 which are analog circuits are included.

Next, one example of an operation of the aforementioned semiconductor device is described. First, a wireless signal is received by the antenna 89 and then sent to the power source circuit 82 through the high-frequency circuit 81, so that a high power source potential (hereinafter referred to as VDD) is generated. VDD is supplied to each circuit in the semiconductor device 2180. A signal sent to the data demodulating circuit 85 through the high-frequency circuit 81 is demodulated (hereinafter this signal is called a demodulated signal). Moreover, signals passed through the reset circuit 83 and the clock generating circuit 84 through the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device stored in the memory circuit 88 is output. The output information of the semiconductor device is encoded through the output unit circuit 94. Further, the encoded information of the semiconductor device 2180 passes through the data modulating circuit 86 and then is sent by the antenna 89 as a wireless signal. Note that a low power source potential (hereinafter called VSS) is common in the plurality of circuits included in the semiconductor device 2180 and GND can be used as VSS.

In this manner, by sending a signal from a communication unit (e.g., a reader/writer or a unit having a function of a reader or a writer) to the semiconductor device 2180 and receiving a signal sent from the semiconductor device 2180 by the reader/writer, data of the semiconductor device can be read.

Further, in the semiconductor device 2180, a power source voltage may be supplied to each circuit by electromagnetic waves without providing a power source (a battery), or a power source (battery) may be provided so that a power source voltage is supplied to each circuit by both electromagnetic waves and the power source (battery).

Figure 23B:
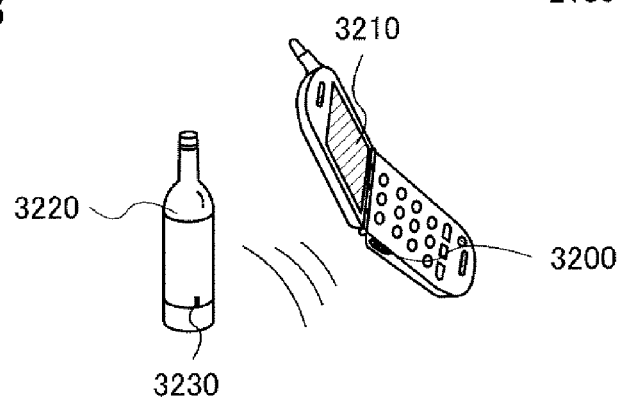
Figure 23C:
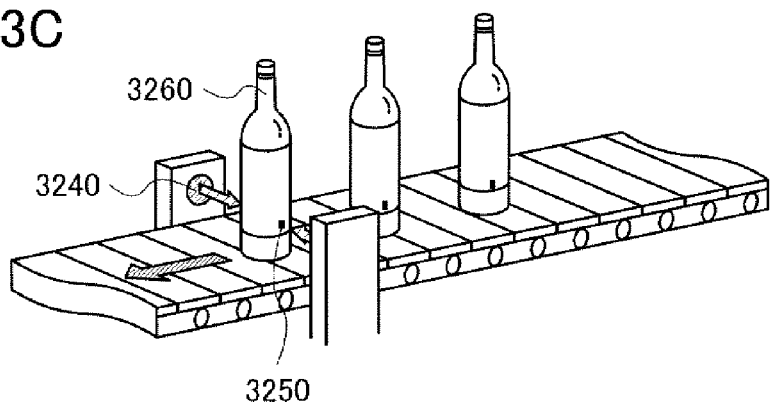

Next, one example of usage modes of the semiconductor device to/from which data can be input/output without contact is described. The side surface of a mobile terminal including a display portion 3210 is provided with a communication unit 3200, and the side surface of a product 3220 is provided with a semiconductor device 3230 (FIG. 23B). Note that the communication unit 3200 has a function of reading and transmitting a signal like a reader/writer, or has only a function of reading a signal or transmitting a signal. When the communication unit 3200 is held over the semiconductor device 3230 included in the product 3220, the display portion 3210 displays information on the product, such as a row material, a place of origin, an inspection result for each production step, a history of distribution process, description of the product, or the like. Further, while a product 3260 is transferred by a conveyer belt, the product 3260 can be inspected by using a reader/writer 3240 and a semiconductor device 3250 provided for the product 3260 (FIG. 23C). As the semiconductor devices 3230 and 3250, the aforementioned semiconductor device 2180 can be applied. In this manner, by using the semiconductor device according to the present invention in the system, information can be obtained easily and higher performance and a high added value are achieved. Further, since the semiconductor device according to the present invention has high reliability, a malfunction or the like of a semiconductor device provided for a product can be prevented.

Note that an applicable range of the semiconductor device according to the present invention is wide in addition to the above, and the semiconductor device can be applied to any product as long as it clarifies information of an object, such as the history thereof without contact and is useful for production, management, or the like. For example, the semiconductor device can be provided for bills, coins, securities, certificates, bearer bonds, packing containers, books, recording media, personal belongings, vehicles, food, clothing, health products, commodities, medicine, electronic devices, and the like. Examples of them are described with reference to FIGS. 11A to 11H.

Figure 11A:
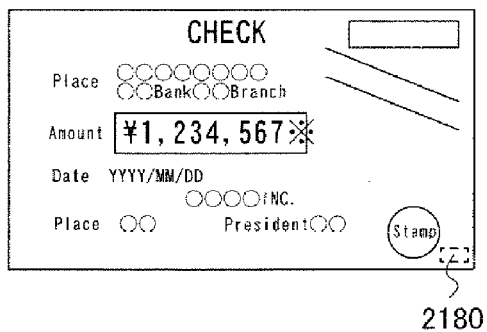
FIGS. 11A to 11H are views showing examples of a usage mode of a semiconductor device of the present invention.
Figure 11B:
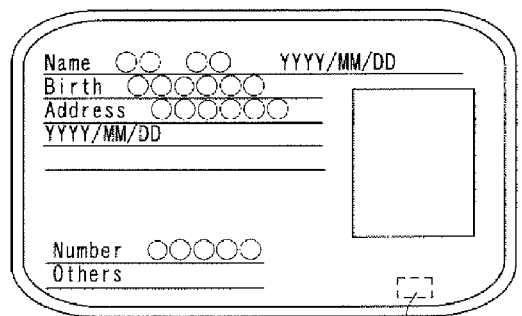
Figure 11C:
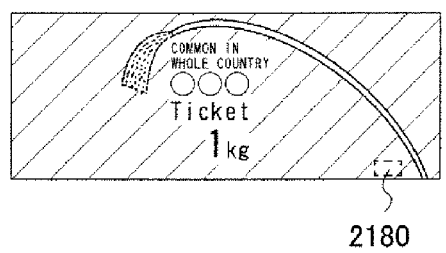
Figure 11D:
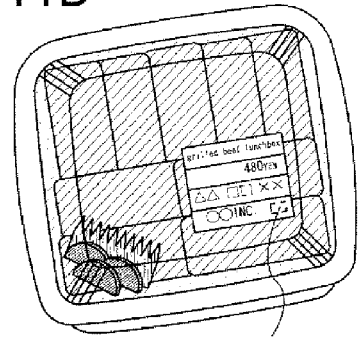
Figure 11E:
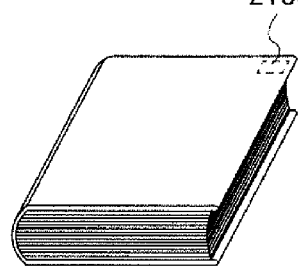
Figure 11F:
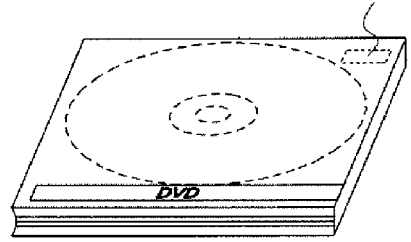
Figure 11G:
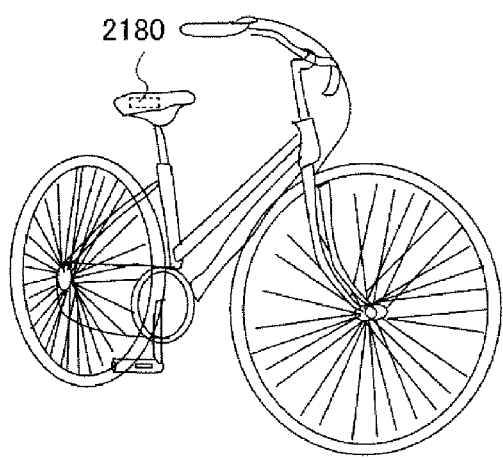
Figure 11H:
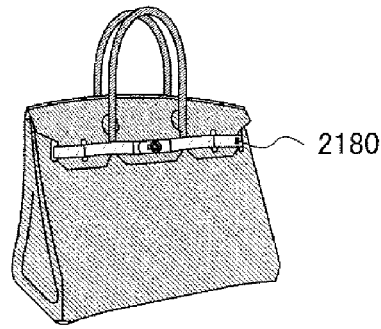

The bills and coins are money distributed to the market, and include one valid in a certain area (a cash voucher), memorial coins, and the like. The securities refer to checks, certificates, promissory notes, and the like (FIG. 11A). The certificates refer to driver's licenses, certificates of residence, and the like (FIG. 11B). The bearer bonds refer to stamps, rice coupons, various gift certificates, and the like (FIG. 11C). The packing containers refer to wrapping paper for food containers and the like, plastic bottles, and the like (FIG. 11D). The books refer to hardbacks, paperbacks, and the like (FIG. 11E). The recording media refer to DVD software, video tapes, and the like (FIG. 11F). The vehicles refer to wheeled vehicles such as bicycles, ships, and the like (FIG. 11G). The personal belongings refer to bags, glasses, and the like (FIG. 11H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-panel TV sets), cellular phones, and the like.

Forgery can be prevented by providing the semiconductor device 2180 for the bills, the coins, the securities, the certificates, the bearer bonds, or the like. Further, the efficiency of an inspection system, a system used in a rental shop, or the like can be improved by providing the semiconductor device 2180 for the packing containers, the books, the recording media, the personal belongings, the food, the commodities, the electronic devices, or the like. Forgery or theft can be prevented by providing the semiconductor device 2180 for the vehicles, the health products, the medicine, or the like; and in the case of the medicine, medicine can be prevented from being taken mistakenly. The semiconductor device 2180 can be provided by being attached to the surface or being embedded in the object. For example, in the case of a book, the semiconductor device 2180 may be embedded in the paper; and in the case of a package made of an organic resin, the semiconductor device 2180 may be embedded in the organic resin.

As described above, the efficiency of an inspection system, a system used in a rental shop, or the like can be improved by providing the semiconductor device 2180 for the packing containers, the recording media, the personal belonging, the food, the clothing, the commodities, the electronic devices, or the like. Further, by providing the semiconductor device 2180 for the vehicles or the like, forgery or theft thereof can be prevented. Further, by implanting the semiconductor device 2180 in a creature such as an animal, an individual creature can be easily identified. For example, by implanting/attaching the semiconductor device with a sensor into a creature such as livestock, its health condition such as a current body temperature as well as its birth year, sex, breed, or the like can be easily managed.

This embodiment mode can be freely combined with the preceding embodiment modes.

This application is based on Japanese Patent Application Serial No. 2007-041602 filed with Japan Patent Office on Feb. 22, 2007, the entire contents of which are hereby incorporated by reference.

What is claimed is:

1. A semiconductor device comprising:
a semiconductor layer provided over a first insulating layer, the semiconductor layer including an impurity region and overlapping with a gate electrode at least partly;
a first conductive layer provided on the first insulating layer and under the impurity region;
a second insulating layer provided over the gate electrode and the semiconductor layer, the second insulating layer including an opening; and
a second conductive layer at least formed in the opening of the second insulating layer and in contact with the first conductive layer,
wherein at least a part of the opening overlaps with the first conductive layer,
wherein the impurity region is provided outside a region which overlaps with the gate electrode, and
wherein the first conductive layer is in contact with the impurity region.

2. The semiconductor device according to claim 1, wherein a silicide region is formed in the impurity region, and wherein the silicide region and the first conductive layer are in contact with each other.

3. The semiconductor device according to claim 2, wherein the silicide region includes any one of nickel silicide, titanium silicide, cobalt silicide, and platinum silicide.

4. The semiconductor device according to claim 1, wherein the semiconductor layer has a thickness of 10 to 25 nm.

5. The semiconductor device according to claim 1, wherein the semiconductor layer includes a channel formation region formed in the region which overlaps with the gate electrode and a low-concentration impurity region doped with an impurity element having the same conductivity type as that of the impurity region at a lower concentration than that in the impurity region between the channel formation region and the impurity region.

6. The semiconductor device according to claim 1, wherein an end portion of the first conductive layer is tapered.

7. The semiconductor device according to claim 1 further comprising a third insulating layer provided on part of the first conductive layer and between the first insulating layer and the semiconductor layer.

8. The semiconductor device according to claim 1, further comprising a third conductive layer over the second conductive layer, the third conductive layer serving as an antenna.

9. The semiconductor device according to claim 1, wherein the semiconductor layer comprises a single crystalline semiconductor layer.

10. A semiconductor device comprising:
a semiconductor layer provided over a first insulating layer, the semiconductor layer including an impurity region and overlapping with a gate electrode at least partly;
a first conductive layer provided on the first insulating layer and under the impurity region;
a second insulating layer provided over the gate electrode and the semiconductor layer, the second insulating layer including an opening; and
a second conductive layer at least formed in the opening of the second insulating layer and in contact with the first conductive layer,
wherein at least a part of the opening overlaps with the first conductive layer,
wherein the impurity region is provided outside a region which overlaps with the gate electrode,
wherein the first conductive layer is in contact with the impurity region, and
wherein the gate electrode is formed of a stacked-layer structure comprising a lower conductive layer and an upper conductive layer.

11. The semiconductor device according to claim 10, wherein a silicide region is formed in the impurity region, and wherein the silicide region and the first conductive layer are in contact with each other.

12. The semiconductor device according to claim 11, wherein the silicide region includes any one of nickel silicide, titanium silicide, cobalt silicide, and platinum silicide.

13. The semiconductor device according to claim 10, wherein the semiconductor layer has a thickness of 10 to 25 nm.

14. The semiconductor device according to claim 10, wherein the semiconductor layer includes a channel formation region formed in the region which overlaps with the gate electrode and a low-concentration impurity region doped with an impurity element having the same conductivity type as that of the impurity region at a lower concentration than that in the impurity region between the channel formation region and the impurity region.

15. The semiconductor device according to claim 10, wherein an end portion of the first conductive layer is tapered.

16. The semiconductor device according to claim 10 further comprising a third insulating layer provided on part of the first conductive layer and between the first insulating layer and the semiconductor layer.

17. The semiconductor device according to claim 10, further comprising a third conductive layer over the second conductive layer, the third conductive layer serving as an antenna.

18. The semiconductor device according to claim 10, wherein the semiconductor layer comprises a single crystalline semiconductor layer.

19. A semiconductor device comprising:
a semiconductor layer provided over a first insulating layer, the semiconductor layer including an impurity region and overlapping with a gate electrode at least partly;
a first conductive layer provided on the first insulating layer and under the impurity region;
a second insulating layer provided over the gate electrode and the semiconductor layer, the second insulating layer including an opening; and
a second conductive layer at least formed in the opening of the second insulating layer and in contact with the first conductive layer,
wherein at least a part of the opening overlaps with the first conductive layer,
wherein the impurity region is provided outside a region which overlaps with the gate electrode,
wherein the first conductive layer is in contact with the impurity region,
wherein the gate electrode is formed of a stacked-layer structure comprising a lower conductive layer and an upper conductive layer, and
wherein a width of the lower conductive layer is larger than that of the upper conductive layer.

20. The semiconductor device according to claim 19, wherein a silicide region is formed in the impurity region, and wherein the silicide region and the first conductive layer are in contact with each other.

21. The semiconductor device according to claim 20, wherein the silicide region includes any one of nickel silicide, titanium silicide, cobalt silicide, and platinum silicide.

22. The semiconductor device according to claim 19, wherein the semiconductor layer has a thickness of 10 to 25 nm.

23. The semiconductor device according to claim 19, wherein the semiconductor layer includes a channel formation region formed in the region which overlaps with the gate electrode and a low-concentration impurity region doped with an impurity element having the same conductivity type as that of the impurity region at a lower concentration than that in the impurity region between the channel formation region and the impurity region.

24. The semiconductor device according to claim 19, wherein an end portion of the first conductive layer is tapered.

25. The semiconductor device according to claim 19 further comprising a third insulating layer provided on part of the first conductive layer and between the first insulating layer and the semiconductor layer.

26. The semiconductor device according to claim 19, further comprising a third conductive layer over the second conductive layer, the third conductive layer serving as an antenna.

27. The semiconductor device according to claim 19, wherein the semiconductor layer comprises a single crystalline semiconductor layer.

* * * * *

UNITED STATES PATENT AND TRADEMARK OFFICE
CERTIFICATE OF CORRECTION

| | | |
|---|---|---|
| PATENT NO. | : 7,948,040 B2 | Page 1 of 1 |
| APPLICATION NO. | : 12/031893 | |
| DATED | : May 24, 2011 | |
| INVENTOR(S) | : Shunpei Yamazaki et al. | |

It is certified that error appears in the above-identified patent and that said Letters Patent is hereby corrected as shown below:

column 2, line 35, "11" should read "10"

column 3, line 30, "18S" should read "18A"

column 12, lines 33-34, "fol-lows," should read "fol-lows:"

column 12, line 54, "used," should read "used."

column 13, line 48, "$cm^{-1}$" should read "$cm^{-3}$"

column 23, line 36, "M" should read "Nb"

column 34, line 38, "foxed" should read "formed"

column 40, line 20, "Layers" should read "layers"

column 46, line 16, "840" should be "810"

column 48, line 37, "SWAM" should read "SRAM"

column 48, line 57, "computer" should read "computer,"

column 49, line 33, "2432" should read "2132"

column 52, line 9, "thereof" should read "thereof,"

Signed and Sealed this
Second Day of August, 2011

David J. Kappos
*Director of the United States Patent and Trademark Office*